US009685484B1

(12) United States Patent
Rabkin et al.

(10) Patent No.: US 9,685,484 B1
(45) Date of Patent: Jun. 20, 2017

(54) REVERSIBLE RESISTIVITY MEMORY WITH CRYSTALLINE SILICON BIT LINE

(71) Applicant: SanDisk Technologies LLC, Plano, TX (US)

(72) Inventors: Peter Rabkin, Cupertino, CA (US); Perumal Ratnam, Fremont, CA (US); Masaaki Higashitani, Cupertino, CA (US); Chris Petti, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/215,263

(22) Filed: Jul. 20, 2016

(51) Int. Cl.
*H01L 27/24* (2006.01)
*H01L 45/00* (2006.01)

(52) U.S. Cl.
CPC ........ *H01L 27/2481* (2013.01); *H01L 45/122* (2013.01); *H01L 45/141* (2013.01); *H01L 45/16* (2013.01)

(58) Field of Classification Search
CPC ....... H01L 45/04; H01L 45/06; H01L 45/146; H01L 45/1223; H01L 27/2481
See application file for complete search history.

(56) References Cited

U.S. PATENT DOCUMENTS

| | | | |
|---|---|---|---|
| 6,727,517 B2 | 4/2004 | Chan et al. | |
| 8,236,673 B2 | 8/2012 | Son et al. | |
| 8,501,609 B2 | 8/2013 | Roizin et al. | |
| 8,610,193 B2 | 12/2013 | Ramaswamy | |
| 9,287,290 B1 | 3/2016 | Rabkin et al. | |
| 2009/0191680 A1 | 7/2009 | Walker | |
| 2010/0163820 A1* | 7/2010 | Son ..................... H01L 27/2409 257/2 |
| 2011/0237055 A1 | 9/2011 | Son et al. | |

OTHER PUBLICATIONS

Joshi, Amol Ramesh, "High Performace CMOS With Metal Induced Lateral Crystallization of Amorphous Silicon," Dissertation submitted to the Dept. of Elec. Enginerring, Stanford University, Mar. 2003, 116 pages.

(Continued)

*Primary Examiner* — Tucker J Wright
(74) *Attorney, Agent, or Firm* — Vierra Magen Marcus LLP

(57) ABSTRACT

Technology is described for reversible resistivity memory having a crystalline silicon bit line. In one aspect, a memory structure comprises a hollow pillar of crystalline silicon inside of reversible resistivity material. The crystalline silicon may serve as a bit line. The memory structure may further comprise conductive material that forms word lines coupled to the outer surface of the reversible resistivity material. A memory cell comprises a portion of the reversible resistivity material between the crystalline silicon and one of the word lines. In one aspect, the hollow pillar of crystalline silicon surrounds a gate oxide, which surrounds a conductive transistor gate. Thus, the hollow pillar of crystalline silicon may function as a channel of a transistor. In one aspect, the crystalline silicon has predominantly a (100) orientation with respect to an inner surface of the reversible resistivity material. In one aspect, the crystalline silicon is a single crystal.

23 Claims, 54 Drawing Sheets

(56) References Cited

OTHER PUBLICATIONS

Edrei, R., et al., "The effect of deposition process parameters and post-deposition treatments on the poly- and amorphous-silicon morphology," Applied Surface Science, Sep. 2001, 6 pages.
Park, H., et al., "Effect of High Pressure Deuterium Annealing on Performance and Reliability of MOSFETs with High-k Gate Dielectrics and Metal Gate," Powerpoint slides, Gwangju Institute of Science and Technology, Korea, Sep. 2005, 36 pages.
Csepregi, L., et al., "Substrate-orientation dependent of the epitaxial regrowth rate from Si-implanted amorphous Si," Journal of Applied Physics 49, Jul. 1978, 7 pages.
Bo, Xiang-Zheng, et al., "Large-grain polycrystalline silicon films with low intragranular defect density by low-temperature solid-phase crystallization without underlying oxide," American Institute of Physics, Jul. 2002, 6 pages.
Wei, Sung-Yen, et al., "Orientation Selected Epitaxy for Grain Enlargement of AIC Poly-Si Seed Layers," 35th IEEE Photovoltaic Specialists Conference (PVSC), Jun. 2010, 3 pages.
Yoon, Soo Young, et al., "Low temperature metal induced crystallization of amorphous silicon using a Ni solution," Journal of Applied Physics 82, Sep. 1997, 4 pages.
Yoon, Soo Young, et al., "Metal-induced crystallization of amorphous silicon," Thin Solid Films, Feb. 2001, 5 pages.
Stinzianni, Emilio, et al., "Relationship of Aluminum Grain Size to the Grain Size of Polycrystalline Silicon Produced by the Aluminum Induced Crystallization of Amorphous Silicon," 34th IEEEPhotovoltaic Specialists Conference (PVSC), Jun. 2009, 6 pages.
Bhat, Navakanta, et al., "Rapid Thermal Anneal of Gate Oxides for Low Thermal Budget TFT's," IEEE Transactions on Electron Devices, vol. 46, No. 1, Jan. 1999, 7 pages.
Civale, Yann, et al., "On the Mechanisms Governing Aluminum-Mediated Solid-Phase Epitaxy of Silicon," Journal of Electronic Materials, vol. 28, No. 10, Jun. 2009, 11 pages.

\* cited by examiner

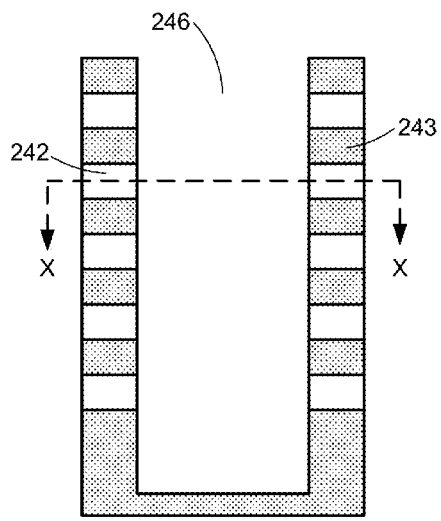
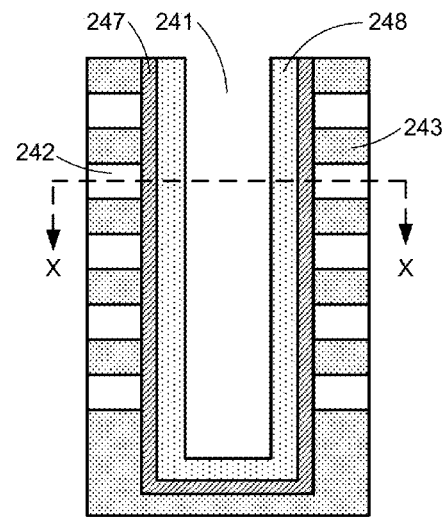
FIG. 9E    FIG. 9G
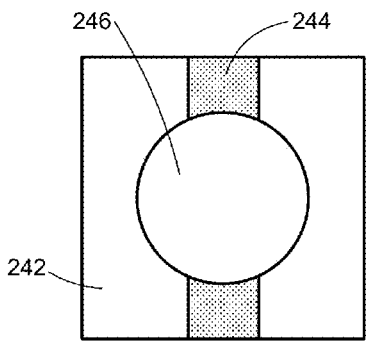
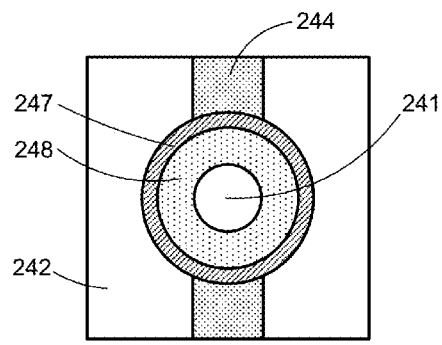
FIG. 9F    FIG. 9H

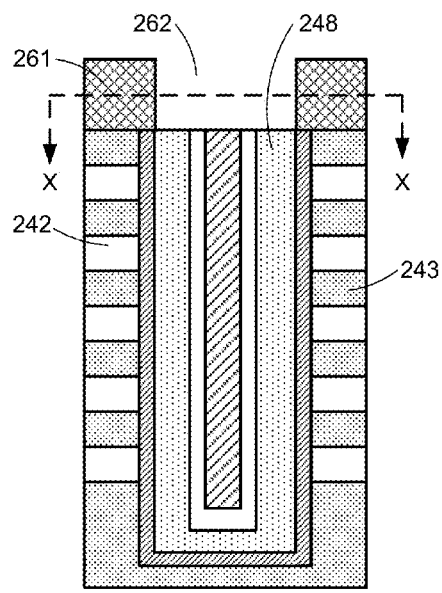
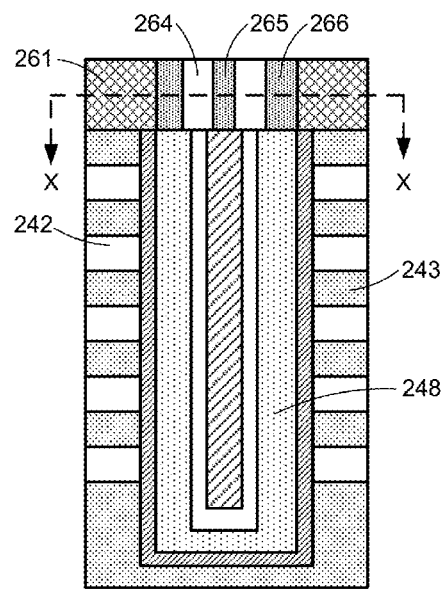
FIG. 9M FIG. 9O
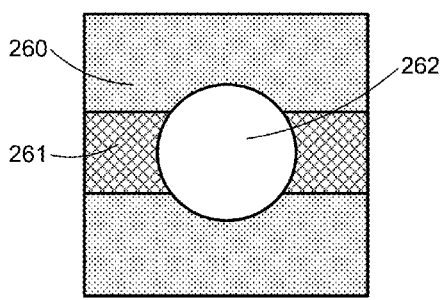
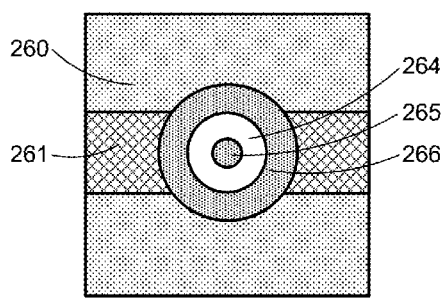
FIG. 9N FIG. 9P

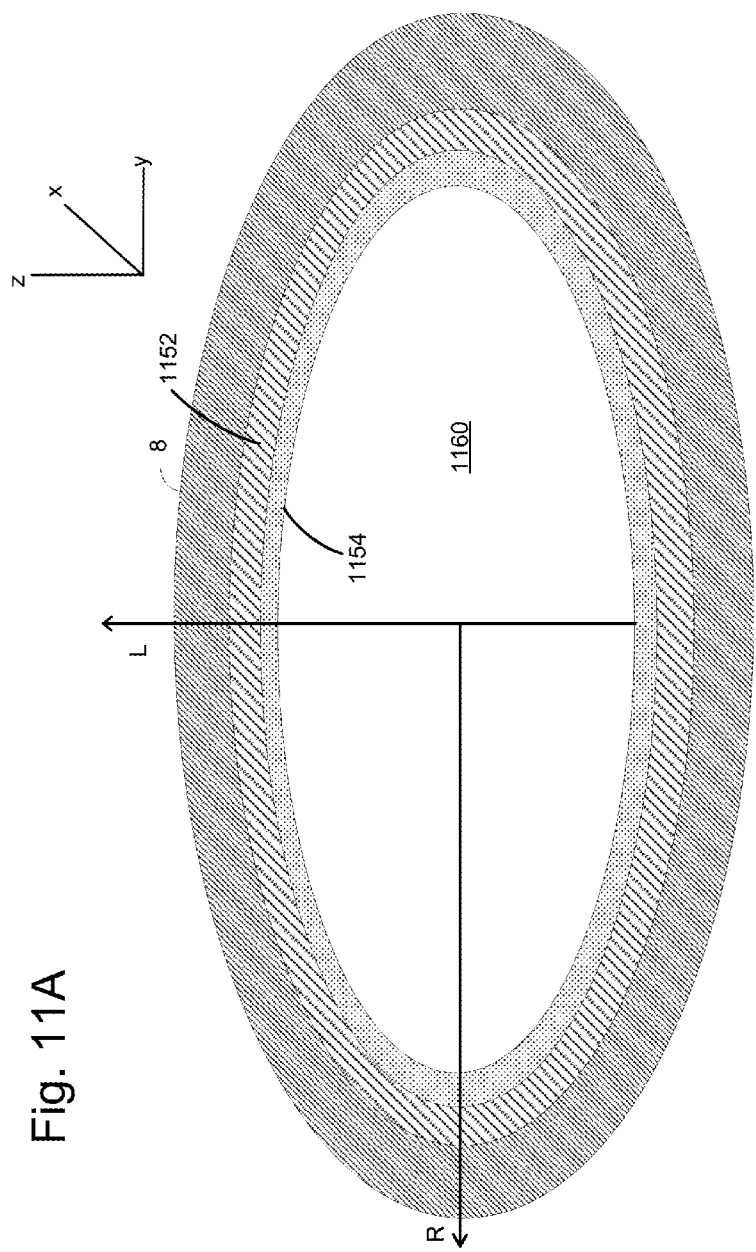

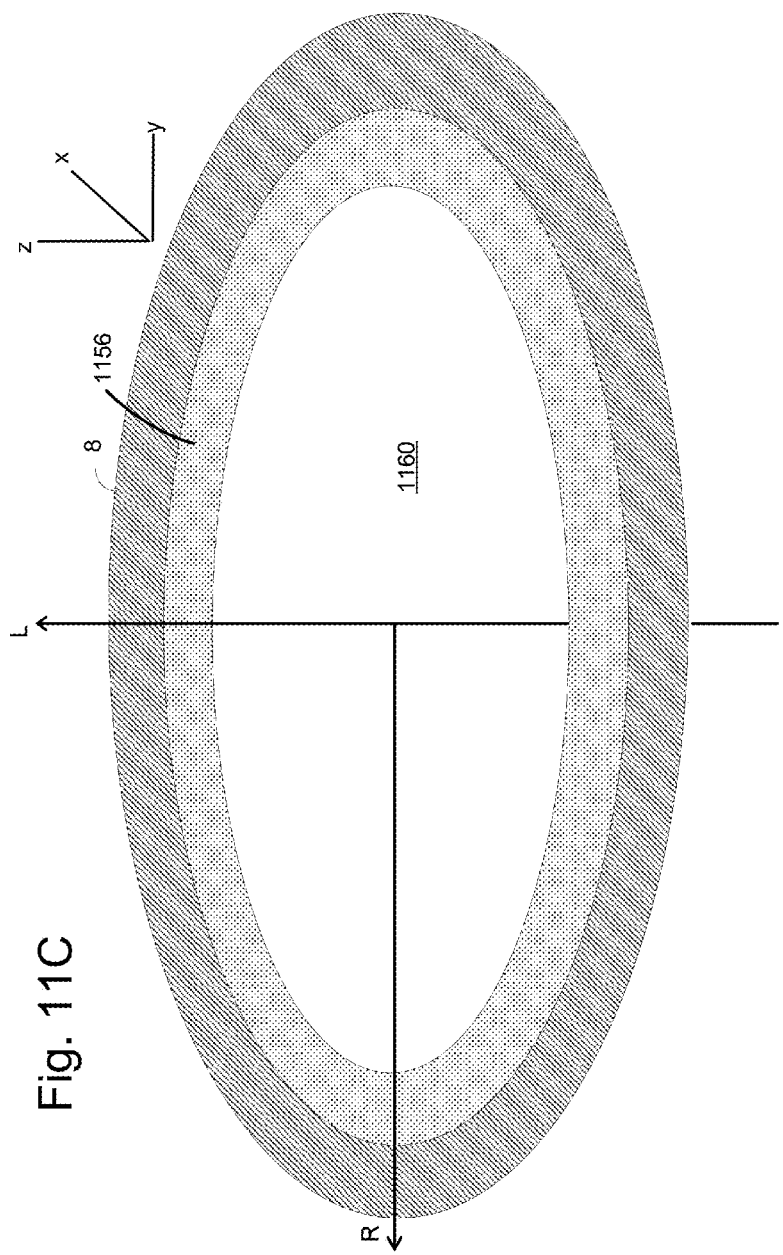

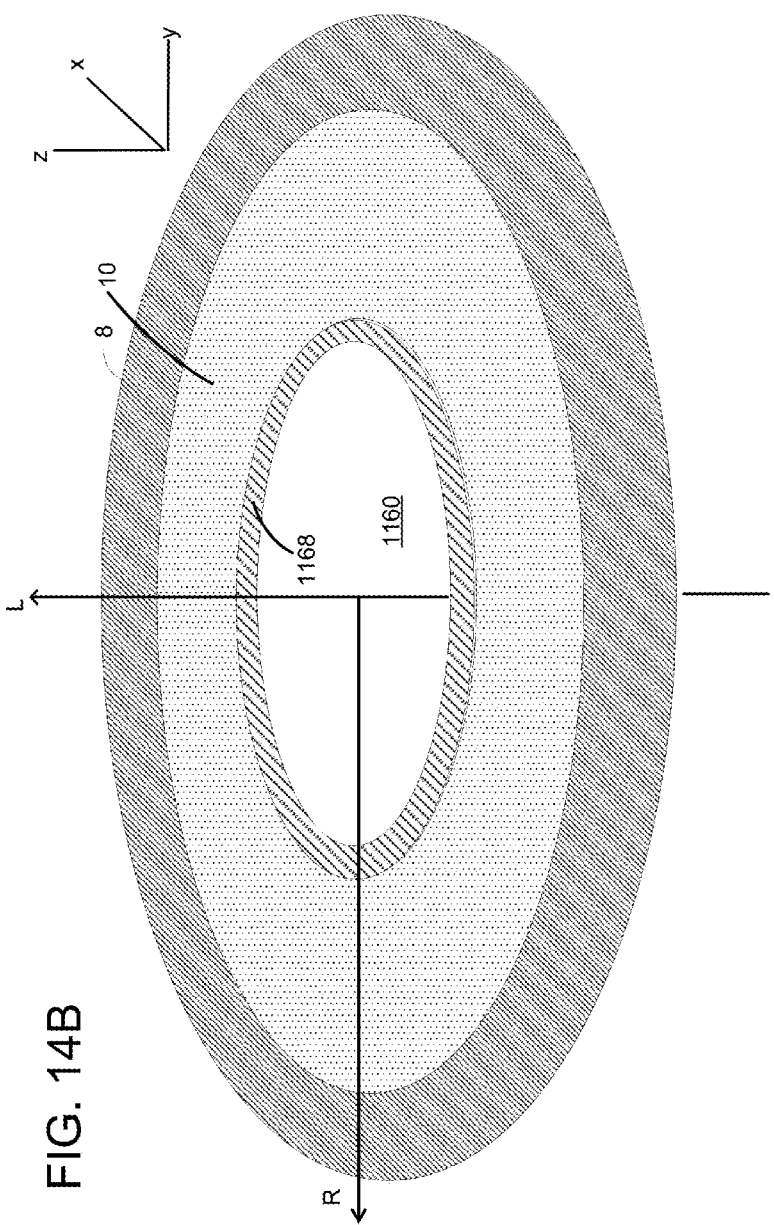

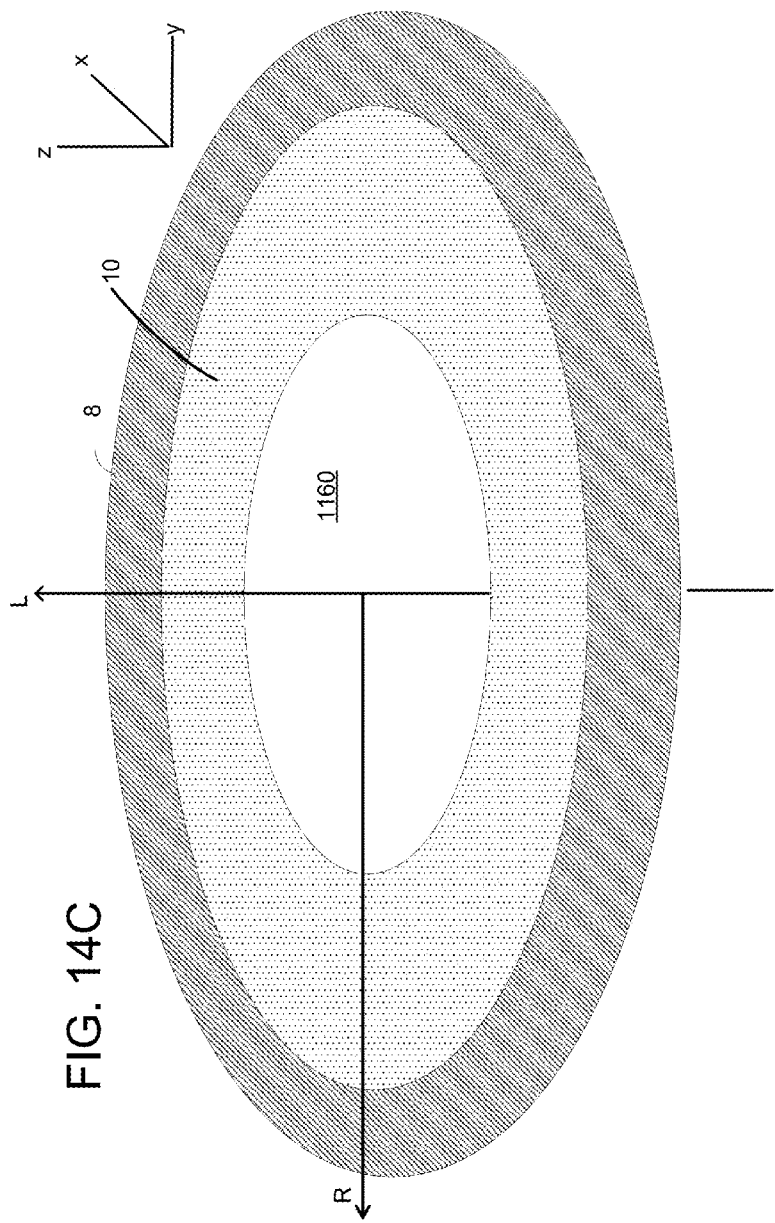

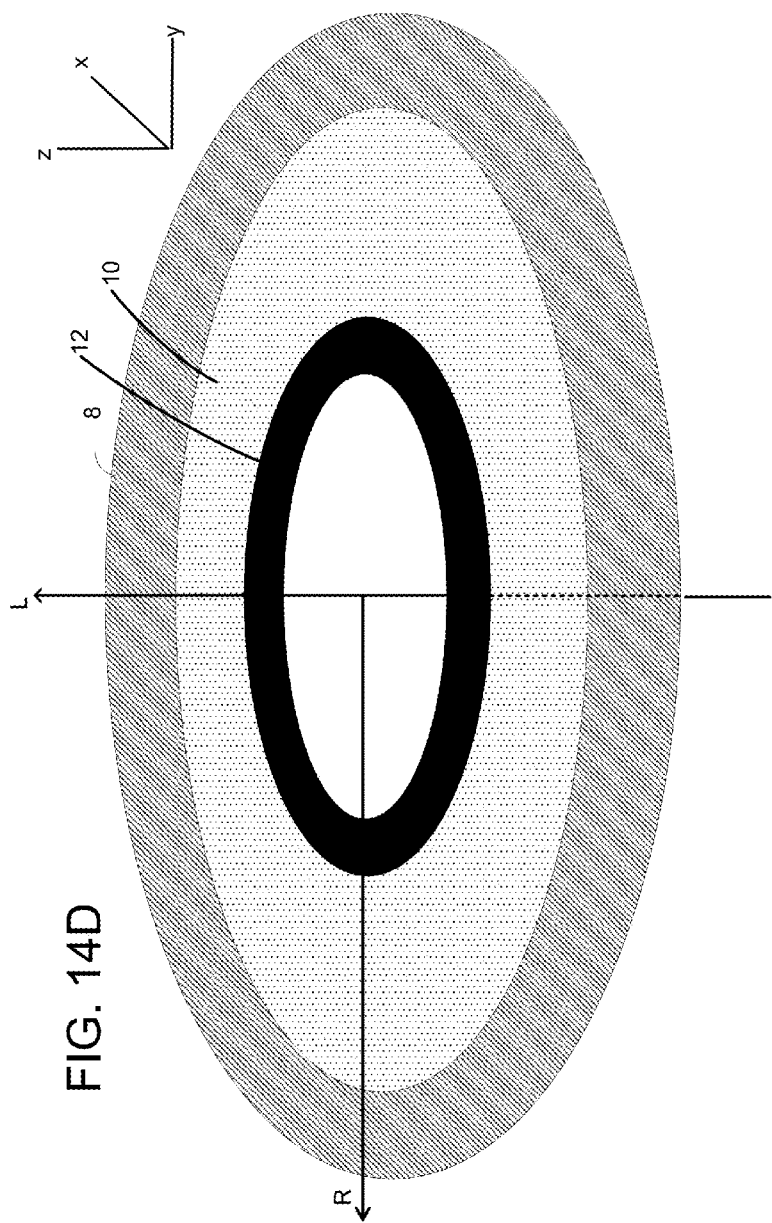

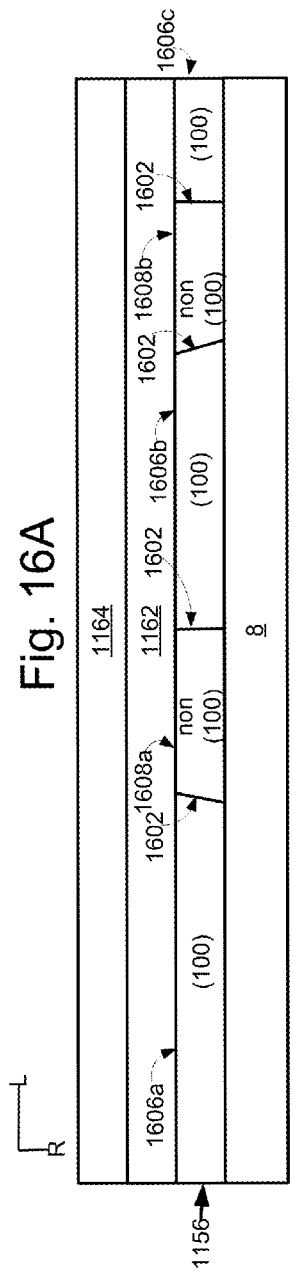
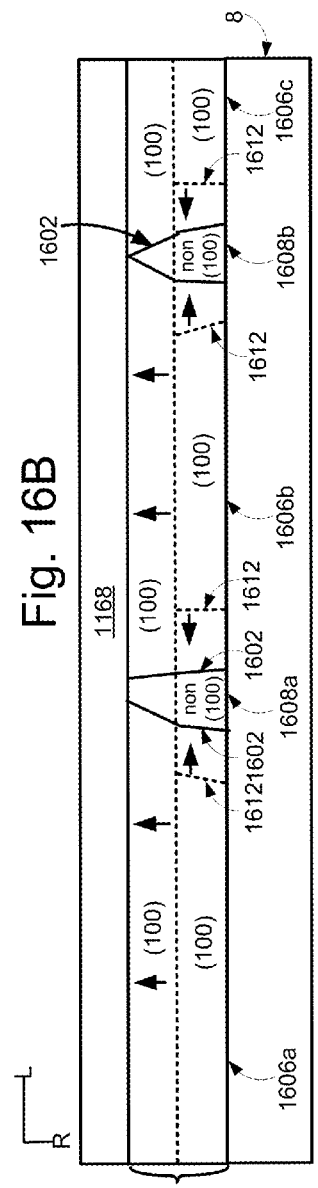

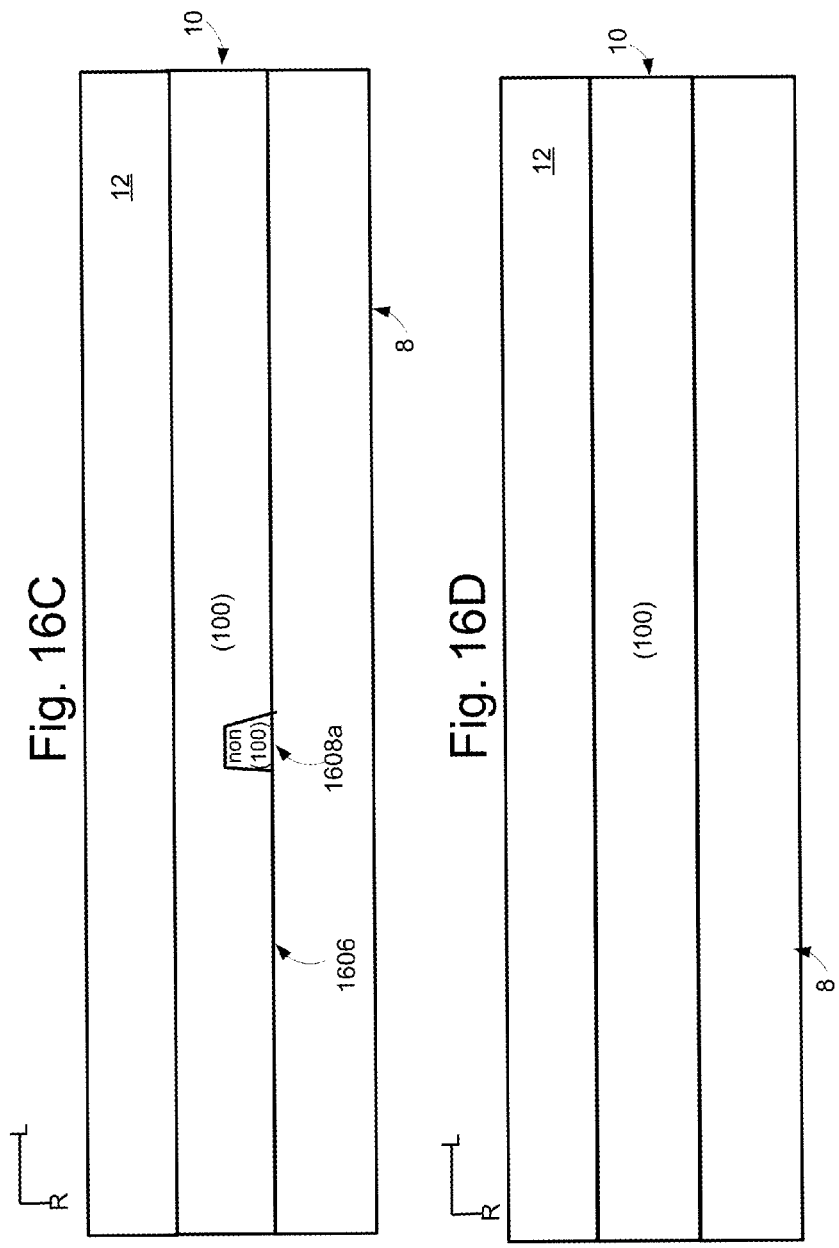

REVERSIBLE RESISTIVITY MEMORY WITH CRYSTALLINE SILICON BIT LINE

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations and increased leakage currents through unselected memory cells.

BRIEF DESCRIPTION OF THE DRAWINGS

FIGS. 11A-11C depict results after various steps of one embodiment of the process of FIG. 10.

FIGS. 14A-14E show results after embodiments of steps of the process of FIG. 13.

FIGS. 16A-16D show additional details of crystal orientation during of one embodiment of forming the crystalline silicon.

DETAILED DESCRIPTION

Technology is described for reversible resistivity memory having a crystalline silicon channel or bit line. One embodiment of a non-volatile storage device comprises a hollow pillar of reversible resistivity material, with a hollow pillar of crystalline silicon inside of the hollow pillar of reversible resistivity material. The hollow pillar of crystalline silicon may serve as a bit line. The non-volatile storage device may further comprise conductive material that forms word lines coupled to the outer surface of the hollow pillar of reversible resistivity material. A memory cell comprises a portion of the reversible resistivity material between the crystalline silicon and one of the word lines. In one embodiment, the hollow pillar of crystalline silicon surrounds a dielectric, which surrounds a conductive transistor gate. Thus, the hollow pillar of crystalline silicon may function as a channel of a transistor. The dielectric may function as a gate dielectric of the transistor.

Figure 1A:
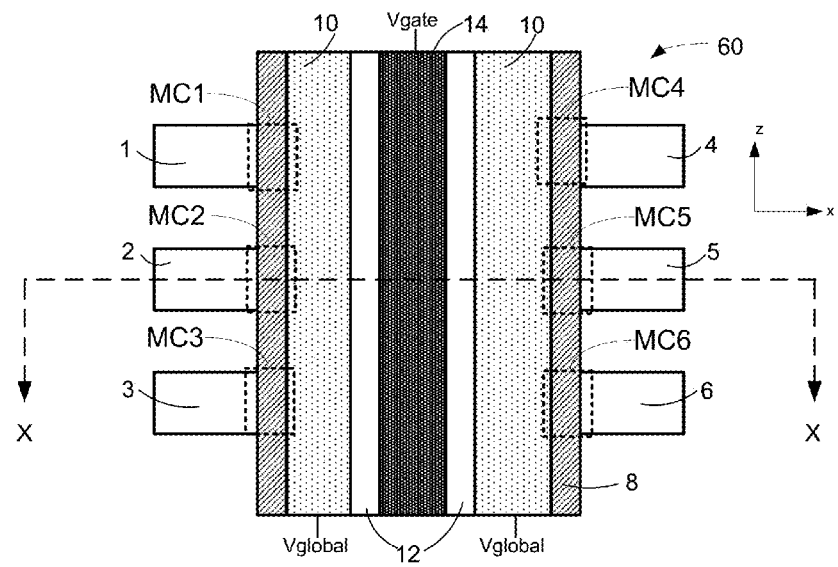
FIGS. 1A and 1B are diagrams of one embodiment of reversible resistivity memory having a crystalline silicon bit line.
Figure 1B:
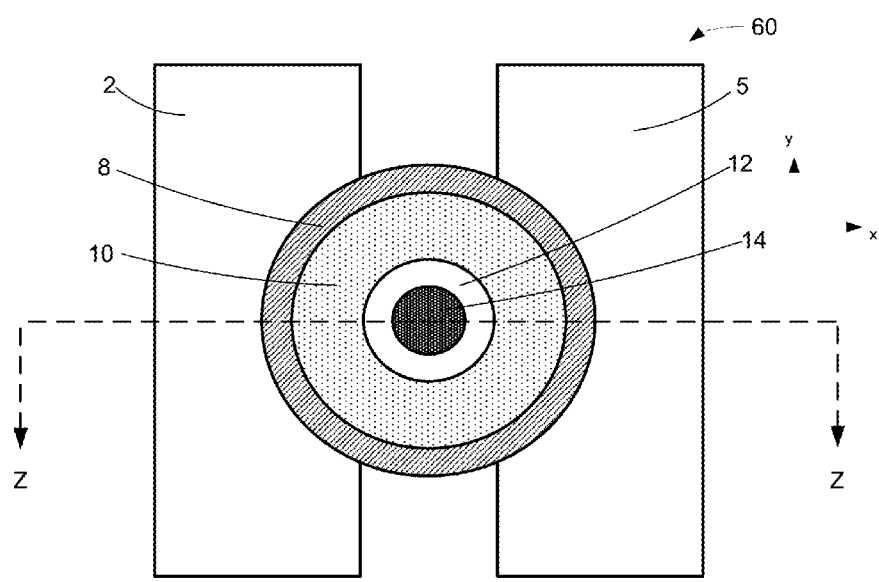

FIGS. 1A and 1B are diagrams of one embodiment of a reversible resistivity memory structure 60 having a crystalline silicon bit line 10. The crystalline silicon bit line 10 may also serve as a channel of a transistor. FIG. 1A shows x/z axes. FIG. 1B shows x/y axes. FIG. 1A depicts one embodiment of a cross-sectional view taken along line Z-Z of FIG. 1B. FIG. 1B depicts one embodiment of a cross-sectional view taken along line X-X of FIG. 1A.

The reversible resistivity memory structure 60 includes reversible resistivity material 8, which may have a hollow pillar shape. The reversible resistivity material 8 may comprise a phase change material, a ferroelectric material, a metal oxide such as nickel oxide or hafnium oxide, but is not limited thereto. Inside of the reversible resistivity material 8 is a hollow pillar of crystalline silicon 10. The crystalline silicon 10 serves as a bit line, in one embodiment. Inside of the crystalline silicon 10 is a dielectric layer 12. The dielectric layer 12 may also be a hollow pillar. The dielectric layer 12 may also be referred to as a gate dielectric layer. The dielectric layer 12 may comprise an oxide layer. Inside of the dielectric layer 12 is a select gate 14. The select gate 14 may comprise TiN, polysilicon, or some other conductive material. Word lines 1-3 are arranged on a first side of the structure 60. Word lines 4-6 are arranged on a second side of the structure 60. A memory cell (MC1-MC6) comprises a portion of the reversible resistivity material 8 between the crystalline silicon bit line 10 and one of the word lines.

In some embodiments, the crystalline silicon 10 may be put into a conductive state by applying operational voltages to the memory structure 60. FIG. 1A shows example operational voltages applied to the memory structure 60. A voltage Vgate may be applied to the select gate 14. A voltage Vglobal may be applied to the crystalline silicon 10. Note that in one embodiment, the crystalline silicon 10 is electrically connected to a global bit line (not depicted in FIG. 1A). Thus, in one embodiment, Vglobal is applied to a global bit line, which may be in electrical contact with the crystalline silicon 10. As a result of the example operational voltages, the crystalline silicon 10 may be put into a conductive state. In effect, the crystalline silicon 10 may operate as a channel of a transistor, whose control gate is the select gate 14. In one embodiment, the transistor is a distributed NMOS FET structure. In some cases, a transistor (e.g., an NMOS device, a PMOS device, or a JFET device) may be used to selectively connect the select gate 14 to a select gate line (not depicted in FIG. 1A). The various memory cells (MC1-MC6) may be read, programmed, erased, etc. by causing a suitable voltage in the crystalline silicon 10 while applying a voltage to a selected word line.

Figure 1D:
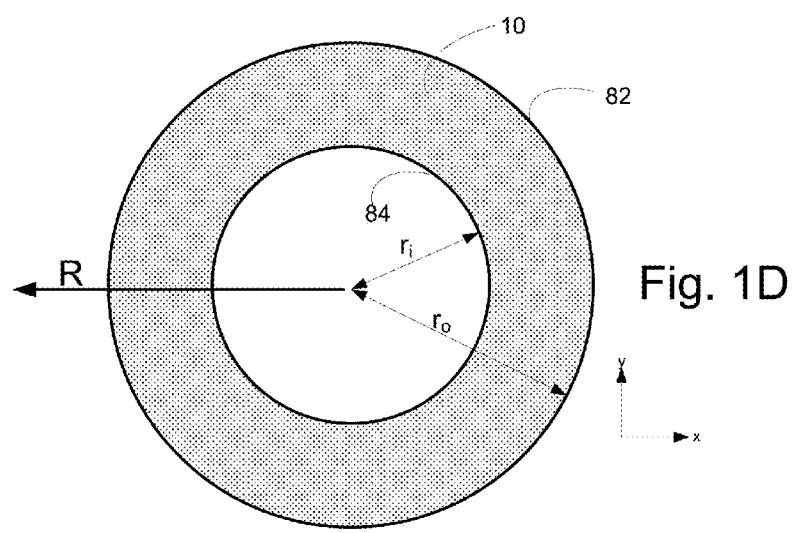
FIG. 1D is a cross sectional view of a hollow pillar of crystalline silicon, consistent with the diagram of FIG. 1C.
Figure 1C:
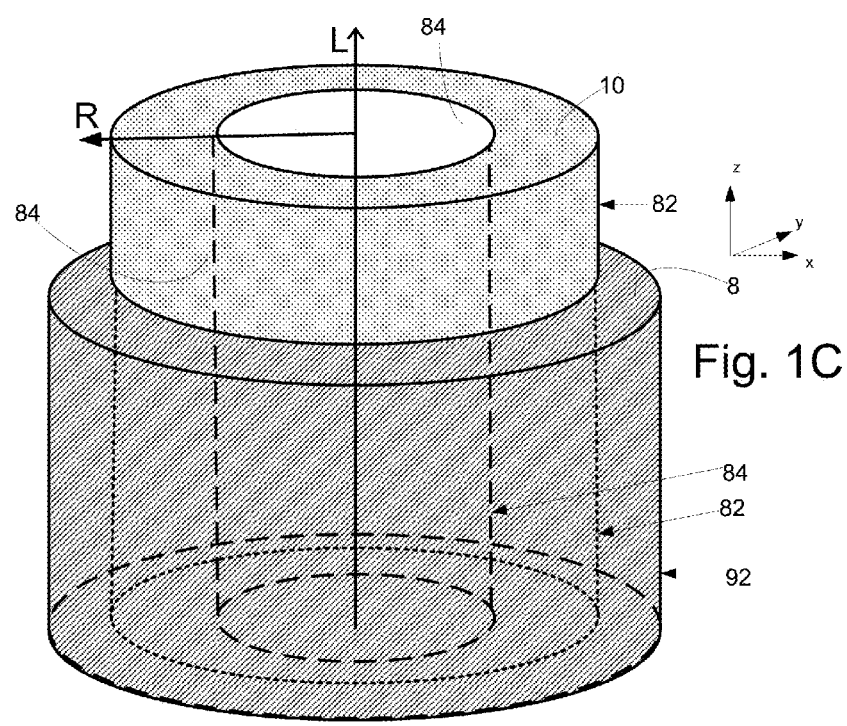
FIG. 1C is a perspective view of portions of one embodiment of a hollow pillar of crystalline silicon inside of a hollow pillar of reversible resistivity material.

FIG. 1C is a perspective view of portions of one embodiment of a hollow pillar of crystalline silicon 10 inside of a hollow pillar of reversible resistivity material 8. A portion of the hollow pillar of reversible resistivity material 8 that surrounds the hollow pillar of crystalline silicon 10 at the top is not depicted to better illustrate the hollow pillar of crystalline silicon 10. The hollow pillar of crystalline silicon 10 can have many shapes.

Figure 1E:
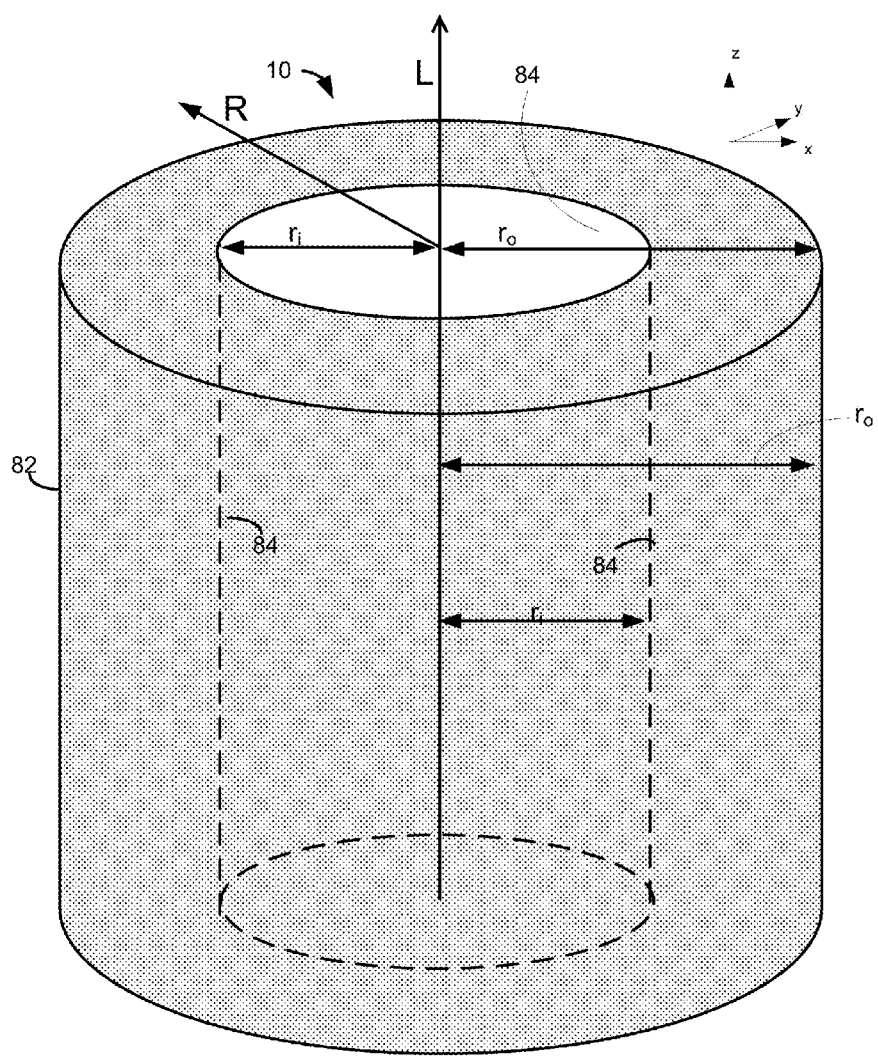
FIG. 1E is a perspective view of one embodiment of a hollow pillar of crystalline silicon.

FIG. 1D is a cross sectional view of a hollow pillar of crystalline silicon 10, consistent with the diagram of FIG. 1C. FIG. 1E is a perspective view of one embodiment of a hollow pillar of crystalline silicon 10. In the examples of FIGS. 1C-1E, the hollow pillar of crystalline silicon 10 is a cylinder. In another embodiment, the hollow pillar of crystalline silicon 10 is prismatic. The hollow pillar of crystalline silicon 10 and reversible resistivity material 8 in FIGS. 1C-1E may be used in the memory structure 60 of FIGS. 1A and 1B. Referring to FIGS. 1C-1E, a coordinate system is depicted with an L-axis and an R-axis. An x/y/z coordinate system is also depicted. The L-axis runs vertically along the center of the hollow pillar. The L-axis may also be referred to as a vertical axis. The L-axis may also be referred to as a longitudinal axis. The hollow pillar extends substantially parallel to the L-axis. Note that there may be some tapering of the hollow pillar. Thus, the hollow pillar is not necessarily exactly parallel to the L-axis. Depending on the design the deviation could be several tens of a degree to one degree, or even more than one degree. The R-axis may also be referred to as a radial axis. The R-axis extends horizontally from the L-axis, and is perpendicular to the L-axis.

An inner radius $r_i$ and an outer radius $r_o$ are depicted. Thus, the crystalline silicon pillar 10 has an outer surface 82 defined by the outer radius $r_o$ and an inner cylindrical surface 84 defined by the inner radius $r_i$, in this embodiment. Note that the radii are not required to be constant in length from top to bottom of the cylinder. Thus, the cylinder may have some taper. The outer surface 82 of the crystalline silicon pillar 10 may be in direct physical contact with an inner surface of the reversible resistivity material 8. The inner surface 84 of the crystalline silicon pillar 10 may be in direct contact with the gate dielectric 12 (not depicted in FIGS. 1C-1E).

The reversible resistivity material 8 has a hollow pillar shape having an outer surface 92 and an inner surface. The inner surface of the reversible resistivity material 8 is not expressly labeled, but may abut the outer surface 82 of the crystalline silicon pillar 10.

In FIGS. 1C-1E, the cross section of the hollow (cylindrical) pillar of crystalline silicon 10 is circular. However, a cylindrical pillar of crystalline silicon 10 could have a cross section having a shape that includes, but is not limited to, oval or elliptical.

In some embodiments, the hollow pillar of crystalline silicon 10 is prismatic in shape. A hollow pillar that is prismatic, as defined herein, has a horizontal cross section that is an n-sided polygon. A prismatic hollow pillar may have an n-sided polygonal base, another congruent base (with the same rotational orientation) and n other faces joining the two bases (the faces may be parallelograms). The value for "n" may be three or more.

Figure 1F:
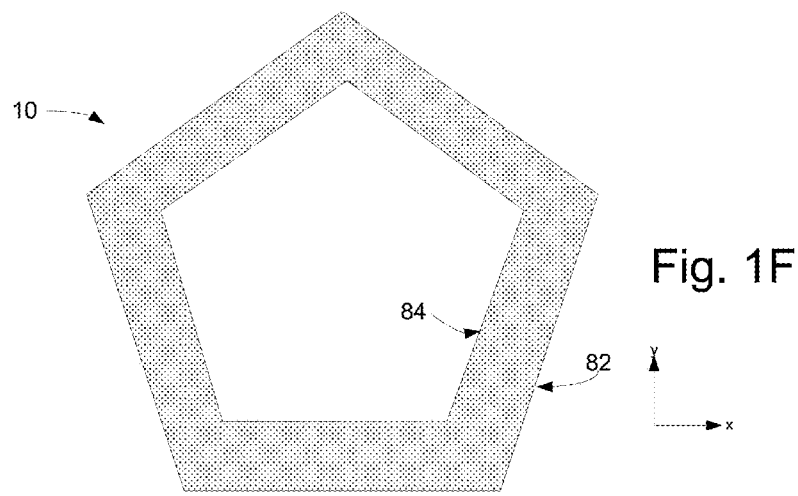
FIGS. 1F and 1G depict one embodiment in which the hollow crystalline silicon pillar has a prismatic shape.
Figure 1G:
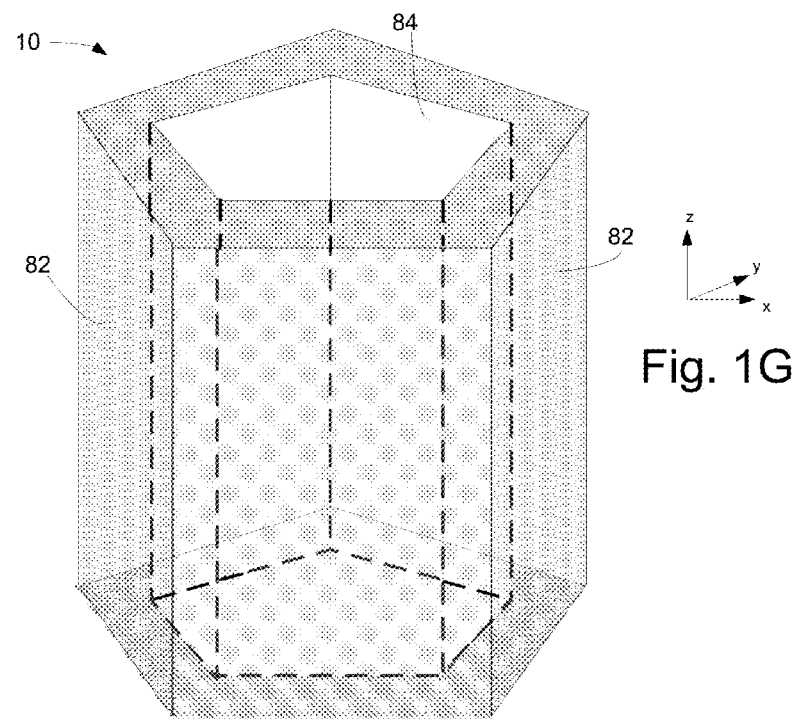

FIGS. 1F and 1G depict one embodiment in which the hollow crystalline silicon pillar 10 has a prismatic shape. FIG. 1G is a perspective view of a hollow crystalline silicon pillar 10 having a prismatic shape. FIG. 1F is a cross sectional view of the hollow crystalline silicon pillar 10 of FIG. 1G along the x-y plane. In this example, the cross section of the crystalline silicon pillar 10 in the x-y plane (which may be referred to as a horizontal cross section) is a pentagon. The five sides of the pentagon may or might not be the same size as each other. The prismatic hollow crystalline silicon pillar 10 is depicted as having an outer surface 82 and an inner surface 84. In this example, the outer surface 82 comprises five sections that are shaped as rectangles. More generally, the five sections may be parallelograms.

Figure 1H:
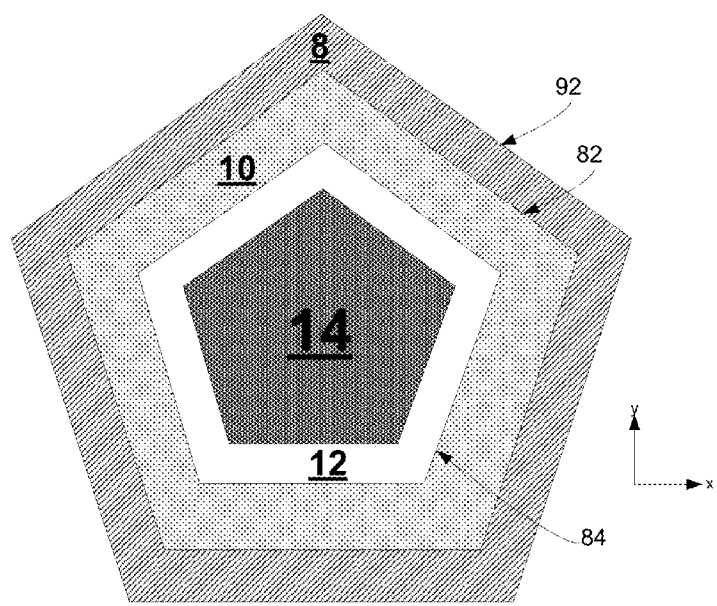
FIG. 1H depicts one embodiment in which the reversible resistivity material, as well as other layers, has a prismatic shape.

The reversible resistivity material 8, as well as the dielectric layer 12, may also have a hollow prismatic shape. FIG. 1H depicts one embodiment in which the reversible resistivity material 8, as well as the dielectric layer 12, has a hollow prismatic shape. The diagram is a cross sectional view in the x-y plane. FIG. 1H is consistent with the one embodiment of FIGS. 1F and 1G in which the crystalline silicon pillar 10 has a prismatic shape. In the embodiment of FIG. 1H, the reversible resistivity material 8 has a hollow prismatic shape. The dielectric layer 12 may also has a hollow prismatic shape. Thus, the reversible resistivity material 8 and the dielectric layer 12 could have a shape similar to the prismatic shape of the crystalline silicon pillar 10 that is depicted in FIG. 1G. The outer surface 92 of the reversible resistivity material 8 has five sections in this example. The inner surface of the reversible resistivity material 8 is not expressly labeled, but may abut the outer surface 82 of the crystalline silicon pillar 10. The inner surface 84 of crystalline silicon pillar 10 may be in direct physical contact with the dielectric layer 12.

The select gate 14 has a solid prismatic shape in FIG. 1H. It not required that all of the layers have a prismatic shape. For example, the reversible resistivity material 8 and the crystalline silicon pillar 10 might have a prismatic shape with materials inside of the crystalline silicon pillar 10 not having a prismatic shape. As another example, the reversible resistivity material 8, the crystalline silicon pillar 10, and the dielectric layer 12 might all have a hollow prismatic shape with the select gate 14 not having a prismatic shape.

Thus, in one embodiment, rather than the cylindrical shapes depicted in FIG. 1B, the reversible resistivity material 8, the crystalline silicon pillar 10, and the dielectric layer 12 of the memory structure 60 may have a prismatic shape.

The hollow pillar for the various layers (e.g., reversible resistivity material 8, crystalline silicon pillar 10, dielectric layer 12) of the memory structure 60 may have a closed shape other than a cylinder or a prism. For example, due to limitations in semiconductor fabrication (e.g., lithographic limitations, etching limitations), the shape of the hollow pillars may not be a perfect cylinder or a perfect prism. Stated another way, the horizontal cross section (e.g., x-y cross section) need not be a perfect circle, ellipse, polygon, etc. In one embodiment, the hollow pillars are formed by using a mask pattern to create openings in alternating layers of an insulator and a conductor. For example, a vertical pillar opening may be formed by etching through a stack of alternating word line layers and oxide layers (e.g., etching through layers of TiN or polysilicon that are separated by oxide layers) to form a polygonal, rectangular, square, or cylindrical trench (or hole) and then forming the layers for forming the vertical hollow pillars within the trench. The etching may be based on a mask pattern. In one example, the hollow vertical pillars may be formed by forming a reversible resistivity material layer 8, forming a crystalline silicon layer 10 adjacent to the reversible resistivity material layer, forming an oxide layer 12 adjacent to the crystalline layer, and forming a polysilicon layer adjacent to the oxide layer to form the select gate 14 that extends through at least a portion of the memory structure 60. The horizontal cross sectional shape of the openings (or trenches) will not necessarily be exactly the same as shapes in the mask. For example, the mask could have square shapes, which may result in approximately round openings (in horizontal cross section). Many horizontal cross sectional shapes are possible for the openings due to, for example, lithographic limitations.

A semiconductor film may be roughly classified as crystalline or amorphous. An amorphous semiconductor film has disordered atomic arrangement and no crystalline component. An example is a semiconductor film in which no crystal part exists even in a microscopic region. Crystalline semiconductor films include single-crystal and non-single-crystal semiconductor films.

A non-single crystal semiconductor film can be crystalline to a different degree. For instance, a poly-crystalline semiconductor film is comprised of "grains". Within each grain, the material is in the crystalline phase. That is, within each grain, the crystalline structure is oriented in the same way. However, in different grains, the crystal orientation may be different. As the term is used herein, a poly-crystalline semiconductor film may include nano-crystals, micro-crystals, or even larger crystals. The terminology depends on the grain size. Nano-crystals are on the order of one nanometer ($1 \times 10^{-9}$ meter) to hundreds of nanometers. Micro-crystals are on the order of one micrometer ($1 \times 10^{-6}$ meter) to hundreds of micrometers. Thus, a poly-crystalline semiconductor film has a higher degree of atomic order than an amorphous oxide semiconductor film. Hence, the density of defect states of the poly-crystalline semiconductor film is lower than that of the amorphous semiconductor film.

The term "large grain" is used herein to refer to a grain that extends at least 300 nanometers ($300 \times 10^{-9}$ meter) in at least one direction. Note that for some embodiments of a reversible resistivity memory device, the bit line is formed from a thin semiconductor film, which may have the shape of a hollow pillar. The hollow pillar may have a longitudinal axis and a radial axis. For example, the semiconductor film may be on the order of tens of nanometers in thickness. Thus, a large grain of polysilicon may extend a few hundred nanometers or more in a direction parallel to the longitudinal axis of the hollow pillar. However, a large grain might extend for less than a few hundred nanometers in a direction perpendicular to the longitudinal axis of the hollow pillar (or parallel to the radial axis).

In one embodiment, the hollow crystalline silicon pillar 10 of the memory structure 60 is a single crystal of silicon. Hence, problems associated with many grain boundaries are avoided. Grain boundaries may be associated with defects. These defects may increase leakage, increase trap assisted carrier generation, reduce cell on current, reduce mobility of charge carriers, and introduce variability of device parameters. One embodiment having a single crystalline silicon hollow pillar bit line has no grain boundaries and no associated defects/traps. Thus, the adverse effects that such defects/traps have on electron mobility and channel leakage are avoided.

Embodiments disclosed herein increase electron mobility, and hence memory cell current, in reversible resistivity memory. Leakage current may be reduced due to, for example, fewer or no defects in the crystalline silicon, as compared to, for example, polysilicon with a large number of defects.

In one embodiment, the crystalline silicon 10 bit line (or channel) has predominantly a (100) orientation with respect to the inner surface of the reversible resistivity material 8. In one embodiment, the crystalline silicon 10 bit line (or channel) is a single crystal of silicon. The silicon crystal may have a (100) orientation with respect to the inner surface of the reversible resistivity material, but that is not required. In one embodiment, the crystalline silicon bit line (or channel) is grains of polysilicon with predominantly all of the grains having the (100) orientation with respect to the inner surface of the reversible resistivity material. For both the single crystal silicon and the large grain polysilicon cases, the crystalline orientation may be favorable for high carrier mobility.

In one embodiment, the crystalline silicon 10 bit line (or channel) has predominantly a (100) orientation with respect to the outer surface of the gate dielectric 12. The silicon crystal may have a (100) orientation with respect to the outer surface of the gate dielectric 12, but that is not required. In one embodiment, the crystalline silicon bit line (or channel) is grains of polysilicon with predominantly all of the grains having the (100) orientation with respect to the outer surface of the gate dielectric 12.

In one embodiment, the hollow crystalline silicon pillar 10 is formed in a 3D memory device by using metal induced crystallization (MIC). In a given round of the MIC process, a layer of metal is deposited and then a layer of amorphous silicon is deposited on the layer of metal. A thermal anneal causes the metal and amorphous silicon to switch places. Additionally, silicon from the amorphous silicon layer is crystallized by the thermal anneal. This results in a layer of crystalline silicon having a hollow pillar shape with metal from the layer of metal exposed on the crystalline silicon. The exposed metal is then removed. This MIC process may be repeated by forming another metal layer, another amorphous silicon layer, and performing another thermal anneal. Again, the metal and newly deposited silicon switch places, and silicon crystallization takes place during the thermal anneal. This results in a single region of crystalline silicon with metal exposed on the crystalline silicon. The exposed metal can then be removed. The single region of crystalline silicon may be predominantly oriented (100) with respect to the inner surface of the reversible resistivity material 8. A gate dielectric 12 may be formed on the crystalline silicon. In one embodiment, the gate dielectric 12 is formed by oxidizing outer portions of the crystalline silicon, such that a very high quality gate dielectric 12 is formed. The single region of crystalline silicon may be a single crystal of silicon or mostly large grains of silicon, in one embodiment. Thus, the process can be used to engineer a desired crystalline orientation in the hollow pillar of silicon that serves as a vertical bit line.

Figure 1I:
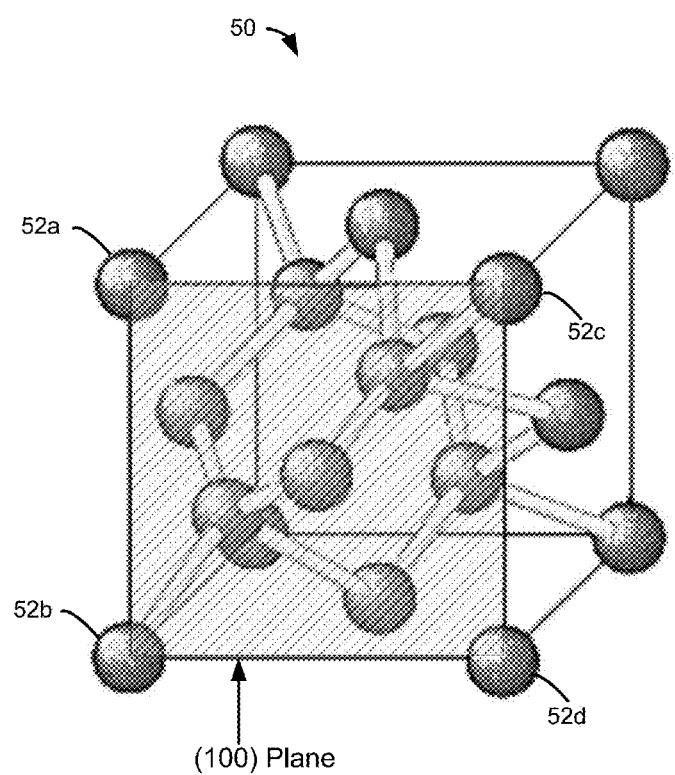
FIG. 1I shows a crystal lattice structure of silicon.

FIG. 1I shows a crystal lattice structure 50 of silicon. Each silicon atom 52 is covalently bound to four other silicon atoms. The crystal orientation is defined by the well-known Miller indices. FIG. 1I shows a (100) plane that is defined by four of the silicon atoms 52*a*-52*d*.

Figure 1J:
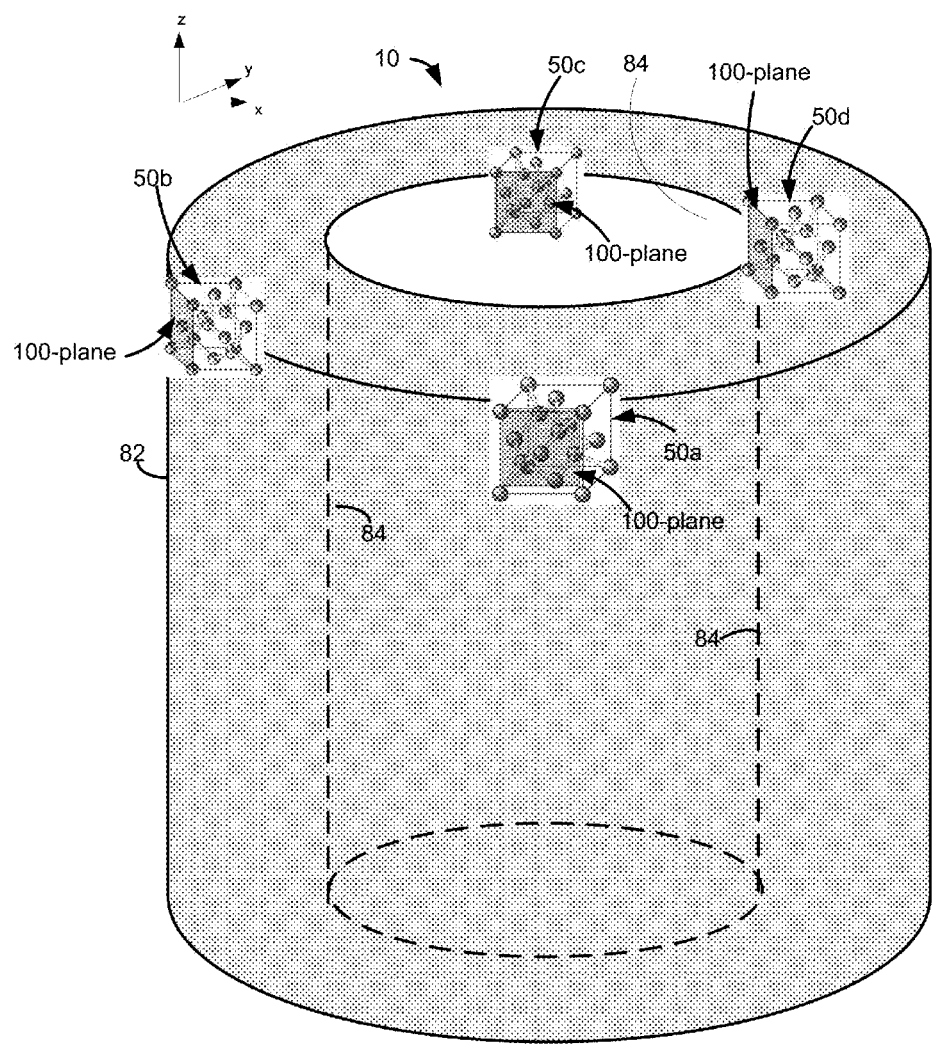
FIG. 1J shows a portion of the crystalline silicon pillar to illustrate a crystalline orientation of one embodiment.

FIG. 1J shows a portion of the crystalline silicon pillar 10 to illustrate a crystalline orientation of one embodiment. The diagram is not drawn to scale. Four crystal lattice structures 50*a*, 50*b*, 50*c*, 50*d* are depicted. Each of the crystal lattice structures 50*a*-50*d* has a (100) plane that is oriented such that the (100) plane is parallel to either the inner surface 84 or the outer surface 82 of the crystalline silicon pillar 10. As noted previously, the outer surface 82 of the crystalline silicon pillar 10 may be in direct physical contact with the inner surface of the reversible resistivity material 8. The (100) Plane of crystal lattice structures 50*a* and 50*b* are depicted as being parallel to a portion of the outer surface 82 of the crystalline silicon pillar 10. Thus, the (100) Plane of crystal lattice structures 50*a* and 50*b* are also parallel to the inner surface of the reversible resistivity material 8. The crystal lattice structures 50*a* and 50*b* are greatly exaggerated in size. Also, there may be many more such crystal lattice structures having an orientation with a (100) plane parallel to a portion of the outer surface 82 of the crystalline silicon pillar 10. Therefore, the crystalline silicon pillar 10 may have a predominantly a (100) orientation with respect to the inner surface of the reversible resistivity material 8. Note that there may be some portions of the crystalline silicon pillar 10 that do not have a (100) orientation with respect to the inner surface of the reversible resistivity material 8. This may be due to the fabrication process being less than ideal such that there may be, for example, some imperfections or irregularities in the crystal structure of the crystalline silicon pillar 10.

As noted previously, the inner surface 84 of the crystalline silicon pillar 10 may be in direct physical contact with the dielectric layer 12. In this example, crystal lattice structures 50*c* and 50*d* each have a (100) Plane parallel to a portion of the inner surface 84 of the crystalline silicon pillar 10. Thus, the (100) Plane of crystal lattice structures 50*c*, 50*d* are each also parallel to the outer surface of the dielectric layer 12. Also, there may be many more such crystal lattice structures having an orientation with a (100) plane parallel to a portion of the inner surface 84 of the crystalline silicon pillar 10. Therefore, the crystalline silicon pillar 10 may have a predominantly a (100) orientation with respect to the outer surface of the dielectric layer 12. Note that there may be some portions of the crystalline silicon pillar 10 that do not have a (100) orientation with respect to the outer surface of the dielectric layer 12. This may be due to the fabrication process being less than ideal such that there may be, for example, some imperfections or irregularities in the crystal structure of the crystalline silicon pillar 10.

Figure 1K:
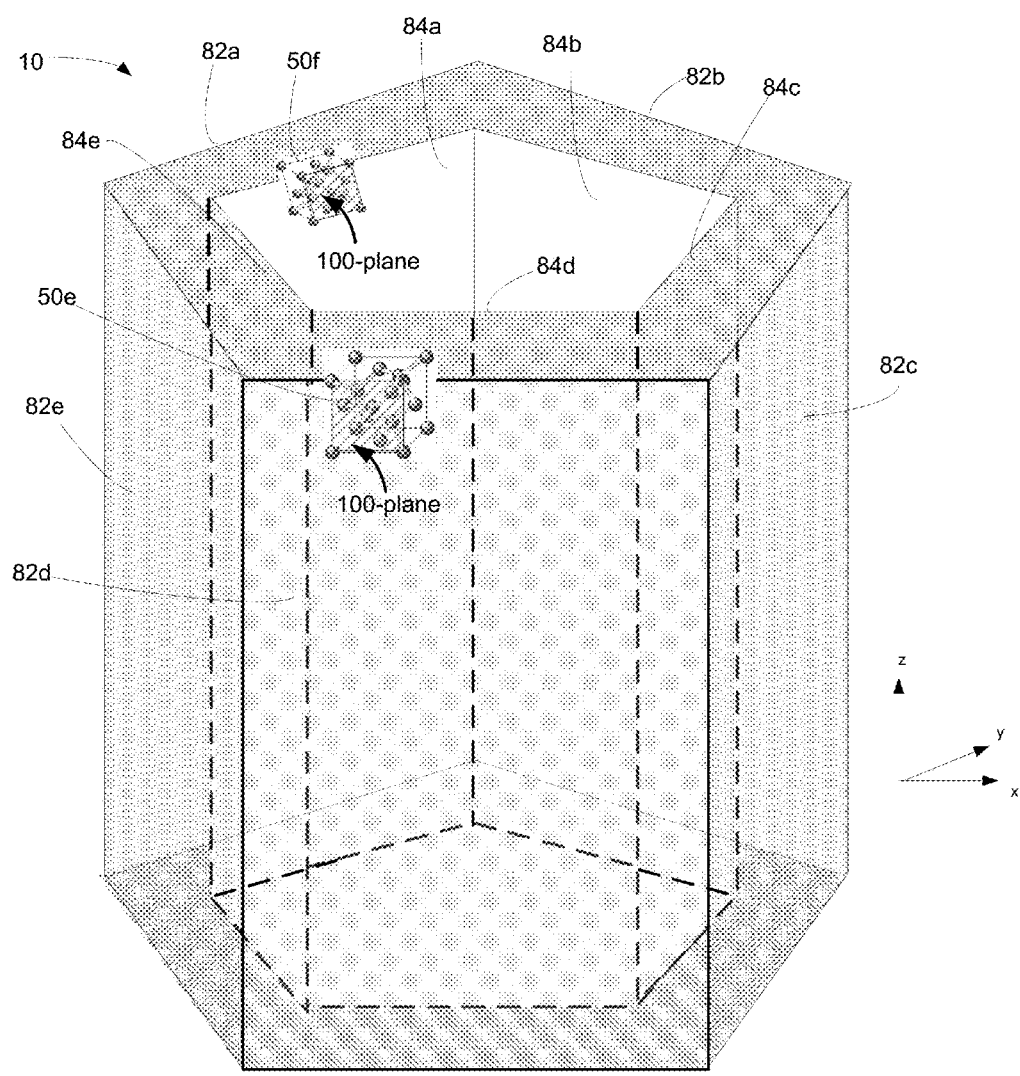
FIG. 1K shows a portion of the crystalline silicon pillar having a prismatic shape to illustrate a crystalline orientation of one embodiment.

FIG. 1K shows a portion of the crystalline silicon pillar 10 having a prismatic shape to illustrate a crystalline orientation of one embodiment. The diagram is not drawn to scale. Two crystal lattice structures 50*e*, 50*f* are depicted. The outer surface 82 has five sections 82*a*-82*e*, in this example. The inner surface 84 has five sections 84*a*-84*e*, in this example. Crystal lattice structure 50*e* has a (100) plane that is oriented such that it is parallel to section 82*d* of the outer surface 82. As noted previously, the outer surface 82 of the crystalline silicon pillar 10 may be in direct physical contact with the inner surface of the reversible resistivity material 8. Thus, the (100) Plane of crystal lattice structure 50*e* may also be parallel to the inner surface of the reversible resistivity material 8 (not depicted in FIG. 1K). Also, there may be many more such crystal lattice structures having an orientation with a (100) plane parallel to a section of the outer surface 82 of the crystalline silicon pillar 10. Therefore, the crystalline silicon pillar 10 may have a predominantly a (100) orientation with respect to the inner surface of the reversible resistivity material 8. Note that there may be some portions of the crystalline silicon pillar 10 that do not have a (100) orientation with respect to the inner surface of the reversible resistivity material 8. This may be due to the fabrication process being less than ideal such that there may be, for example, some imperfections or irregularities in the crystal structure of the crystalline silicon pillar 10.

Crystal lattice structure 50*f* has a (100) plane that is oriented such that it is parallel to section 84*a* of the inner surface 84 of crystalline silicon pillar 10. As noted previously, the inner surface 84 of the crystalline silicon pillar 10 may be in direct physical contact with the outer surface of the dielectric material 12 (not depicted in FIG. 1K). Thus, the (100) Plane of crystal lattice structure 50*f* may also be parallel to the outer surface of the dielectric material 12. Also, there may be many more such crystal lattice structures having an orientation with a (100) plane parallel to a section of the inner surface 84 of the crystalline silicon pillar 10. Therefore, the crystalline silicon pillar 10 may have a predominantly a (100) orientation with respect to the outer surface of the dielectric material 12. Note that there may be some portions of the crystalline silicon pillar 10 that do not have a (100) orientation with respect to the outer surface of the dielectric material 12. This may be due to the fabrication process being less than ideal such that there may be, for example, some imperfections or irregularities in the crystal structure of the crystalline silicon pillar 10.

As noted, the individual crystal lattice structures 50 that are depicted in FIGS. 1J and 1K are not drawn to scale. The depicted crystal lattice structures 50 could all be part of one single crystal of silicon that fills the entire crystalline silicon pillar 10, with no grain boundaries. As another alternative, the depicted crystal lattice structures 50 could each be part of a large grain of silicon that does not fill the entire crystalline silicon pillar 10. The crystalline silicon pillar 10 may be a thin film. Thus, the distance between the outer surface 82 and the inner surface 84 of the crystalline silicon pillar 10 may be on the order of tens of nanometers, as one example. The distance between the outer surface 82 and the inner surface 84 of the crystalline silicon pillar 10 may be larger or smaller. Thus, the 1 to 10 micron grain size is with respect to the length of the crystalline silicon pillar 10 (in the direction of the L-axis), in one embodiment. Thus, a single large grain of silicon could include one, two, or all three of the depicted crystal lattice structures 50.

In some embodiment, the hollow pillar crystalline silicon 10 is a bit line in an adjustable resistance bit line structure. That is, the hollow pillar crystalline silicon 10 may be a bit line having an adjustable resistance. In some embodiments, leakage currents through unselected memory cells of the memory array may be reduced by setting an adjustable resistance bit line structure connected to the unselected memory cells into a high resistance state or a non-conducting state. The adjustable resistance bit line structure may comprise a bit line structure in which the resistance of a crystalline silicon 10 portion of the bit line structure may be adjusted via an application of a voltage to a select gate (SG) portion 14 of the bit line structure that is isolated or separated from the crystalline silicon portion 10 by dielectric layer 12. In this case, the crystalline silicon 10 may be set into a conducting state or a non-conducting state based on the voltage applied to the select gate 14 of the bit line structure. The adjustable resistance bit line structure may comprise a vertical bit line structure (e.g., a bit line structure that is arranged in a direction that is substantially orthogonal to a substrate) or a horizontal bit line structure (e.g., a bit line structure that is arranged in a direction that is substantially parallel to a substrate).

One issue with having a bit line with high resistance is that sensing margins may be reduced due to the variability in voltage drops along the high resistance bit line during sensing operations. Moreover, a high resistance bit line may cause an increase in the programming voltages required to program a memory cell during programming operations. Thus, using bit lines with high resistance is typically not advisable.

One benefit of using adjustable resistance bit lines or adjustable resistance bit line structures is that leakage currents through unselected memory cells (e.g., H-cells and/or U-cells) may be significantly reduced. The reduction in leakage currents may allow for improved memory array efficiency and for larger memory array sizes. Furthermore, the reduction in leakage currents during memory operations may lead to reduced power consumption, reduced energy consumption, improved memory reliability, and/or reduced voltages required to bias a memory array during the memory operations.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Figure 2A:
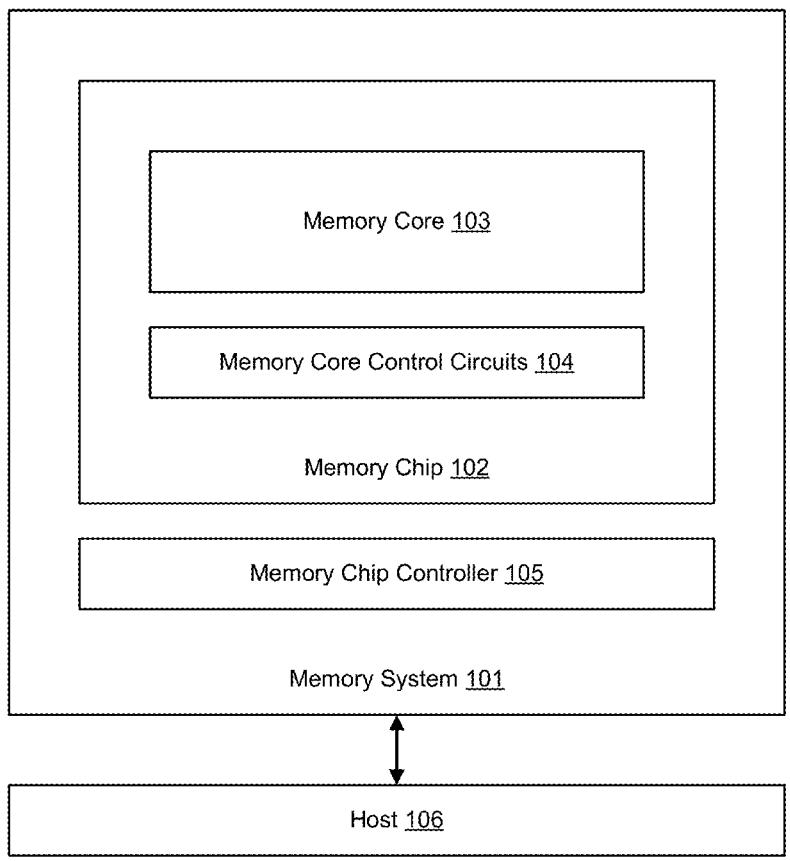
FIGS. 2A-2H depict various embodiments of a memory system.

FIG. 2A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 2A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 2A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 2B:
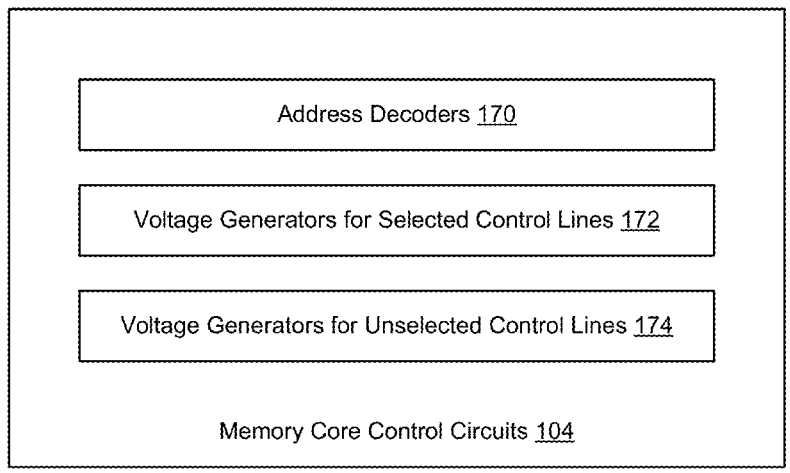

FIG. 2B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 2C-2F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 2C:
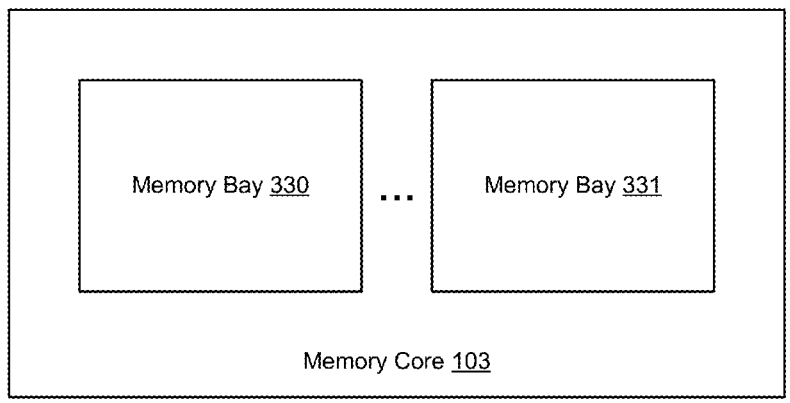

FIG. 2C depicts one embodiment of memory core 103 in FIG. 2A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 2D:
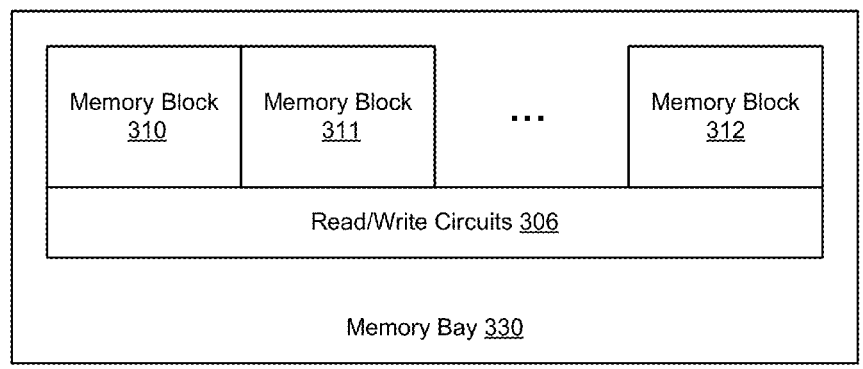

FIG. 2D depicts one embodiment of memory bay 330 in FIG. 2C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 2A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 2E:
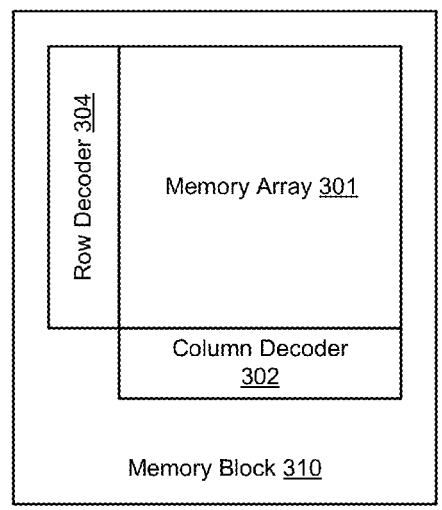

FIG. 2E depicts one embodiment of memory block 310 in FIG. 2D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 2D. In one embodiment, the number of word lines is 4K per memory layer, the number of bit lines is 1K per memory layer, and the number of memory layers is 4, providing a memory array 301 containing 16M memory cells.

Figure 2F:
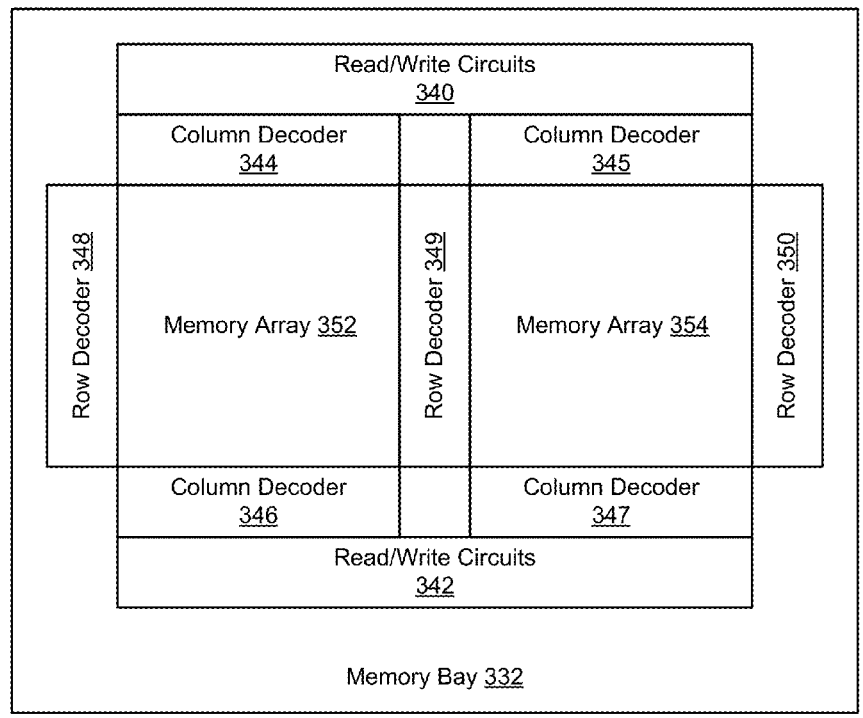

FIG. 2F depicts one embodiment of a memory bay 332. Memory bay 332 is one example of an alternative implementation for memory bay 330 in FIG. 2D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2G:
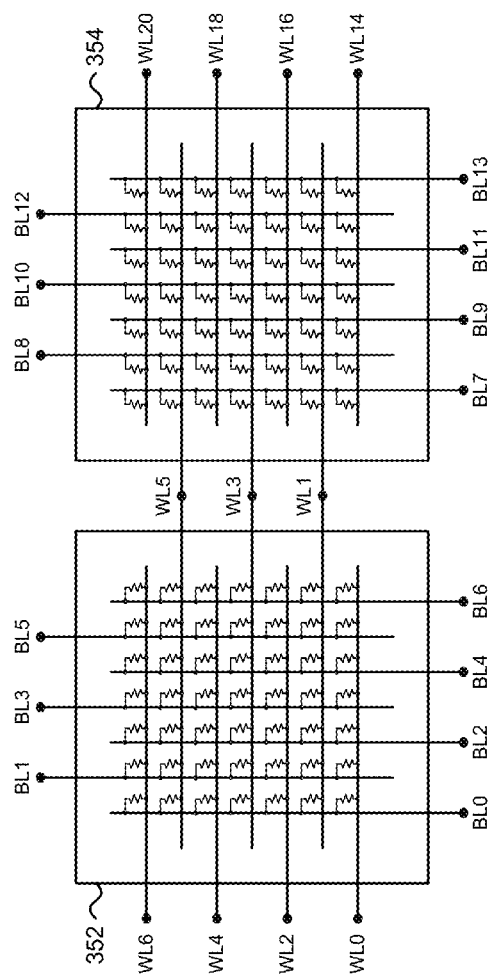

FIG. 2G depicts one embodiment of a schematic diagram (including word lines and bit lines) corresponding with memory bay 332 in FIG. 2F. As depicted, word lines WL1, WL3, and WL5 are shared between memory arrays 352 and 354 and controlled by row decoder 349 of FIG. 2F. Word lines WL0, WL2, WL4, and WL6 are driven from the left side of memory array 352 and controlled by row decoder 348 of FIG. 2F. Word lines WL14, WL16, WL18, and WL20 are driven from the right side of memory array 354 and controlled by row decoder 350 of FIG. 2F. Bit lines BL0, BL2, BL4, and BL6 are driven from the bottom of memory array 352 and controlled by column decoder 346 of FIG. 2F. Bit lines BL1, BL3, and BL5 are driven from the top of memory array 352 and controlled by column decoder 344 of FIG. 2F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2H:
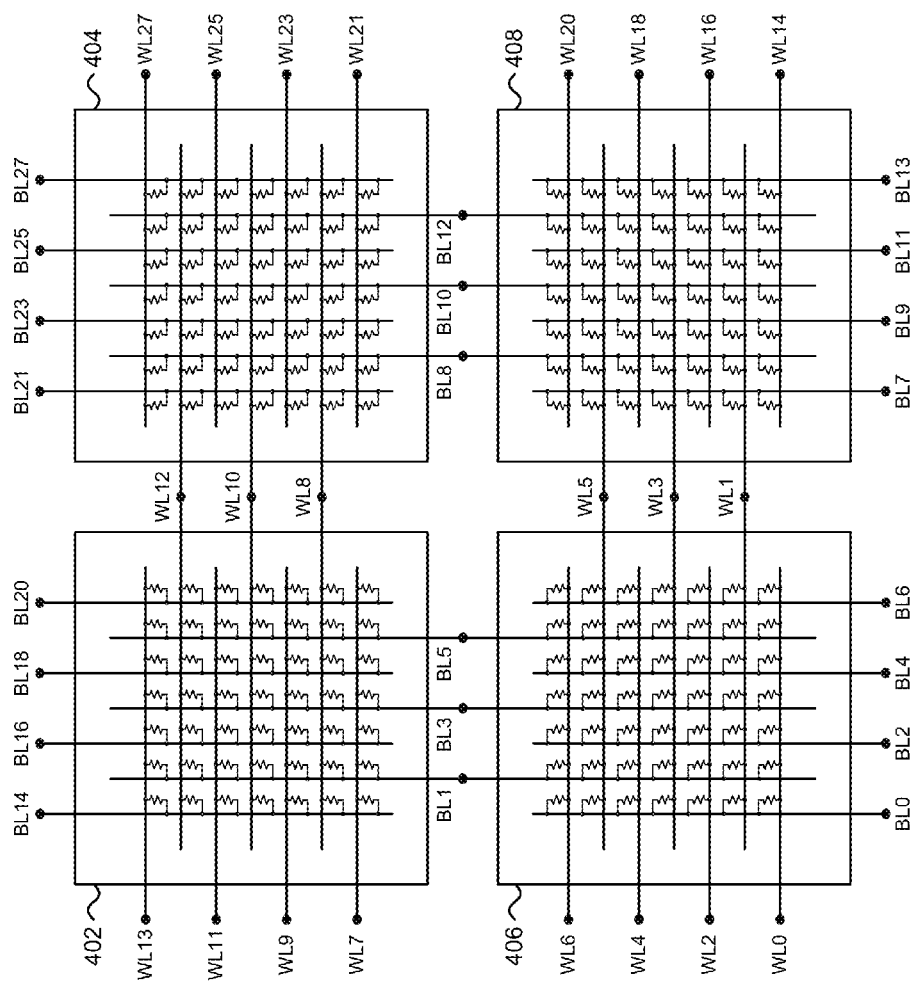

FIG. 2H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

In one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Figure 3A:
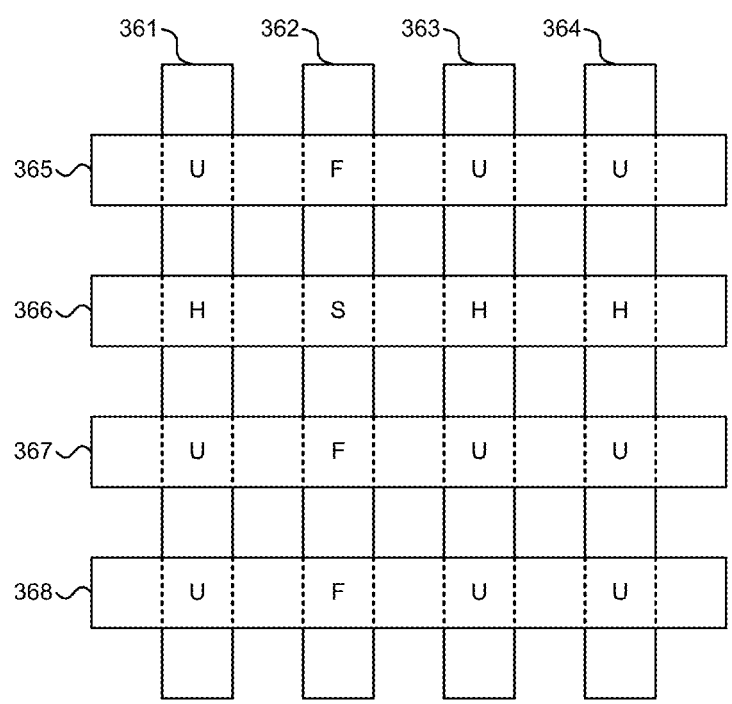
FIGS. 3A-3B depict embodiments of a cross-point memory array.

FIG. 3A depicts one embodiment of a cross-point memory array 360. In one example, the cross-point memory array 360 may correspond with memory array 201 in FIG. 2A. As depicted, cross-point memory array 360 includes word lines 365-368 and bit lines 361-364. The bit lines 361 may comprise vertical bit lines or horizontal bit lines. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3B:
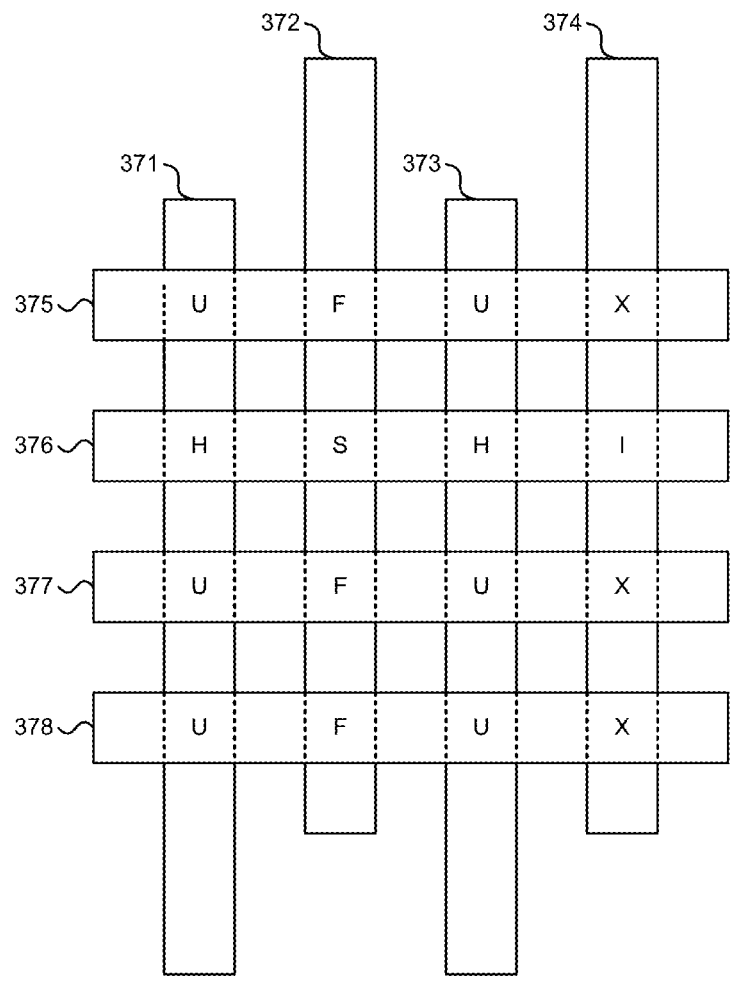

FIG. 3B depicts an alternative embodiment of a cross-point memory array 370. In one example, the cross-point memory array 370 may correspond with memory array 201 in FIG. 2A. As depicted, cross-point memory array 370 includes word lines 375-378 and bit lines 371-374. The bit lines 371-374 may comprise vertical bit lines or horizontal bit lines. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines.

Figure 4:
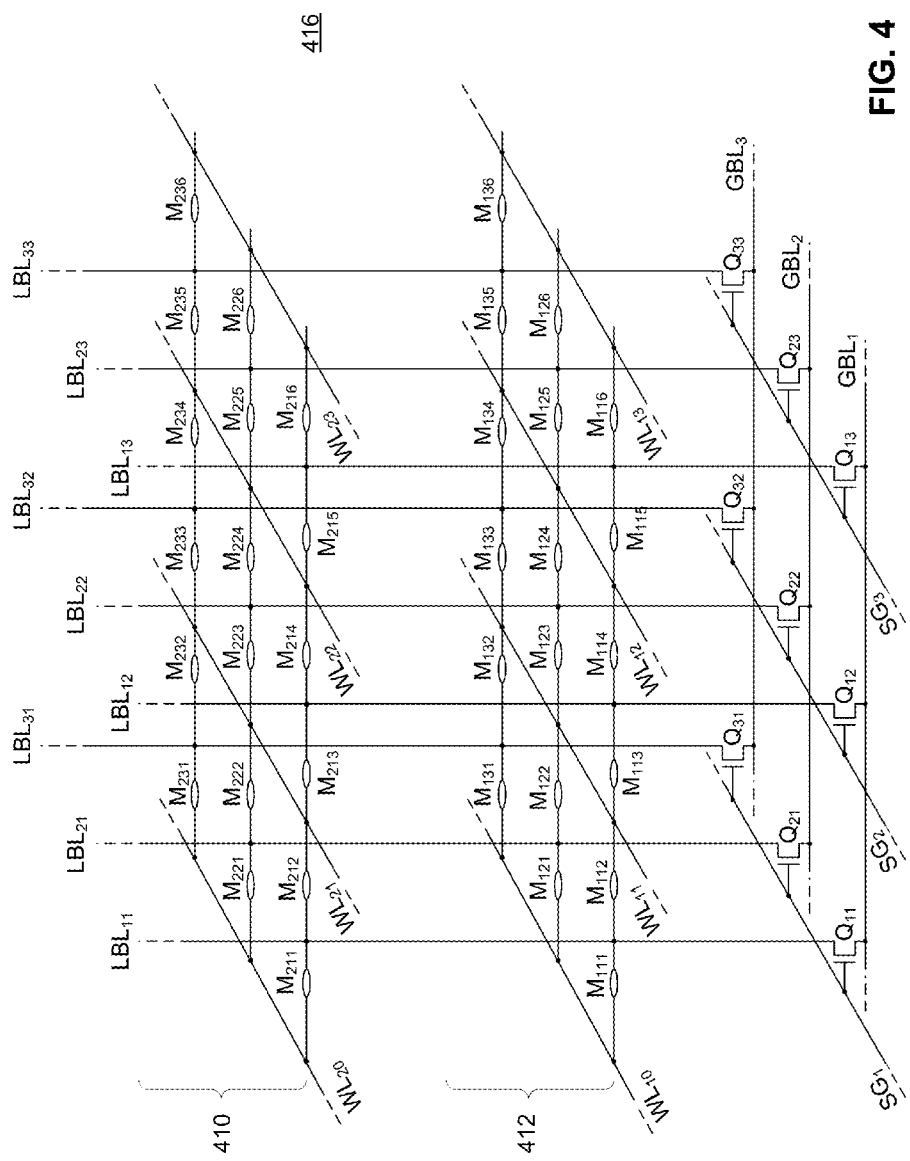
FIG. 4 depicts one embodiment of a portion of a three-dimensional memory array.

FIG. 4 depicts one embodiment of a portion of a monolithic three-dimensional memory array 416 that includes a first memory level 412 positioned below a second memory level 410. Memory array 416 is one example of an implementation for memory array 301 in FIG. 2E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one embodiment, the local bit lines are formed from the crystalline silicon hollow pillar 10.

In one example, the particular memory cell may include a reversible resistance-switching material, such as a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 5:
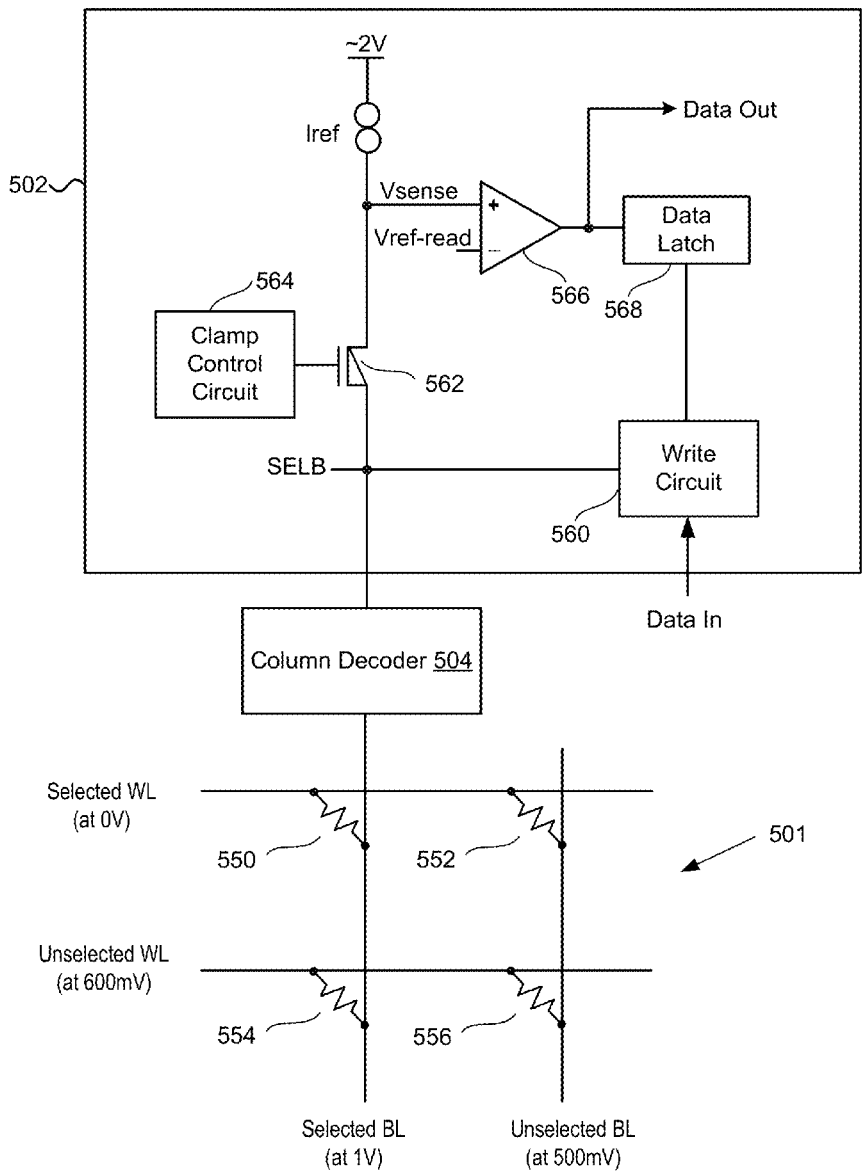
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a vertical direction that is perpendicular to the substrate, such as memory array 416 in FIG. 4.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400n5).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figures 6A, 6B:
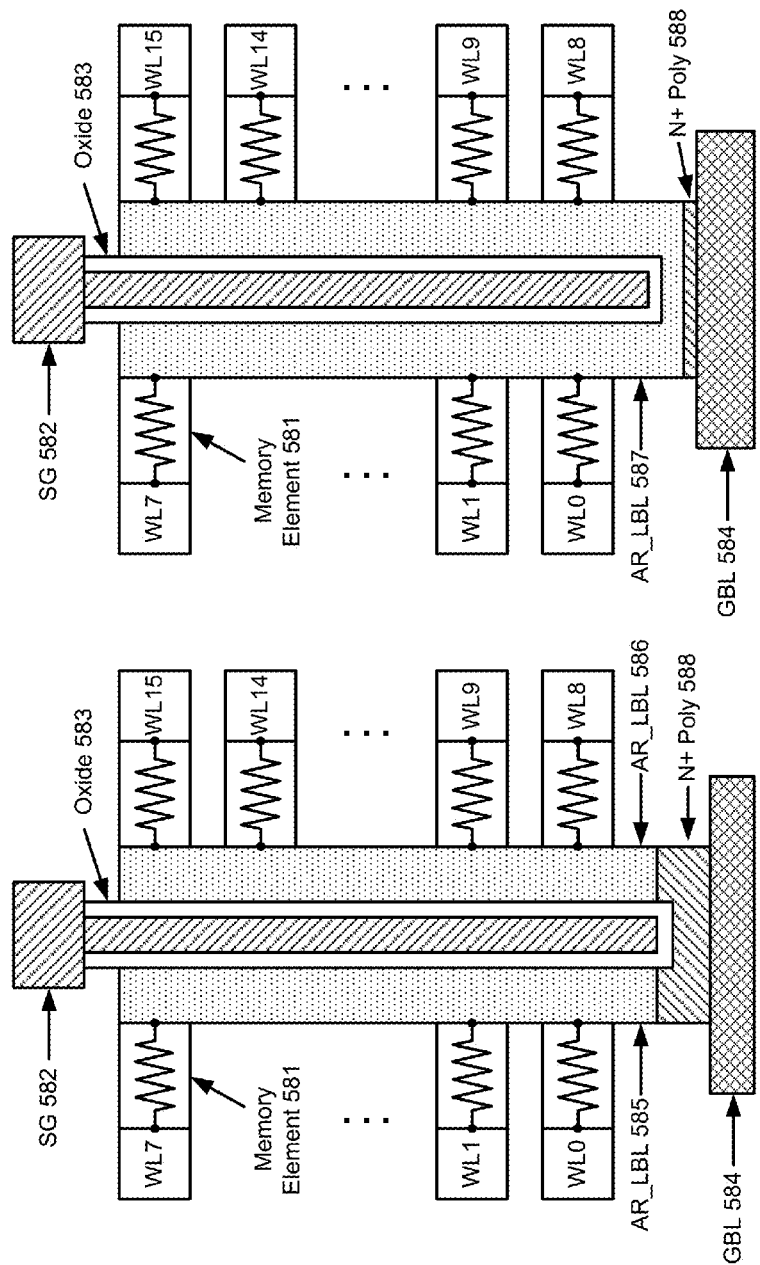
FIGS. 6A-6V depict various embodiments of adjustable resistance bit line structures within a memory array in which the crystalline bit line has a cylindrical shape.
Figure 6C:
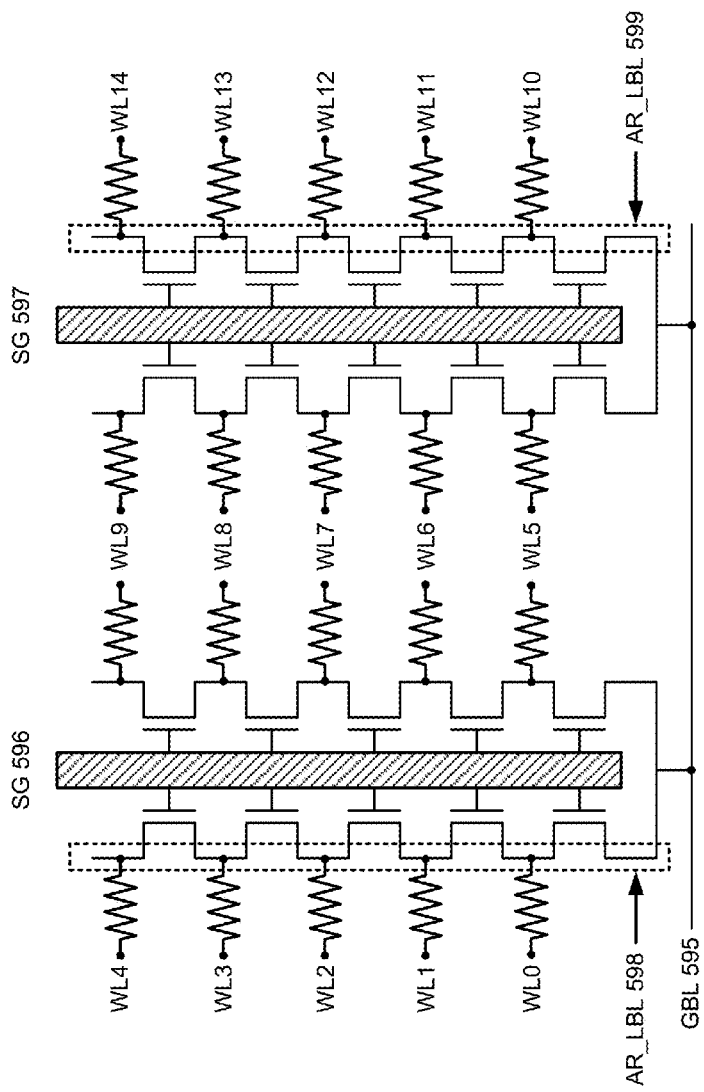
Figure 6D:
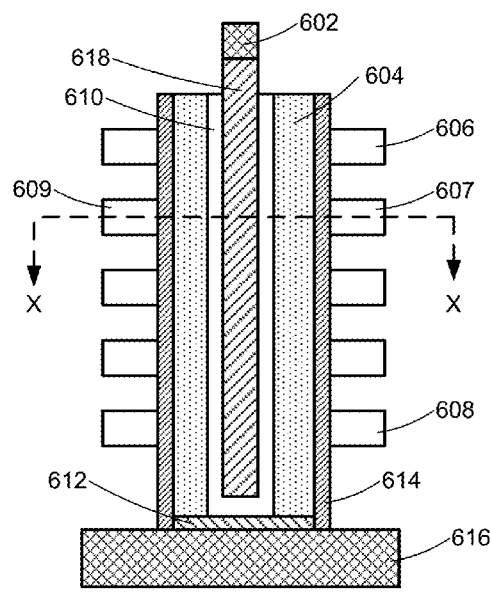
Figure 6E:
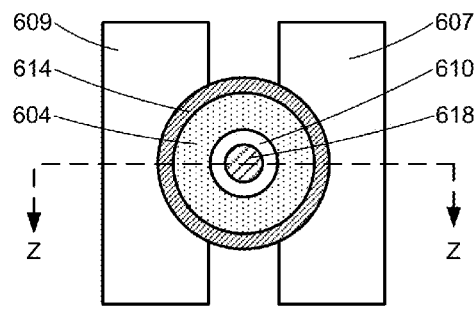
Figure 6F:
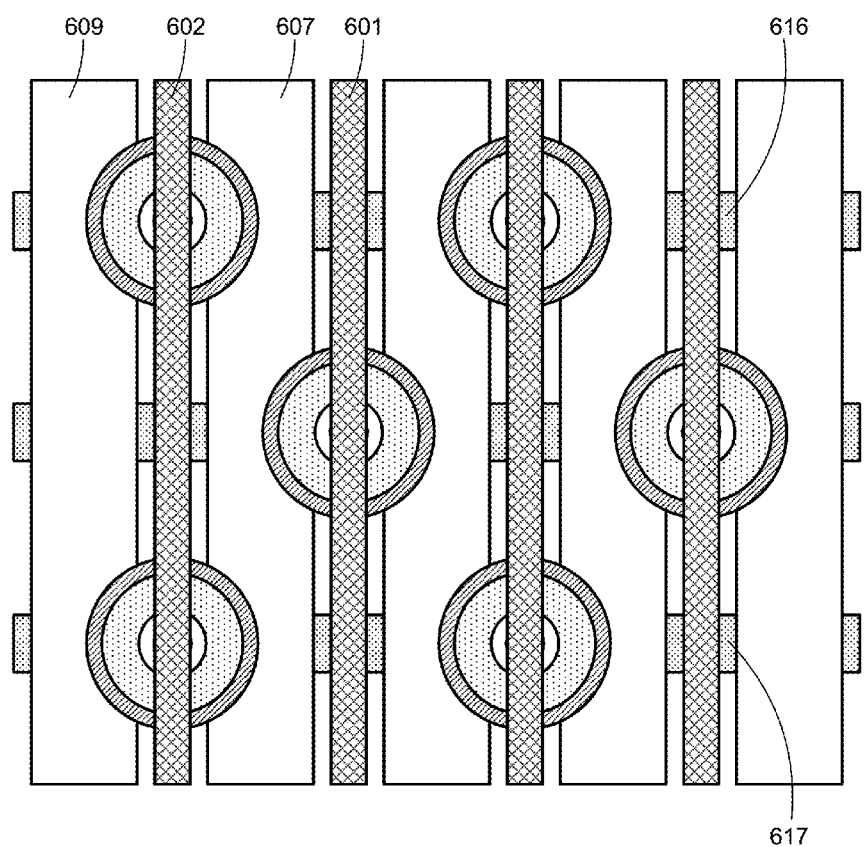
Figure 6G:
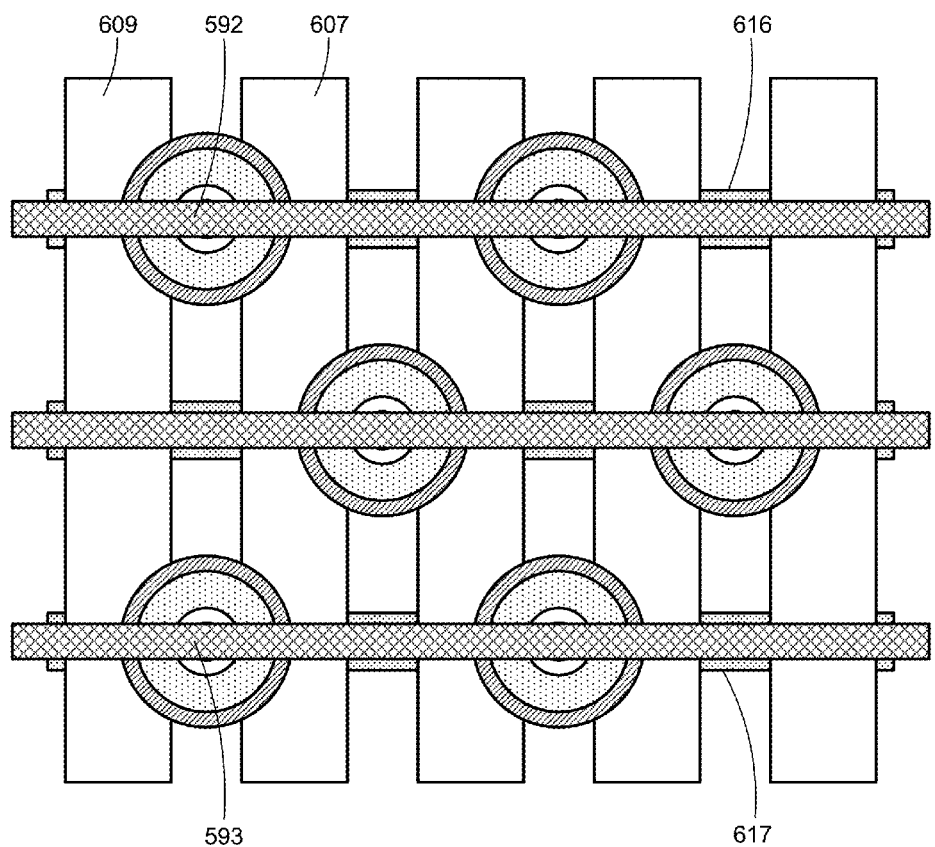
Figure 6H:
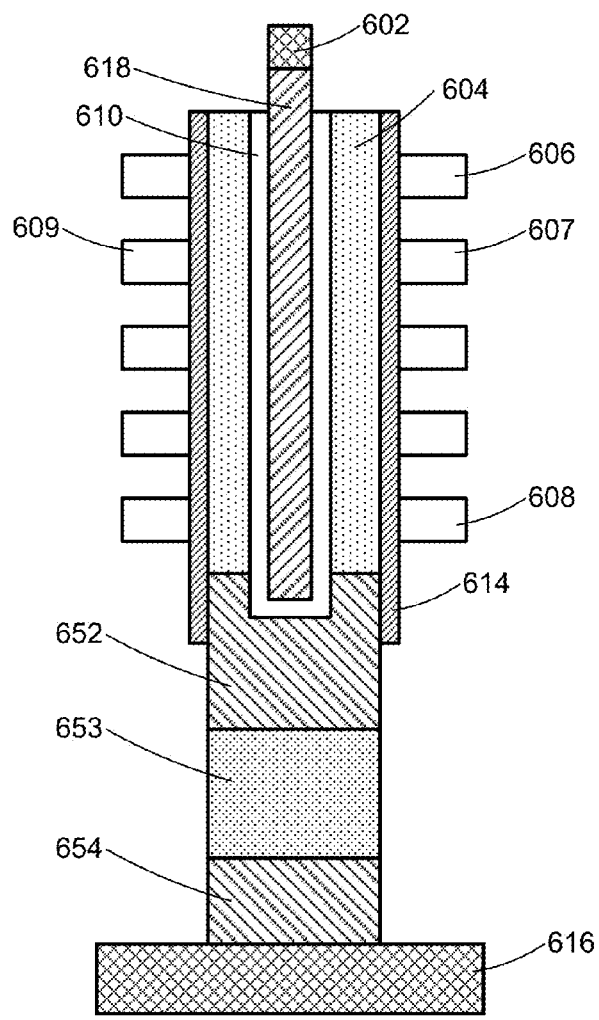
Figure 6I:
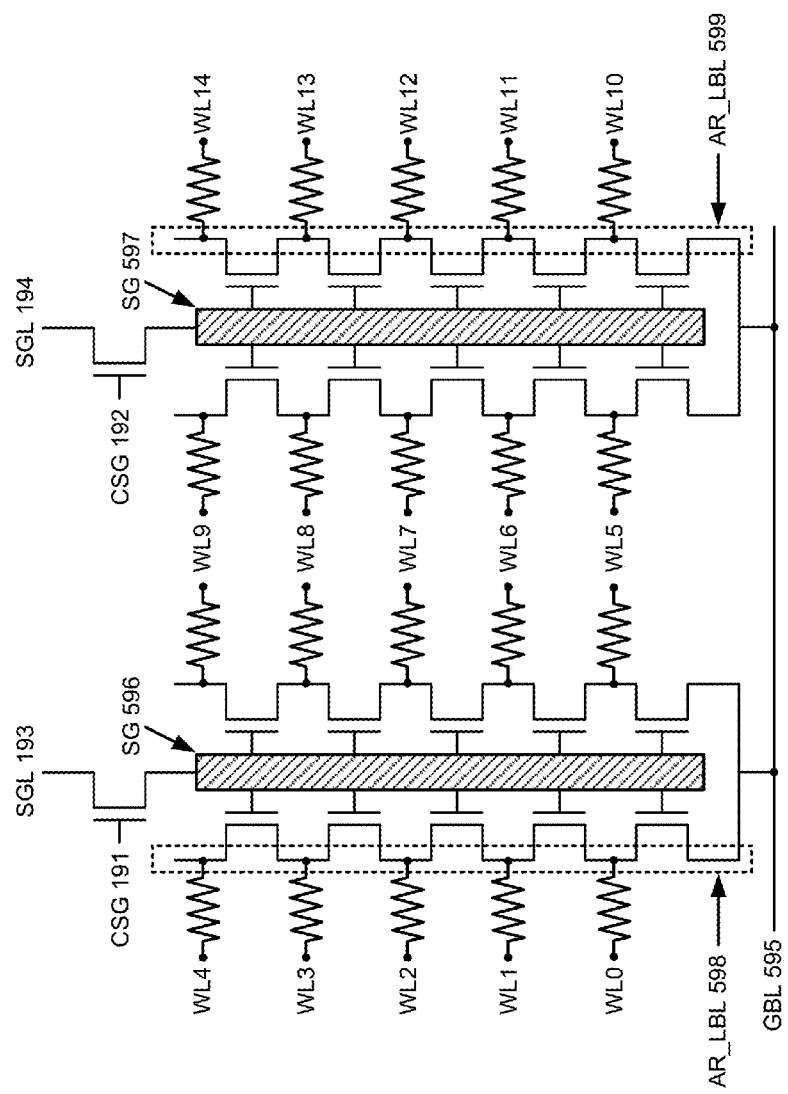
Figure 6J:
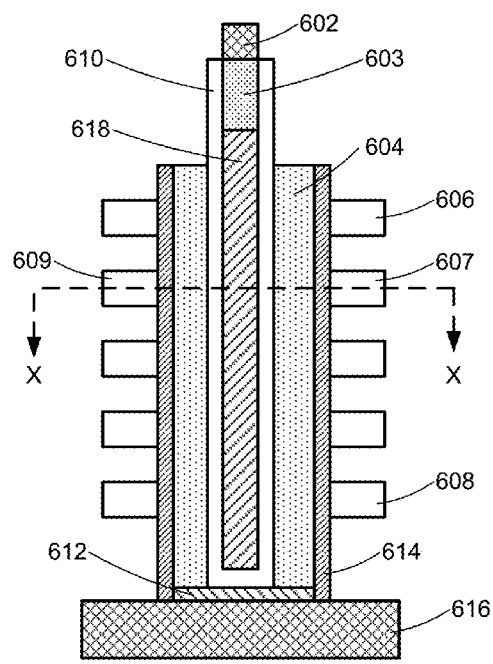
Figure 6K:
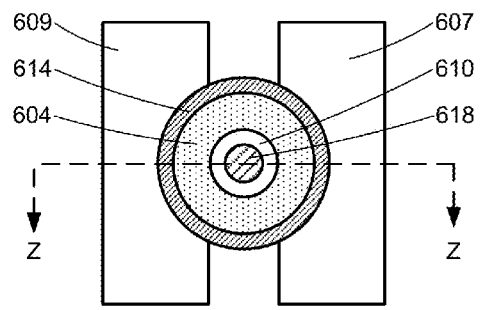
Figure 6L:
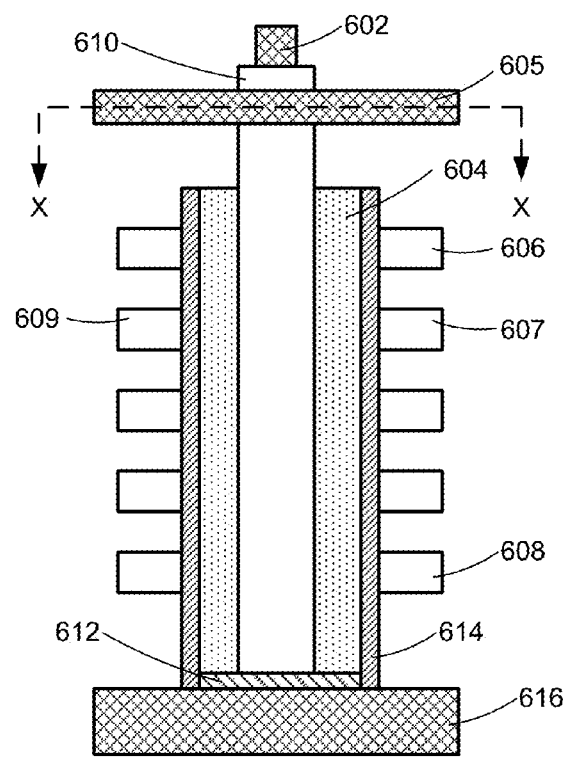
Figure 6M:
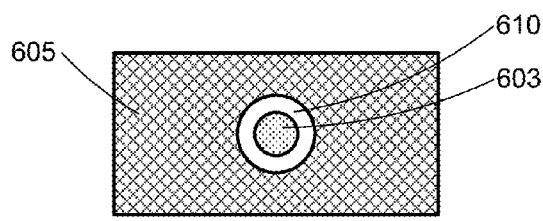
Figure 6N:
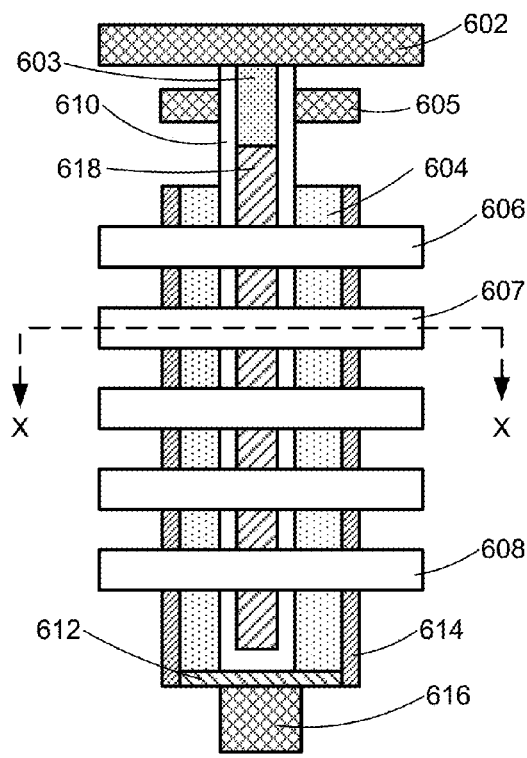
Figure 6O:
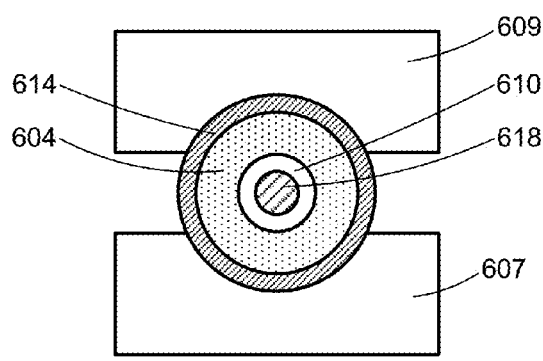
Figure 6P:
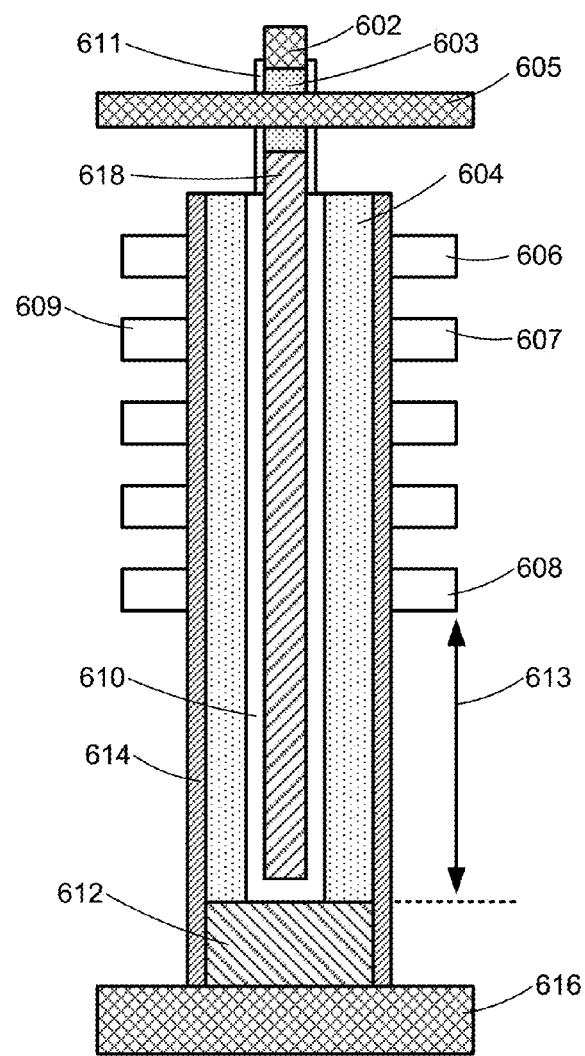
Figure 6Q:
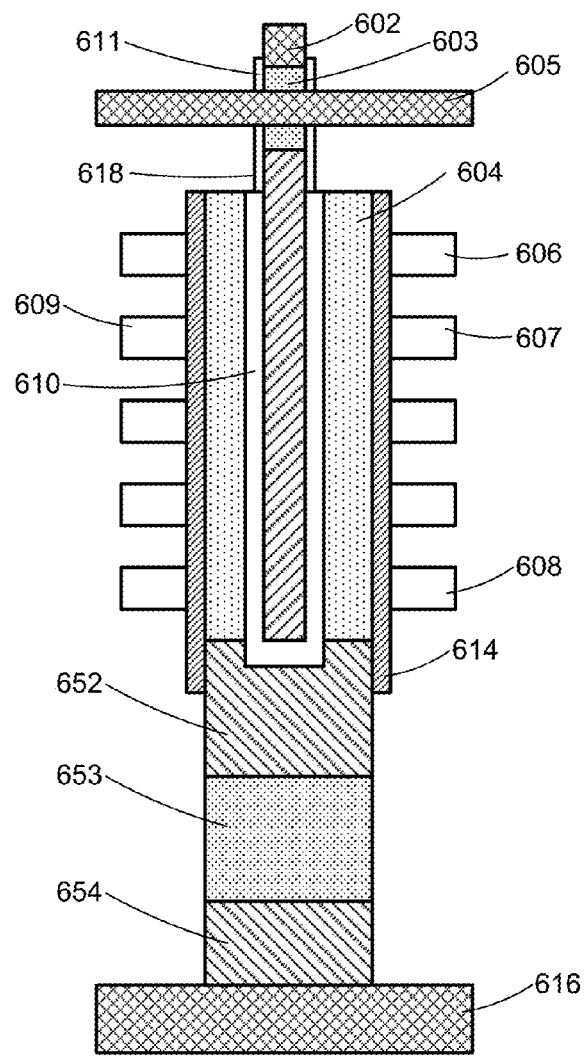
Figure 6R:
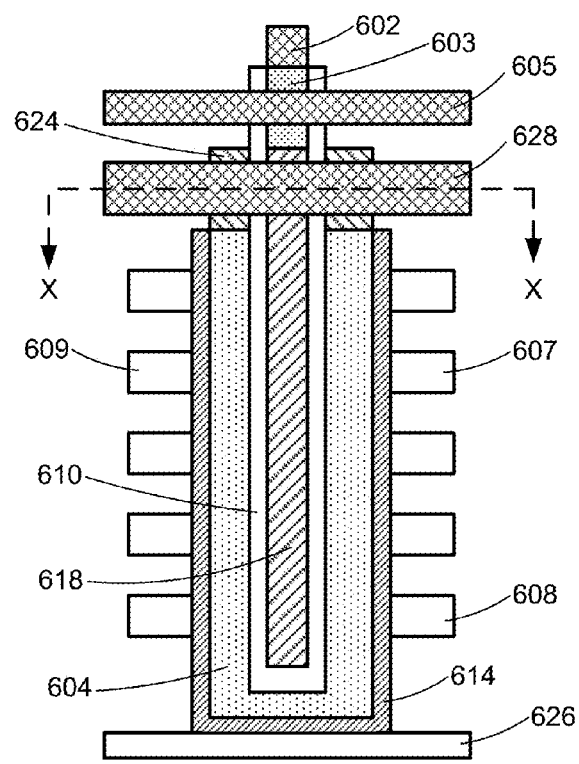
Figure 6S:
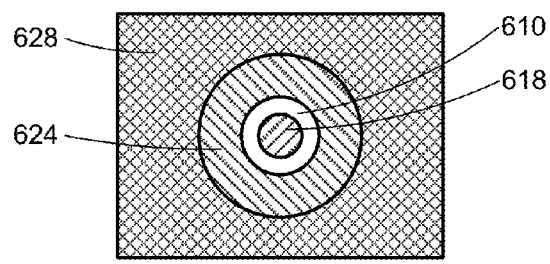
Figure 6T:
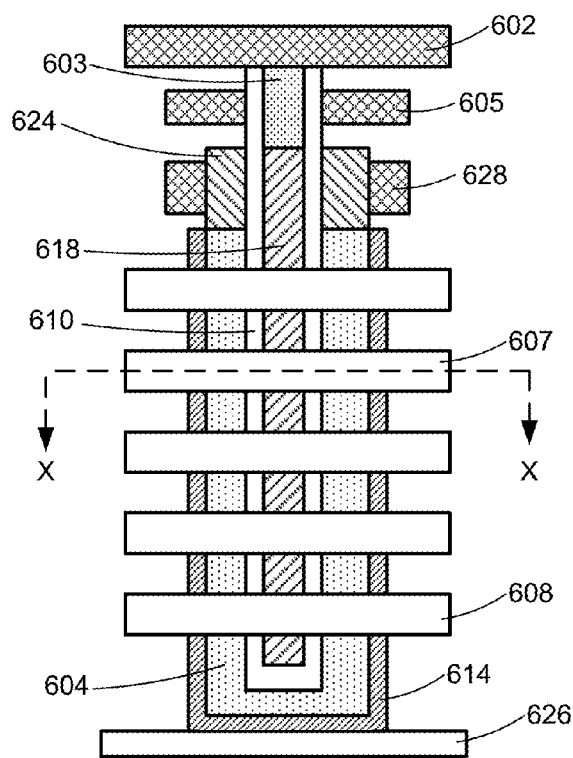
Figure 6U:
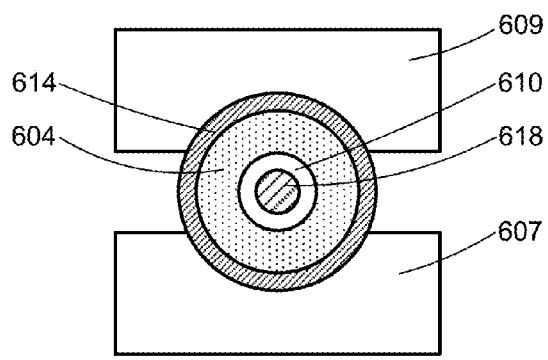
Figure 6V:
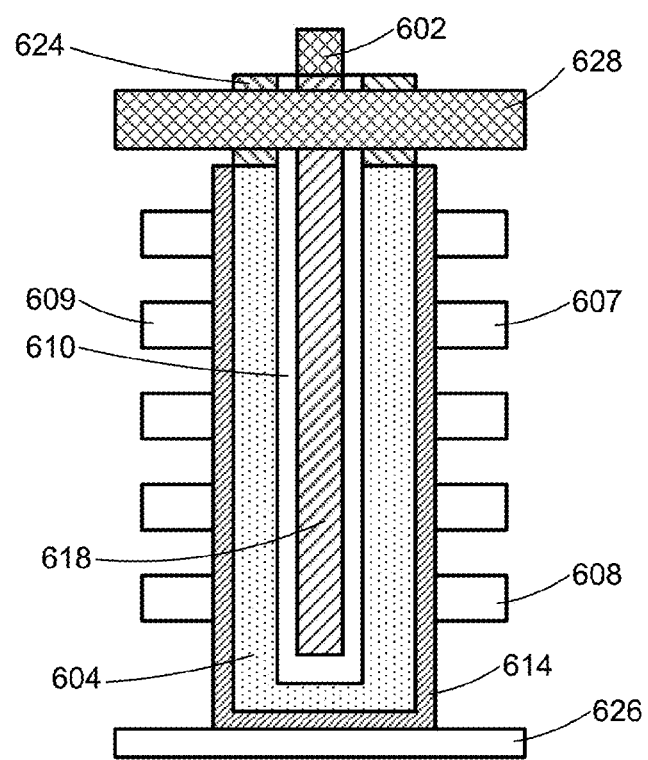

FIGS. 6A-6V depict embodiments of an adjustable resistance bit line structure in which the bit line comprises a hollow pillar of crystalline silicon 10. The various structures in FIGS. 6A-6V represent various embodiments of memory structure 60 of FIGS. 1A-1B. The memory elements in FIGS. 6A-6V are embodiments of hollow pillars of reversible resistivity material 8. The adjustable resistance local bit lines AR_LBL in FIGS. 6A-6V are embodiments of the hollow pillar of crystalline silicon 10. The select gates in FIGS. 6A-6V are embodiments of select gate 14. The oxide between the select gates and the local bit lines AR_LBL are embodiments of dielectric layer 12. The word lines are embodiments of word lines 1-6, in FIG. 1A. The various local bit lines AR_LBL in FIGS. 6A-6V may comprise crystalline silicon 10 having a hollow pillar shape, in various embodiments. The various local memory cells in FIGS. 6A-6V may comprise reversible resistivity material 8 having a hollow pillar shape, in various embodiments. The crystalline silicon of the various local bit lines AR_LBL in FIGS. 6A-6V may have predominantly a (100) orientation with respect to the inner surface of the reversible resistivity material of the memory cells. The crystalline silicon of the various local bit lines AR_LBL in FIGS. 6A-6V may have predominantly a (100) orientation with respect to the outer surface of the oxide between the select gates and the local bit lines AR_LBL. The crystalline silicon of the various local bit lines AR_LBL in FIGS. 6A-6V is a single crystal, in some embodiments.

FIG. 6A depicts one embodiment of an adjustable resistance bit line structure. As depicted, the adjustable resistance bit line structure may comprise a vertical bit line structure that includes an adjustable resistance local bit line AR_LBL 585 that is arranged in a direction that is substantially orthogonal to a substrate (e.g., the adjustable resistance local bit line AR_LBL 585 may comprise part of a vertical pillar that is orthogonal to a silicon substrate). The adjustable resistance local bit line AR_LBL 585 and AR_LBL 586 are each one embodiment of the hollow pillar of crystalline silicon 10. The adjustable resistance local bit line AR_LBL 585 may comprise crystalline silicon. In one embodiment, the adjustable resistance local bit line AR_LBL 585 is a single crystal of silicon. In one embodiment, the adjustable resistance local bit line AR_LBL 585 has grains of polysilicon. In one embodiment, predominantly all of the local bit line AR_LBL 585 is grains of polysilicon having a (100) orientation with respect to the inner surface of the reversible resistivity material of the memory cell.

The adjustable resistance bit line structure also includes a select gate SG 582 and an oxide layer Oxide 583 or other dielectric layer (e.g., a high-k dielectric layer) that is arranged between the adjustable resistance local bit line AR_LBL 585 and the select gate SG 582. Select gate SG 582 is one embodiment of select gate 14. Oxide layer 583 is one embodiment of dielectric layer 12. The oxide layer Oxide 583 is also arranged between the adjustable resistance local bit line AR_LBL 586 and the select gate SG 582. Both the adjustable resistance local bit line AR_LBL 585 and the adjustable resistance local bit line AR_LBL 586 extend to the N+ polysilicon layer 588 that may be formed over or abut the global bit line GBL 584. In some cases, the select gate SG 582 and the oxide layer Oxide 583 may extend into the N+ polysilicon layer 588 such that the bottom of the select gate SG 582 is below the top of the N+ polysilicon layer 588. The select gate SG 582 may comprise titanium nitride (TiN) or polysilicon. The adjustable resistance local bit line AR_LBL 585 and the adjustable resistance local bit line AR_LBL 586 may comprise crystalline silicon. The Oxide layer 583 may comprise silicon dioxide. The global bit line GBL 584 may comprise TiN or tungsten.

In some cases, the adjustable resistance bit line structure may comprise a vertical pillar. The vertical pillar may comprise a prismatic pillar or a cylindrical pillar, but is not limited to these shapes. The vertical pillar may be formed by etching through a stack of alternating word line layers and oxide layers (e.g., etching through layers of TiN or polysilicon that are separated by oxide layers) to form a polygonal, rectangular, square, or cylindrical trench (or hole) and then depositing the layers for forming the vertical pillar within the trench. In one example, the vertical pillar may be formed by forming a ReRAM layer, forming a crystalline silicon layer adjacent to the ReRAM layer, forming an oxide layer adjacent to the crystalline layer, and forming a polysilicon layer adjacent to the oxide layer to form the select gate that extends through at least a portion of the vertical pillar.

In one embodiment, the resistance or the conductivity of the adjustable resistance local bit line AR_LBL 585 may be adjusted via an application of a voltage to the select gate SG 582. In one example, the adjustable resistance local bit line AR_LBL 585 may be set into either a conducting state or a non-conducting state based on the voltage applied to the select gate SG 582. When the adjustable resistance local bit line AR_LBL 585 is set into a conducting state, then a low resistance path (e.g., less than 100 ohm or less than 1 Kohm) or a conducting path may be formed between the memory elements connected to the word lines WL0-WL7 and the global bit line GBL 584. When the adjustable resistance local bit line AR_LBL 585 is set into a non-conducting state, then a high resistance path (e.g., more than 1 Gohm or more than 10 Gohm) is placed between the memory elements connected to the word lines WL0-WL7 and the global bit line GBL 584. In effect, the high resistance path may cause the memory elements corresponding with the word lines WL0-WL7 to be electrically disconnected from the global bit line GBL 584. Furthermore, each memory element of the memory elements corresponding with the word lines WL0-WL7 may be electrically disconnected from the other memory elements (e.g., memory element 581 connected to word line WL7 may be electrically disconnected from the other memory elements connected to word lines WL6-WL0). Therefore, in the case that the adjustable resistance local bit line AR_LBL 585 has been set into a non-conducting state and word line WL7 comprises a selected word line that has been set to a selected word line voltage, then the leakage currents (e.g., H-cell leakage currents) from word line WL7 to the other word lines WL6-WL0 via the memory elements connected to the adjustable resistance local bit line AR_LBL 585 may be significantly reduced or eliminated.

Referring to FIG. 6A, word lines WL0-WL7 are arranged on a first side of the vertical bit line structure and word lines WL8-WL15 are arranged on a second side of the vertical bit line structure. The word lines may comprise TiN, polysilicon, or tungsten (W). The word lines may be isolated from each other using an oxide layer not depicted that is arranged between the word line layers. A first set of memory elements including memory element 581 is arranged between the word lines WL0-WL7 and the adjustable resistance local bit line AR_LBL 585. A second set of memory elements is arranged between the word lines WL8-WL15 and the adjustable resistance local bit line AR_LBL 586. The memory element 581 may comprise a reversible resistance-switching element. As examples, the memory element 581 may include a ReRAM material, a metal oxide, nickel oxide, hafnium oxide, aluminum oxide, tantalum oxide, a phase change material, or a chalcogenide material.

In one embodiment, the word lines WL0-WL15 may extend into the page while the global bit line GBL 584 may extend horizontally from left to right. The word lines WL0-WL15 may comprise lines that extend in a first direction (e.g., the X direction) and the global bit line GBL 584 may comprise a line that extends in a second direction (e.g., the Y direction) that is orthogonal to the first direction. The vertical bit line structure may extend in a third direction (e.g., the Z direction) that is orthogonal to both the first direction and the second direction.

FIG. 6B depicts another embodiment of an adjustable resistance bit line structure. As depicted, the adjustable resistance bit line structure is similar to the adjustable resistance bit line structure depicted in FIG. 6A except that the Oxide layer 583 does not extend to and abut the N+ polysilicon layer 588. As depicted, the Oxide layer 583 does not share a common boundary with the N+ polysilicon layer 588.

In one embodiment, the resistance or the conductivity of the adjustable resistance local bit line AR_LBL 587 may be adjusted via an application of a voltage to the select gate SG 582. In one example, the adjustable resistance local bit line AR_LBL 587 may be set into a conducting state or a non-conducting state based on the voltage applied to the select gate SG 582. When the adjustable resistance local bit line AR_LBL 587 is set into a conducting state, then a low resistance path or a conducting path may be formed between the memory elements corresponding with the word lines WL0-WL15 and the global bit line GBL 584. When the adjustable resistance local bit line AR_LBL 587 is set into a non-conducting state, then a high resistance path is placed between the memory elements corresponding with the word lines WL0-WL15 and the global bit line GBL 584. In effect, the high resistance path may cause the memory elements corresponding with the word lines WL0-WL15 to be electrically disconnected from the global bit line GBL 584.

FIG. 6C depicts one embodiment of a first adjustable resistance bit line structure and a second adjustable resistance bit line structure. The first adjustable resistance bit line structure includes a select gate SG 596 and an adjustable resistance local bit line AR_LBL 598. The second adjustable resistance bit line structure includes a select gate SG 597 and an adjustable resistance local bit line AR_LBL 599. The adjustable resistance local bit line AR_LBL 598 and the adjustable resistance local bit line AR_LBL 599 are connected to the global bit line GBL 595 (e.g., via an N+ polysilicon layer).

In some embodiments, the first adjustable resistance bit line structure may comprise a first distributed FET structure and the second adjustable resistance bit line structure may comprise a second distributed FET structure. The first adjustable resistance bit line structure may be set into a conducting state by applying a first voltage to the select gate SG 596 and the second adjustable resistance bit line structure may be set into a non-conducting state by applying a second voltage different from the first voltage to the select gate SG 597. In the case that the first distributed FET structure comprises a distributed NMOS FET structure, then a positive voltage (e.g., 2V-7V) may be applied to the select gate SG 596. The positive voltage applied to the select gate SG 596 may depend on the type of memory operation being performed (e.g., a RESET operation, a SET operation, or a read operation). The positive voltage applied to the select gate SG 596 may be higher during a RESET operation compared with during a SET operation. The positive voltage applied to the select gate SG 596 may be higher during a SET operation compared with during a read operation. The second adjustable resistance bit line structure may be set into a non-conducting state by applying 0V or a negative voltage (e.g., −2V) to the select gate SG 597.

In one embodiment, the first adjustable resistance bit line structure may be connected to a first set of memory cells that includes memory elements that are connected to word lines WL0-WL4 and the second adjustable resistance bit line structure may be connected to a second set of memory cells that includes memory elements that are connected to word lines WL10-WL14. During a memory operation (e.g., a read operation, a programming operation, an erase operation, a program verify operation, or an erase verify operation), the first adjustable resistance bit line structure may be set into a conducting state such that a conducting path exists between the memory elements that are connected to word lines WL0-WL4 and the global bit line GBL 595 and the second adjustable resistance bit line structure may be set into a non-conducting state such that a conducting path does not exist between the memory elements that are connected to word lines WL10-WL14 and the global bit line GBL 595. In this case, the memory elements that are connected to word lines WL10-WL14 are electrically disconnected from the global bit line GBL 595.

FIG. 6D depicts one embodiment of an adjustable resistance bit line structure using a cross-sectional view in the global bit line direction. The adjustable resistance bit line structure depicted in FIG. 6D is one example of an implementation of the adjustable resistance bit line structure depicted in FIG. 6A. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise crystalline silicon 10 having shape of a hollow pillar.

The dielectric layer 610 may comprise an oxide layer. The select gate 618 may comprise TiN or polysilicon. An SG line 602 connects to the select gate 618. The SG line 602 may comprise TiN, polysilicon, or tungsten. In some cases, the SG line 602 may extend in the word line direction (e.g., into the page). In other cases, the SG line 602 may extend in the global bit line direction (e.g., horizontally from left to right on the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via an N+ polysilicon layer 612. The global bit line 616 may comprise TiN or tungsten. In one embodiment, FIG. 6D may depict a cross-sectional view taken along line Z-Z of FIG. 6E.

FIG. 6E depicts one embodiment of a cross-sectional view taken along line X-X of FIG. 6D. In one example, the cross-sectional view taken along line X-X of FIG. 6D may comprise a horizontal slice taken through a word line layer that includes word lines 607 and 609.

FIG. 6F depicts one embodiment of a top plan view of a portion of a memory array that includes adjustable resistance bit line structures. In some cases, the adjustable resistance bit line structures may be arranged in groups of hexagonally close-packed rows. As depicted, the word lines 607 and 609 are arranged in a first direction (e.g., extending from top to bottom of the page) and the global bit lines 616 and 617 are arranged in a second direction orthogonal to the first direction (e.g., extending from left to right on the page). The SG lines 602 and 601 are arranged in the first direction (i.e., in the word line direction). In one example, if word line 607 comprises a selected word line, then only SG line 602 may be selected, only SG line 601 may be selected, or both SG lines 602 and 601 may be selected at the same time. All other SG lines within the memory array may be deselected in order to set the adjustable resistance bit line structures not connected to the selected word line into a non-conducting state, thereby reducing leakage currents through unselected memory cells within the memory array.

In one embodiment, only one SG line within a memory array may be selected during a memory operation and the other SG lines that are not selected within the memory array may be deselected during the memory operation. In another embodiment, two or more SG lines within the memory array may be selected during a memory operation and the other SG lines that are not selected within the memory array may be deselected during the memory operation. Selecting more than one SG line at a time may relieve SG line driver pitch constraints; however, selecting a larger number of SG lines within a memory array at the same time may cause an increase in leakage currents during a memory operation.

FIG. 6G depicts another embodiment of a top plan view of a portion of a memory array that includes adjustable resistance bit line structures. As depicted, the word lines 607 and 609 are arranged in a first direction (e.g., extending from top to bottom of the page) and the global bit lines 616 and 617 are arranged in a second direction orthogonal to the first direction (e.g., extending from left to right on the page). The SG lines 592 and 593 are arranged in the second direction (i.e., in the global bit line direction). In some cases, during a memory operation on the memory array (e.g., a programming operation), only a fraction of the global bit lines may be selected. In one example, during a programming operation, only 8 or 16 global bit lines out of 1024 global bit lines may be selected. In this case, only the SG lines corresponding with the selected global bit lines may be selected while all other SG lines within the memory array may be deselected. In some cases, H-cell leakage currents may be substantially reduced or eliminated by setting adjustable resistance bit line structures connected to selected word lines and unselected global bit lines into non-conducting states.

In some embodiments, the SG lines within a memory array may be arranged such that they extend in the word line direction, in the global bit line direction, or at an angle relative to the word line direction (e.g., diagonal SG lines that are at a 45 degree angle from the word line direction or at a 25 degree angle from the word line direction).

FIG. 6H depicts one embodiment of an adjustable resistance bit line structure with an integrated bottom resistor. The integrated bottom resistor may improve memory cell reliability, reduce the etch depth for the memory hole in which the adjustable resistance bit line structure may be formed, and reduce the aspect ratio for the memory hole. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise crystalline silicon.

The dielectric layer 610 may comprise an oxide layer. The select gate 618 may comprise TiN or polysilicon. An SG line 602 connects to the select gate 618. The SG line 602 may comprise TiN, polysilicon, or tungsten. In some cases, the SG line 602 may extend in the word line direction (e.g., into the page). In other cases, the SG line 602 may extend in the global bit line direction (e.g., horizontally from left to right on the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via an integrated bottom resistor comprising an N+ polysilicon layer 652, an N− polysilicon layer 653, and an N+ polysilicon layer 654. The N− polysilicon layer 653 may comprise lightly doped polysilicon (e.g., with a carrier concentration of about 10^18 carriers/cm^3 at 25 C or room temperature). The global bit line 616 may comprise TiN or tungsten. In one embodiment, the spacing between word lines (e.g., the spacing between word lines 606 and 607) may comprise 20 nm and the spacing between the top of the global bit line 616 and the top of the N+ polysilicon layer 652 may comprise 150 nm or 200 nm. One benefit of using the adjustable resistance bit line structure depicted in FIG. 6H is that the etch depth for etching memory holes may be reduced. Another benefit of using the adjustable resistance bit line structure depicted in FIG. 6H is that memory cell reliability may be improved as the integrated resistor may reduce voltage stress across memory cells connected to the adjustable resistance local bit line.

FIG. 6I depicts an alternative embodiment of a first adjustable resistance bit line structure and a second adjustable resistance bit line structure. The first adjustable resistance bit line structure includes a select gate SG 596 and an adjustable resistance local bit line AR_LBL 598. The second adjustable resistance bit line structure includes a select gate SG 597 and an adjustable resistance local bit line AR_LBL 599. The adjustable resistance local bit line AR_LBL 598 and the adjustable resistance local bit line AR_LBL 599 are connected to the global bit line GBL 595 (e.g., via an N+ polysilicon layer). The select gate SG 596 connects to a select gate line SGL 193 via a vertical TFT that is controlled by CSG 191. The select gate SG 597 connects to a select gate line SGL 194 via a vertical TFT that is controlled by CSG 192.

In some embodiments, the first adjustable resistance bit line structure may comprise a first distributed NMOS FET structure and the second adjustable resistance bit line structure may comprise a second distributed NMOS FET structure. The first adjustable resistance bit line structure may be set into a conducting state by applying a first voltage to the select gate SG 596 and the second adjustable resistance bit line structure may be set into a non-conducting state by applying a second voltage different from the first voltage to the select gate SG 597. In one example, the first voltage may be applied to the select gate SG 596 by enabling the vertical TFT controlled by CSG 191 to electrically connect the select gate line SGL 193 to the select gate SG 596. The second voltage may be applied to the select gate SG 597 by enabling the vertical TFT controlled by CSG 192 to electrically connect the select gate line SGL 194 to the select gate SG 597. In some cases, a transistor (e.g., an NMOS device, a PMOS device, or a JFET device) may be used to selectively connect a select gate line, such as select gate line SGL 194, to a select gate, such as select gate SG 597. In some cases, the select gate line SGL 194 may set the select gate SG 597 to ground or a negative voltage prior to the first voltage being applied to the select gate SG 596.

In some embodiments, the select gate SG 597 may be precharged to ground prior applying a selected select gate voltage (e.g., 4V) to the select gate SG 596. In some embodiments, all select gates within a memory array may be set to ground (i.e., 0V) prior to applying a selected select gate voltage (e.g., 4V) to the select gate SG 596. In some embodiments, select gates associated with a plurality of adjustable resistance bit line structures (e.g., adjustable resistance bit line structures to be set into a non-conducting state) that each connect to a particular word line (e.g., a word line to be selected) may be precharged to 0V prior to setting a select gate associated with an adjustable resistance bit line structure (e.g., an adjustable resistance bit line structure to be set into a conducting state) that connects to the particular word line to a selected select gate voltage (e.g., 5V). In this case, as the plurality of adjustable resistance bit line structures that each connect to a particular word line (e.g., a selected word line) have been set into non-conducting states, H-cell leakage currents from the particular word line when the particular word line is selected may be significantly reduced or eliminated.

In one embodiment, the adjustable resistance local bit line AR_LBL 598 may be connected to a first set of memory cells that includes memory elements that are connected to word lines WL0-WL4 and the adjustable resistance local bit line AR_LBL 599 may be connected to a second set of memory cells that includes memory elements that are connected to word lines WL10-WL14. During a memory operation (e.g., a read operation, a programming operation, an erase operation, a program verify operation, or an erase verify operation), the adjustable resistance local bit line AR_LBL 598 may be set into a conducting state such that a conducting path exists between the memory elements that are connected to word lines WL0-WL4 and the global bit line GBL 595 and the adjustable resistance local bit line AR_LBL 599 may be set into a non-conducting state such that a conducting path does not exist between the memory elements that are connected to word lines WL10-WL14 and the global bit line GBL 595. In this case, the memory elements that are connected to word lines WL10-WL14 are electrically disconnected from the global bit line GBL 595. The adjustable resistance local bit line AR_LBL 599 may be set into a non-conducting state by precharging the select gate SG 597 to 0V prior to setting the adjustable resistance local bit line AR_LBL 598 into a conducting state.

FIG. 6J depicts one embodiment of an adjustable resistance bit line structure using a cross-sectional view in the global bit line direction. The adjustable resistance bit line structure depicted in FIG. 6J is one example of an implementation of the adjustable resistance bit line structure depicted in FIG. 6A. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise crystalline silicon.

The dielectric layer 610 may comprise an oxide layer. The select gate 618 may comprise TiN or polysilicon. An SG line 602 connects to a drain of a vertical TFT formed using P− polysilicon layer 603. The source of the vertical TFT is connected to the select gate 618. The vertical TFT may comprise an NMOS transistor. In some cases, the vertical TFT formed using P− polysilicon layer 603 may use a thinner dielectric layer than the dielectric layer 610 (e.g., a gate oxide for the vertical TFT may be thinner than the dielectric layer 610). The SG line 602 may comprise TiN, polysilicon, or tungsten. In some cases, the SG line 602 may extend in the word line direction (e.g., into the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via an N+ polysilicon layer 612. The global bit line 616 may comprise TiN or tungsten. In one embodiment, FIG. 6J may depict a cross-sectional view taken along line Z-Z of FIG. 6K.

FIG. 6K depicts one embodiment of a cross-sectional view taken along line X-X of FIG. 6J. In one example, the cross-sectional view taken along line X-X of FIG. 6J may comprise a horizontal slice taken through a word line layer that includes word lines 607 and 609.

FIG. 6L depicts one embodiment of a side view of the adjustable resistance bit line structure depicted in FIG. 6J. As depicted, a gate control line 605 for controlling the gate of the vertical TFT formed using P− polysilicon layer 603 extends in the global bit line direction. The gate control line 605 may comprise TiN or tungsten. The vertical TFT may comprise an NMOS device. In some cases, the vertical TFT may comprise a JFET. In one example, the dielectric layer 610 may comprise an oxide layer that is used as the gate oxide for the vertical TFT. In another example, the gate dielectric for the vertical TFT may be thinner than the dielectric layer 610 used as the gate dielectric for the vertical select gate.

FIG. 6M depicts one embodiment of a cross-sectional view taken along line X-X of FIG. 6L. In one example, the cross-sectional view taken along line X-X of FIG. 6L may comprise a horizontal slice taken through the vertical TFT at the gate control line layer. In some cases, each vertical TFT positioned above each select gate may include a wrap-around gate. The wrap-around gates for each vertical TFT may be separated from each other using a dielectric layer or an oxide layer.

FIG. 6N depicts one embodiment of the adjustable resistance bit line structure depicted in FIG. 6J using a cross-sectional view in the word line direction. The adjustable resistance bit line structure depicted in FIG. 6N is one example of an implementation of the adjustable resistance bit line structure depicted in FIG. 6A. As depicted, the SG line 602 extends in the word line direction along with word lines 606, 607, and 608. The global bit line 616 extends in the global bit line direction (e.g., into the page). The gate control line 605 for controlling the gate of the vertical TFT may also extend in the global bit line direction.

FIG. 6O depicts one embodiment of a cross-sectional view taken along line X-X of FIG. 6N. In one example, the cross-sectional view taken along line X-X of FIG. 6N may comprise a horizontal slice taken through a word line layer that includes word line 607 and word line 609. Word line 609 may comprise a word line that is in the same word line layer as word line 607 and adjacent to word line 607.

FIG. 6P depicts one embodiment of an adjustable resistance bit line structure. The adjustable resistance bit line structure depicted in FIG. 6P is one example of an implementation of the adjustable resistance bit line structure depicted in FIG. 6A. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise crystalline silicon 10 having a hollow pillar shape.

The dielectric layer 610 may comprise an oxide layer. The select gate 618 may comprise TiN or polysilicon. An SG line 602 connects to a drain of a vertical TFT formed using P− polysilicon layer 603 and dielectric layer 611. Dielectric layer 611 may be thinner than dielectric layer 610. Dielectric layer 611 may comprise an oxide layer. The source of the vertical TFT is connected to the select gate 618. The vertical TFT may comprise an NMOS transistor. In some cases, the vertical TFT may comprise a JFET. The gate of the vertical TFT may be controlled by gate control line 605 that extends in the global bit line direction. The gate control line 605 may comprise TiN or tungsten.

The SG line 602 may comprise TiN, polysilicon, or tungsten. In some cases, the SG line 602 may extend in the word line direction (e.g., into the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via N+ polysilicon layer 612. The global bit line 616 may comprise TiN or tungsten. In one embodiment, the spacing between word line layers (e.g., the spacing between word lines 606 and 607) may comprise 20 nm and the spacing between the top of the global bit line 616 and the bottom of the word line layer that includes word line 608 may comprise 150 nm or 200 nm.

In some embodiments, the distance 613 between the lowest word line layer and the top of the N+ polysilicon layer 612 may be set in order to provide a particular resistance value or to provide a particular voltage drop during a memory operation (e.g., during a programming operation such as a SET or RESET operation). In some cases, the lowest word line layer that includes word line 608 may comprise a dummy word line layer. In some cases, the distance 613 between the lowest word line layer and the top of the N+ polysilicon layer 612 may be more than ten times the spacing between word line layers (e.g., the spacing between the word line layer that includes word line 606 and the word line layer that includes word line 607).

FIG. 6Q depicts one embodiment of an adjustable resistance bit line structure. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise crystalline silicon.

The dielectric layer 610 may comprise an oxide layer. The select gate 618 may comprise TiN or polysilicon. An SG line 602 connects to a drain of a vertical TFT formed using P− polysilicon layer 603. The source of the vertical TFT is connected to the select gate 618. The vertical TFT may comprise an NMOS transistor. In some cases, the vertical TFT may comprise a JFET. The SG line 602 may comprise TiN, polysilicon, or tungsten. In some cases, the SG line 602 may extend in the word line direction (e.g., into the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via an integrated bottom resistor comprising an N+ polysilicon layer 652, an N− polysilicon layer 653, and an N+ polysilicon layer 654. The global bit line 616 may comprise TiN or tungsten. In one embodiment, the spacing between word lines (e.g., the spacing between word lines 606 and 607) may comprise 20 nm and the spacing between the top of the global bit line 616 and the top of the N+ polysilicon layer 652 may comprise 150 nm, 200 nm, or 300 nm.

As depicted in FIG. 6Q, the ReRAM layer 614 does not extend to the global bit line 616. Instead, an oxide layer not depicted may exist between the ReRAM layer 614 and the global bit line 616. One benefit of using the adjustable resistance bit line structure depicted in FIG. 6Q is that the etch depth for etching a memory hole in which the adjustable resistance bit line structure may be formed may be reduced.

Another benefit of using the adjustable resistance bit line structure depicted in FIG. 6Q is that memory cell reliability may be improved as the integrated resistor may reduce voltage stress across memory cells connected to the adjustable resistance local bit line.

In one embodiment, the height (or the thickness) of the N− polysilicon layer 653 may be adjusted or set in order to provide a particular resistance value or to provide a particular voltage drop across the integrated resistor during a memory operation (e.g., during a programming operation). The lowest word line layer that includes word line 608 may comprise a dummy word line layer.

FIG. 6R depicts one embodiment of an adjustable resistance bit line structure. The adjustable resistance bit line structure may connect to a global bit line, such as global bit line 628, near the top of the adjustable resistance bit line structure or above the highest word line layer. One benefit of making the connection to the global bit line near the top of the adjustable resistance bit line structure is that the ReRAM layer 614 may not need to be etched and the adjustable resistance bit line structure may be formed using a more reliable ReRAM material.

As depicted, the adjustable resistance bit line structure includes a select gate 618 and a dielectric layer 610 arranged between the select gate 618 and an adjustable resistance local bit line 604. The adjustable resistance local bit line 604 may comprise crystalline silicon 10 having a hollow pillar shape. The dielectric layer 610 may comprise an oxide layer. The select gate 618 may comprise TiN or polysilicon. An SG line 602 connects to a drain of a vertical TFT formed using P− polysilicon layer 603 and dielectric layer 610. The source of the vertical TFT is connected to the select gate 618. The vertical TFT may comprise an NMOS transistor. In some cases, the vertical TFT formed using P− polysilicon layer 603 may use a thinner dielectric layer than the dielectric layer 610 (e.g., a gate oxide for the vertical TFT may be thinner than the dielectric layer 610). The gate of the vertical TFT may be controlled by gate control line 605 that extends in the global bit line direction. The gate control line 605 may comprise TiN or tungsten. A ReRAM layer 614 is arranged between the word lines 607-609 and the adjustable resistance local bit line 604. The ReRAM layer 614 may comprise a phase change material, a ferroelectric material, or a metal oxide such as nickel oxide or hafnium oxide. The base layer 626 may comprise a portion of a silicon substrate, a layer of polysilicon, or an oxide layer.

The adjustable resistance local bit line 604 may connect to the global bit line 628 via an N+ polysilicon layer 624. The N+ polysilicon layer 624 may be formed on top of the adjustable resistance local bit line 604 or positioned above the highest word line layer. The global bit line 628 may comprise TiN or tungsten. Thus, an adjustable resistance local bit line (e.g., a vertical bit line that comprises crystalline silicon) may connect to a global bit line that is positioned below the adjustable resistance local bit line or may connect to a global bit line that is positioned above the adjustable resistance local bit line.

FIG. 6S depicts one embodiment of a cross-sectional view taken along line X-X of FIG. 6R. In one example, the cross-sectional view taken along line X-X of FIG. 6R may comprise a horizontal slice taken through a global bit line layer that includes global bit line 628.

FIG. 6T depicts one embodiment of the adjustable resistance bit line structure depicted in FIG. 6R using a cross-sectional view in the word line direction. As depicted, the SG line 602 extends in the word line direction along with word lines 607 and 608. The global bit line 628 extends in the global bit line direction (e.g., into the page). The gate control line 605 for controlling the gate of the vertical TFT may also extend in the global bit line direction.

FIG. 6U depicts one embodiment of a cross-sectional view taken along line X-X of FIG. 6T. In one example, the cross-sectional view taken along line X-X of FIG. 6T may comprise a horizontal slice taken through a word line layer that includes word line 607 and word line 609. Word line 609 may comprise a word line that is in the same word line layer as word line 607 and adjacent to word line 607.

FIG. 6V depicts one embodiment of an adjustable resistance bit line structure. The adjustable resistance bit line structure may connect to a global bit line, such as global bit line 628, near the top of the adjustable resistance bit line structure or above the highest word line layer. One benefit of making the connection to the global bit line near the top of the adjustable resistance bit line structure is that the ReRAM layer 614 may not need to be etched at the bottom of the adjustable resistance bit line structure (e.g., in order to connect an adjustable resistance local bit line to a global bit line located at the bottom of the adjustable resistance local bit line). As depicted, the SG line 602 directly connects to the select gate 618. Thus, in some cases, an SG line may directly connect to or abut a select gate. In other cases, an SG line may selectively connect to the select gate via a vertical TFT or other transistor. One benefit of not using a vertical TFT to selectively connect the SG line to the select gate is that process complexity and manufacturing costs may be reduced.

Figure 7A:
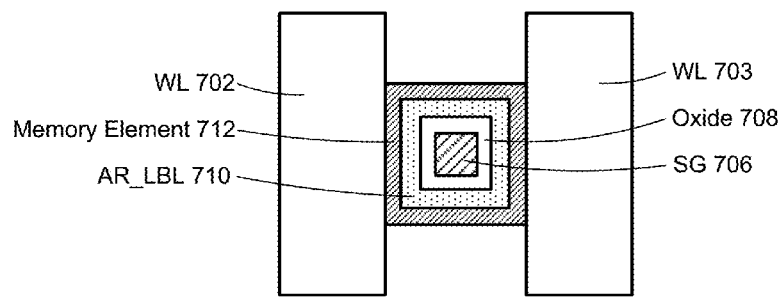
FIGS. 7A-7B depict one embodiment of an adjustable resistance bit line structure within a memory array in which the crystalline bit line has a prismatic shape.

FIG. 7A depicts one embodiment of a top plan view of an adjustable resistance bit line structure. In this embodiment, the crystalline silicon pillar has a prismatic shape. The adjustable resistance bit line structure may be formed using a vertical pillar that includes a select gate SG 706 that is surrounded by an oxide layer Oxide 708 that is surrounded by an adjustable resistance local bit line AR_LBL 710 that is surrounded by a memory element layer 712. A first side of the vertical pillar may contact a first word line WL 702 and a second side of the vertical pillar may contact a second word line WL 703. In some cases, the word line spacing between word line WL 702 and word line WL 703 may comprise 48 nm or 24 nm.

Select gate SG 706 is one embodiment of select gate 14 of memory structure 60. Oxide 708 is one embodiment of dielectric layer 12 of memory structure 60. Adjustable resistance local bit line AR_LBL 710 is one embodiment of crystalline silicon 10 of memory structure 60. Memory element layer 712 is one embodiment of reversible resistivity material 8 of memory structure 60. WL 702 and word line WL 703 are embodiments of word lines of memory structure 60. Note that in contrast, to the cylindrical shape in FIGS. 1A-1B, various regions have a prismatic shape in FIGS. 7A-7B.

Figure 7B:
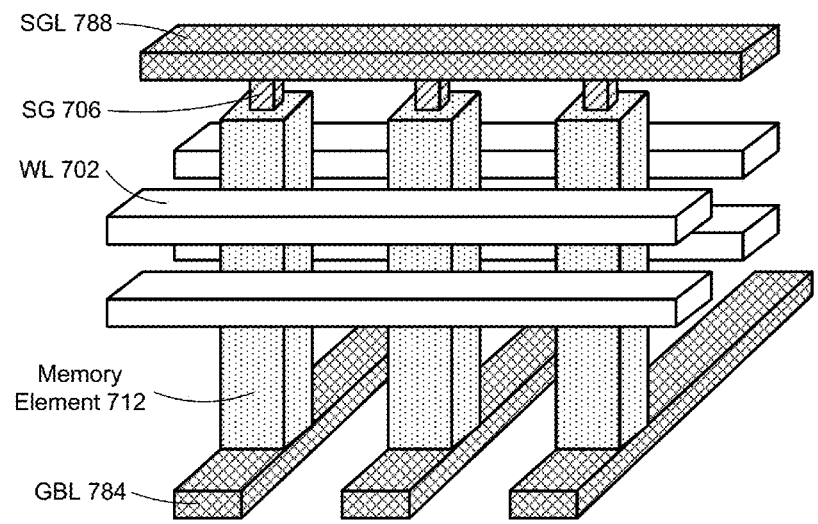

FIG. 7B depicts one embodiment of a perspective view of a portion of the adjustable resistance bit line structure depicted in FIG. 7A. As depicted, a single vertical pillar structure may include the select gate SG 706 with the adjustable resistance local bit line AR_LBL 710 surrounding the select gate SG 706. The adjustable resistance local bit line AR_LBL 710 is not depicted in FIG. 7B, as it is surrounded by memory element 712. Also, the oxide 708 is not depicted in FIG. 7B. The select gate SG 706 may extend through the center of the vertical pillar and may be isolated from or separated from the adjustable resistance local bit line AR_LBL 710 by an oxide layer or a dielectric layer not depicted. The SG line SGL 788 extends in the word line direction along with word line WL 702. The SG line SGL 788 may contact the select gate SG 706 directly or connect to the select gate SG 706 via an N+ polysilicon layer not depicted. In some embodiments, the SG line SGL 788 may selectively connect to the select gate SG 706 via a vertical TFT. The adjustable resistance local bit line AR_LBL 710 may connect to the global bit line GBL 784 via an N+ polysilicon layer not depicted. In some embodiments, the adjustable resistance local bit line AR_LBL 710 may selectively connect to the global bit line GBL 784 via a vertical TFT.

In one embodiment, the crystalline silicon AR_LBL 710 predominantly a (100) orientation with respect to the inner surface of the reversible resistivity material of the memory element 712. In one embodiment, the crystalline silicon AR_LBL 710 is a single crystal of silicon. The silicon crystal may have a (100) orientation with respect to the inner surface of the reversible resistivity material of the memory element 712, but that is not required. In one embodiment, the crystalline silicon AR_LBL 710 is grains of polysilicon with predominantly all of the grains having the (100) orientation with respect to the inner surface of the reversible resistivity material of the memory element 712. For both the single crystal silicon and the large grain polysilicon cases, the crystalline orientation may be favorable for high carrier mobility.

In one embodiment, the crystalline silicon AR_LBL 710 has predominantly a (100) orientation with respect to the outer surface of the oxide 708. The crystalline silicon AR_LBL 710 may have a (100) orientation with respect to the outer surface of the oxide 708, but that is not required. In one embodiment, the crystalline silicon AR_LBL 710 is grains of polysilicon with predominantly all of the grains having the (100) orientation with respect to the outer surface of the oxide 708.

Figure 8:
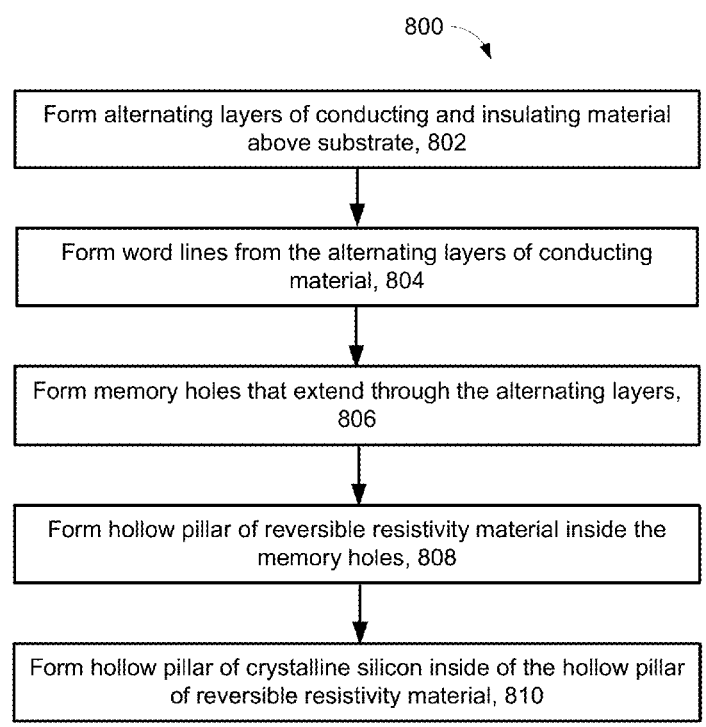
FIG. 8 is a flowchart of one embodiment of a process of fabricating reversible resistivity memory having a crystalline silicon bit line.
Figures 9A, 9C:
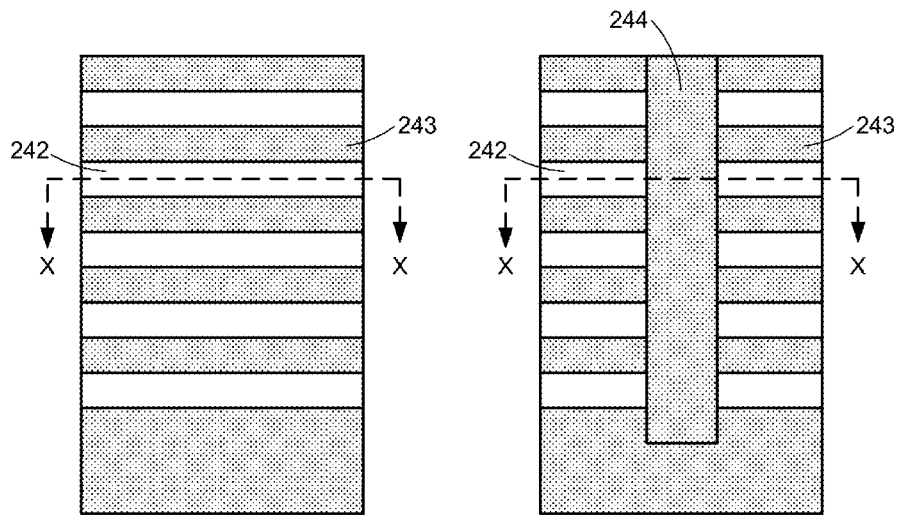
FIGS. 9A-9P depict results after embodiments of the process of FIG. 8.

FIG. 8 is a flowchart of one embodiment of a process 800 of fabricating a reversible resistivity memory structure having a crystalline silicon bit line. Process 800 may be used to fabricate various reversible resistivity memory structures disclosed herein. Not all process steps are depicted. The crystalline silicon bit line has a hollow pillar shape, in some embodiments. FIGS. 9A-9P depict various embodiments of cross-sectional views related to processes for fabricating a portion of an adjustable resistance bit line structure.

Figures 9B, 9D:
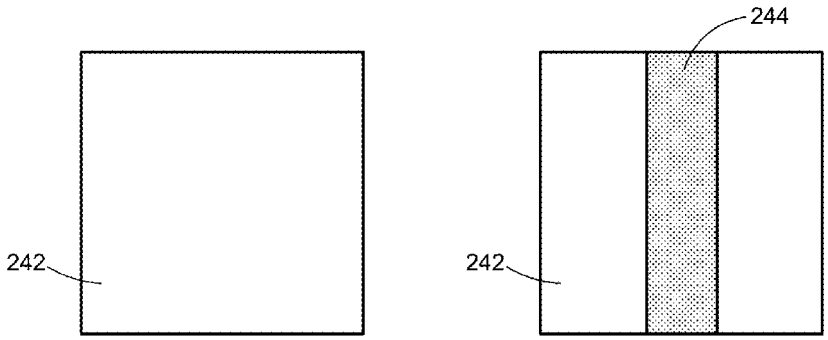

Step 802 includes forming alternating layers of conducting and insulating material above a substrate. The layers extend horizontally with respect to a major surface of the substrate on which the layers are formed, in one embodiment. The substrate is a silicon substrate, in one embodiment. The conducting material could be TiN, polysilicon, etc. The insulating material could be silicon oxide, but is not limited thereto. FIGS. 9A and 9B depict results after one embodiment of step 802. As depicted in FIGS. 9A-9B, an alternating stack of word line layers and dielectric layers, such as word line layer 242 and dielectric layer 243, have been formed over a substrate. FIG. 9B depicts one embodiment of a cross-sectional view taken along line X-X of FIG. 9A. The word line layer 242 may comprise TiN, polysilicon, or tungsten (W). The dielectric layer 243 may comprise an oxide layer.

Step 804 includes forming word lines from the alternating layers of conducting material. FIGS. 9C and 9D depict results after one embodiment of step 804. As depicted in FIGS. 9C-9D, a trench that was etched extending through a plurality of word line layers and dielectric layers has been filled with oxide in order to form an oxide partition 244 that extends through the plurality of word line layers and dielectric layers. FIG. 9D depicts one embodiment of a cross-sectional view taken along line X-X of FIG. 9C.

Step 806 includes forming memory holes that extend through the alternating layers conducting and insulating material. The memory holes extend in a vertical direction with respect to the alternating layers of conducting and insulating material, in one embodiment. FIGS. 9E and 9F depict results after one embodiment of step 806. FIG. 9F depicts one embodiment of a cross-sectional view taken along line X-X of FIG. 9E.

As depicted in FIGS. 9E-9F, a memory hole 246 has been etched extending through a plurality of word line layers and a plurality of dielectric layers. In some embodiments, a plurality of memory holes may be formed by etching through an alternating stack of word line layers and dielectric layers (e.g., etching through layers of TiN or polysilicon that are separated by oxide layers) to form the plurality of memory holes. The plurality of memory holes may comprise prismatic, cylindrical, or some other shape holes. The plurality of memory holes may be formed by patterning and then removing material using various etching techniques such as dry etching, wet chemical etching, plasma etching, or reactive-ion etching (RIE). In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist.

Step 808 includes forming a hollow pillar of reversible resistivity material inside each of the memory holes. The hollow pillar of reversible resistivity material is formed by depositing reversible resistivity material, in one embodiment. The reversible resistivity material may be deposited within the memory hole 246 using various deposition techniques such as chemical vapor deposition (CVD), physical vapor deposition (PVD), or atomic layer deposition (ALD). The reversible resistivity material may comprise a phase change material, a ferroelectric material, or a metal oxide such as nickel oxide or hafnium oxide.

Step 810 includes forming a hollow pillar of crystalline silicon inside each of the hollow pillars of reversible resistivity material. In one embodiment, the hollow pillar of crystalline silicon is formed using a metal induced crystallization (MIC) process. Further details of embodiments of MIC are discussed below. FIGS. 9G and 9H depict results after one embodiment of step 810. FIG. 9H depicts one embodiment of a cross-sectional view taken along line X-X of FIG. 9G. The memory element layer 247 is one embodiment of reversible resistivity material 8. The crystalline silicon region 248 is one embodiment of a hollow pillar of crystalline silicon 10.

As depicted in FIGS. 9G-9H, a memory element layer 247 (e.g., comprising a ReRAM material) and a crystalline silicon region 248 have been formed within the memory hole 246. In one embodiment, the memory element layer 247 may comprise a conformal layer of memory element material surrounding the sides of the memory hole 246 and the crystalline silicon region 248 may comprise a conformal layer of crystalline silicon that has been formed on a surface of the conformal layer of memory element material. The conformal layer of crystalline silicon may have a thickness (or width) of, for example, 10 nm to 20 nm. As depicted, a narrow hole 241 has been formed such that the crystalline silicon 248 surrounds the narrow hole 241 in two dimensions. In one example, the memory element layer 247 may be formed within the memory hole 246 and the crystalline silicon region 248 may be formed over the memory element layer 247.

Figure 9I:
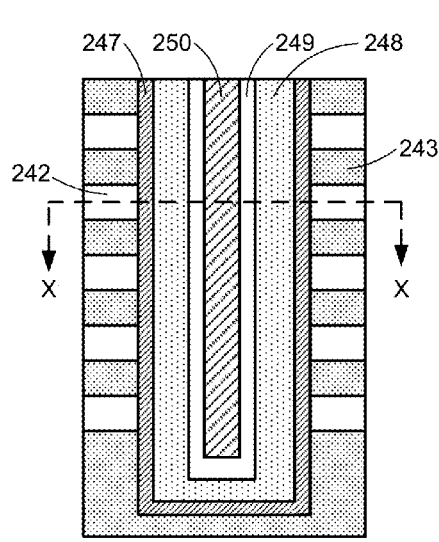
Figure 9K:
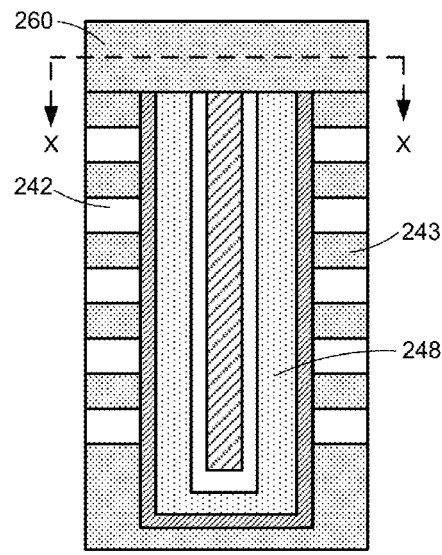
Figure 9J:
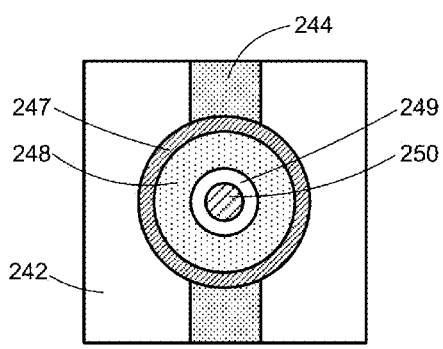

After step 810, other steps may be performed such as forming the dielectric layer 12, and the select gate 14. FIGS. 9I and 9J depict results after forming a dielectric layer 249 and a select gate region 250. FIG. 9J depicts one embodiment of a cross-sectional view taken along line X-X of FIG. 9I. Dielectric layer 249 is one embodiment of dielectric layer 12. Select gate region 250 is one embodiment of select gate 14. As depicted in FIGS. 9I-9J, a dielectric layer 249 and a select gate region 250 have been formed within the narrow hole 241. In one embodiment, the dielectric layer 249 may comprise a conformal layer of silicon dioxide coating an inside surface of the crystalline silicon region 248. In some embodiments, the dielectric layer 249 and the select gate region 250 may be formed within the narrow hole 241 by depositing the dielectric layer 249 and the select gate region 250 using various deposition techniques such as chemical vapor deposition (CVD), physical vapor deposition (PVD), or atomic layer deposition (ALD). The select gate region 250 may comprise TiN or polysilicon. The dielectric layer 249 may comprise an oxide, silicon dioxide, silicon nitride, or a high-k dielectric material. In some cases, the dielectric layer 249 may have a thickness (or width) of 5 nm to 10 nm.

Figure 9L:
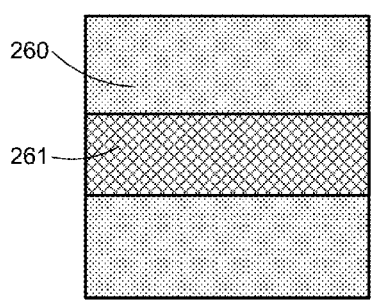

Afterwards, still other steps may be performed to form global bit lines, etc. As depicted in FIGS. 9K-9L, an oxide layer 260 and a global bit line 261 have been formed above the select gate region 250. FIG. 9L depicts one embodiment of a cross-sectional view taken along line X-X of FIG. 9K. The global bit line 261 may comprise TiN or tungsten. As depicted in FIGS. 9M-9N, a top pillar hole 262 has been etched above the select gate region 250. FIG. 9N depicts one embodiment of a cross-sectional view taken along line X-X of FIG. 9M. As depicted in FIGS. 9O-9P, N+ polysilicon region 266, N+ polysilicon region 265, and oxide region 264 may be formed within the top pillar hole 262. FIG. 9P depicts one embodiment of a cross-sectional view taken along line X-X of FIG. 9O. The N+ polysilicon region 266 may provide an electrical connection from the crystalline silicon region 248 to the global bit line 261. In one embodiment, a layer of N+ polysilicon may be deposited within the top pillar hole 262, etched, and then filled with oxide in order to form the oxide region 264, the N+ polysilicon region 266, and the N+ polysilicon region 265. In another embodiment, the N+ polysilicon region 266 may comprise a conformal layer of N+ polysilicon surrounding the sides of the top pillar hole 262 and the oxide region 264 may comprise a conformal layer of silicon dioxide that has been deposited on a surface of the conformal layer of N+ polysilicon.

In some embodiments, a distributed NMOS FET structure may be formed by using an N+ polysilicon region, such as N+ polysilicon region 266, directly connected to the crystalline silicon region 248. In other embodiments, a distributed PMOS FET structure may be formed by using a P+ polysilicon region in place of the N+ polysilicon region 266.

Figure 10:
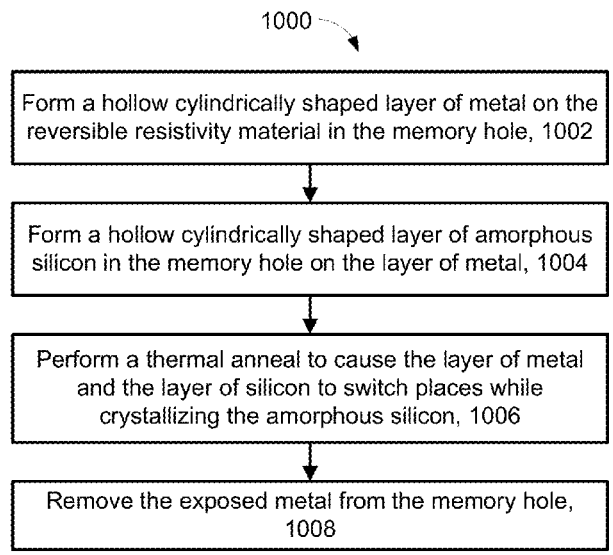
FIG. 10 is a flowchart of one embodiment of a process of forming a hollow pillar of crystalline silicon inside each hollow pillar of reversible resistivity material.
Figure 11B:
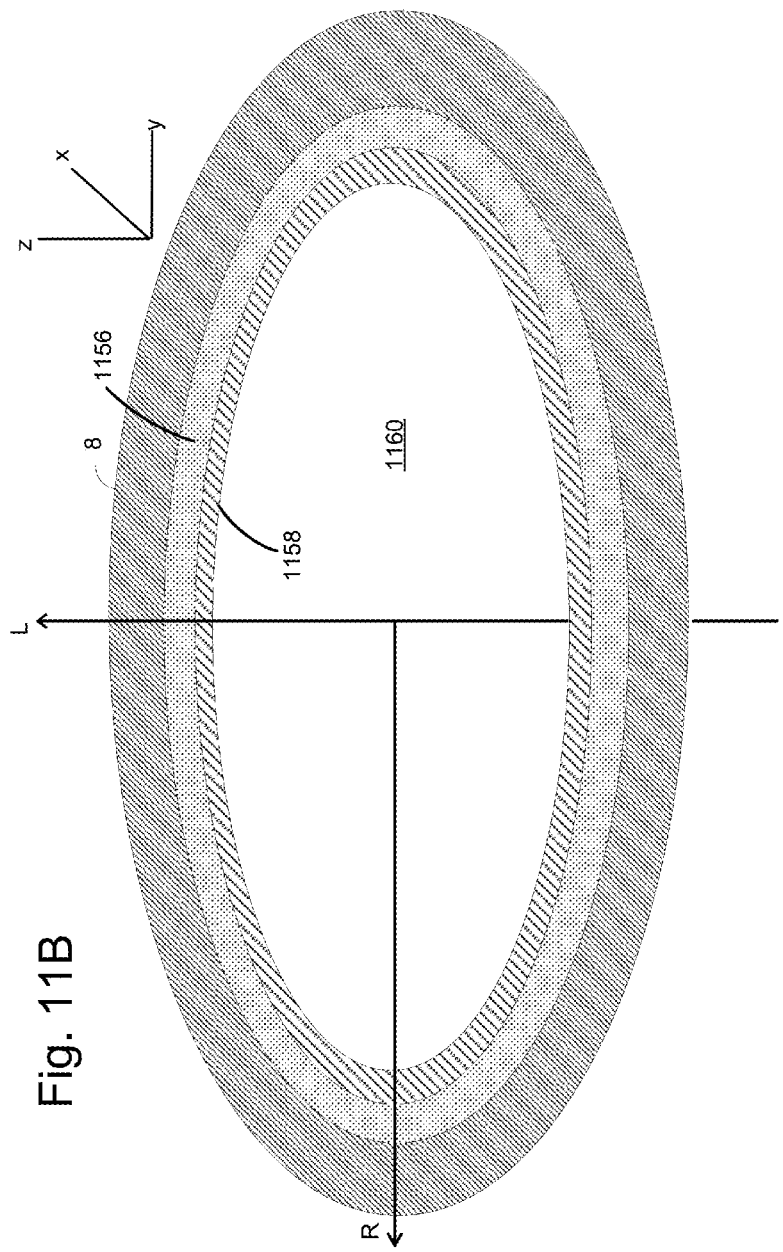

FIG. 10 is a flowchart of one embodiment of a process 1000 of forming a hollow pillar of crystalline silicon 10 inside a hollow pillar of reversible resistivity material 8. Process 1000 is one embodiment of step 810 of process 800. Process 1000 describes one embodiment of a MIC process to form a hollow pillar of crystalline silicon 10. Thus, process 1000 may begin after step 808 in which a hollow pillar of reversible resistivity material 8 is formed. FIGS. 11A-11C depict results after various steps of one embodiment of process 1000. In FIGS. 11A-11C, the hollow pillars have a cylindrical shape. Process 1000 can also be used to form hollow pillars having a prismatic shape. Process 1000 can also be used to form hollow pillars having shapes other than cylindrical or prismatic.

Step 1002 includes forming a layer of metal on the reversible resistivity material 8 within the memory hole. This layer of metal is in direct physical contact with the reversible resistivity material 8 in one embodiment. In another embodiment, at least one other layer of material is between the layer of metal and the reversible resistivity material 8. Thus, the phrase, "a first material is formed on a second material" or the like does not require direct physical contact between the first and second materials. This layer of metal has a hollow pillar shape, in one embodiment.

In one embodiment, the metal has a thickness of between 3 to 5 nanometers. The metal could have a thickness that is less than 3 nanometers or greater than 5 nanometers. Example metals include, but are not limited to, aluminum, nickel, silver, gold, platinum, and palladium. A metal may be selected that is "friendly" with the reversible resistivity material 8. By being "friendly" with the reversible resistivity material 8 it is meant that the metal enhances, or at least does not degrade, the performance of the reversible resistivity memory cell. In one embodiment, the reversible resistivity material 8 is hafnium oxide. Aluminum, nickel, silver, gold, platinum, palladium may each enhance, or at least do not degrade, performance of a hafnium oxide reversible resistivity material 8.

Step 1004 includes forming a layer of amorphous silicon within the memory hole on the layer of metal. This layer of layer of amorphous silicon is in direct physical contact with the layer of metal in one embodiment. This layer of amorphous silicon has a hollow pillar shape, in one embodiment. In one embodiment, the amorphous silicon has a thickness of between 5 to 10 nanometers. The amorphous silicon could have a thickness that is less than 5 nanometers or greater than 10 nanometers. FIG. 11A is a diagram to illustrate various layers after step 1004. The diagram represents a cross sectional slice in the x-y plane. An R-axis is depicted, along with an L-axis, consistent with FIGS. 1C-1E. The reversible resistivity material 8, a first layer of metal 1152, and a first layer of amorphous silicon 1154 are depicted. Note that the first layer of metal 1152 is between the reversible resistivity material 8 and the amorphous silicon layer 1154. The cross-sectional diagram depicts the various regions 8, 1152, and 1154 as rings. However, note that each region 8, 1152, and 1154 is a hollow pillar that extends in the direction of the L-axis. Also note that the region 1160 inside of the first layer of amorphous silicon 1154 is the presently empty portion of the memory hole.

Step 1006 includes performing a thermal anneal which causes a switch in location of the metal and the silicon from the first layer of amorphous silicon, as well as in crystallizing silicon from the first layer of amorphous silicon. In one embodiment, the thermal anneal is performed at between about 350 to 400 Celsius. However, the thermal anneal may be performed at lower or higher temperatures. In one embodiment, the thermal anneal is performed while flowing nitrogen gas at a flow rate of 10-50 sccm. In one embodiment, the thermal anneal is an isothermal anneal in an argon ambient at 350 to 400 Celsius for 5 to 10 minutes. The foregoing process parameters are examples; it will be understood other parameters can be used for the thermal anneal.

FIG. 11B is a diagram to illustrate results after step 1006. A layer of crystalline silicon 1156 is shown next to the reversible resistivity material 8. A metal layer 1158 is depicted on the crystalline silicon 1156. The metal layer 1158 is exposed to the interior 1160 of the memory hole. Note that the crystalline silicon 1156 is between reversible resistivity material 8 and the exposed region of metal 1158.

Referring to FIGS. 11A and 11B, the thermal anneal has caused metal from the first metal layer 1152 to move (or diffuse) towards the interior of the memory hole 1160 such that it now forms exposed metal region 1158. Also, silicon from the amorphous silicon layer 1154 has moved to region 1156. Thus, the metal and the silicon have switched places. However, some of the metal may remain within the crystalline silicon 1156. Typically, only a small portion of the metal remains within the crystalline silicon 1156. Also note that the metal (e.g., metal atoms) may act as a dopant within the crystalline silicon 1156. Additionally, the silicon is no longer amorphous silicon, but is now crystalline silicon. However, the silicon is not necessarily a single crystal of silicon throughout.

Step 1008 includes removing the exposed metal from the memory hole. This leaves the crystalline silicon 1156 in the memory hole. Step 1008 may include performing a wet etch (e.g., HCL:$H_2O_2$:$H_2O$) to remove the exposed metal. FIG. 11C depicts results after step 1008. The MIC process may conclude after steps 1002-1008 have been performed once. Thus, the process may conclude after one round of the MIC process. Thus, region 1156 in FIG. 11C is the crystalline silicon bit line, in one embodiment. Note that the crystalline silicon bit line may have a hollow pillar shape.

Figure 12A:
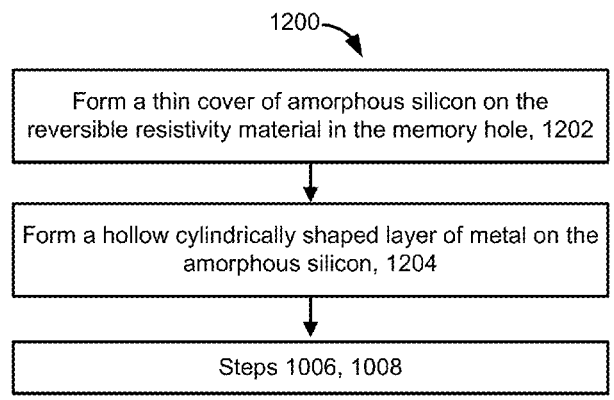
FIG. 12A is a flowchart of one embodiment of a process in which a protective cover layer is used in a MIC process.
Figure 12B:
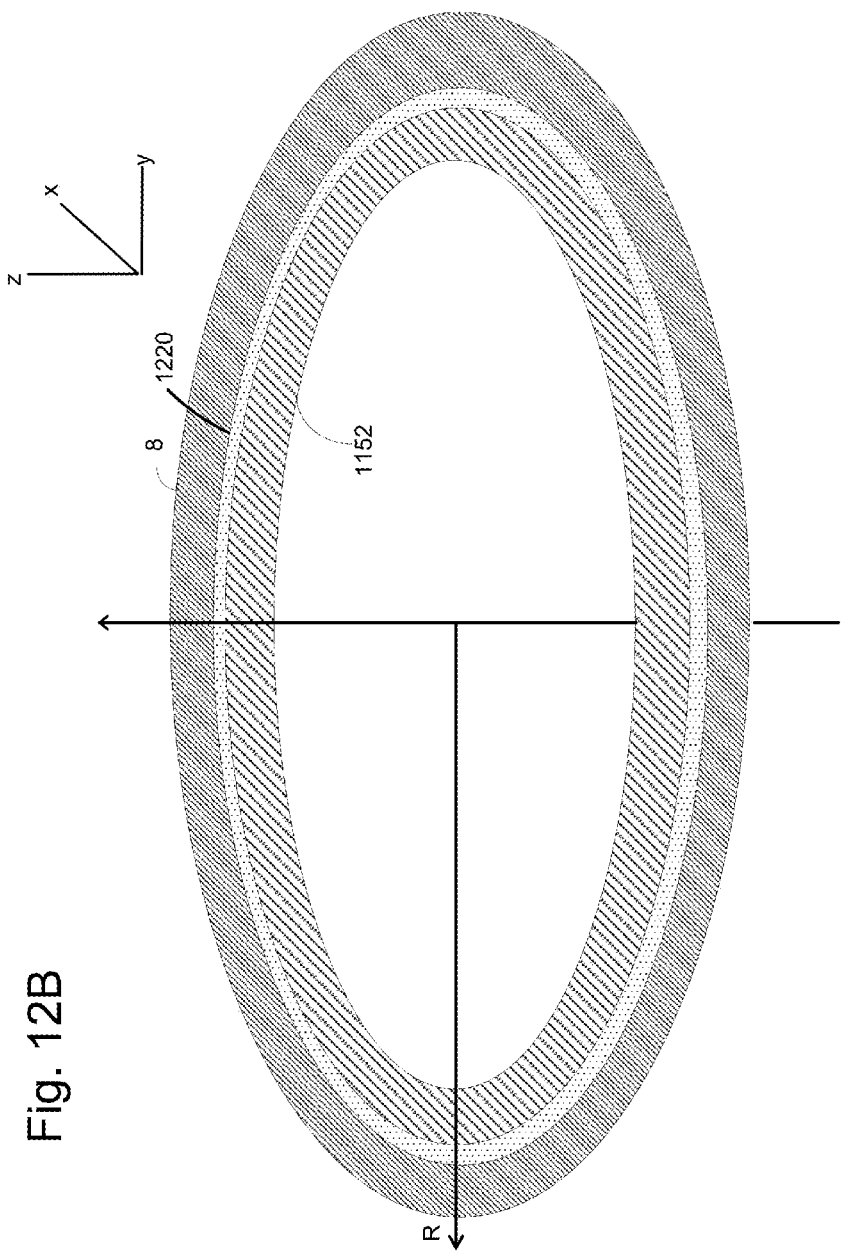
FIG. 12B depicts results after steps of one embodiment of the process of FIG. 12A.

In process 1000, the metal was formed directly on the reversible resistivity material 8. In another embodiment, a cover layer is formed between the reversible resistivity material 8 and the metal. The cover layer may protect the reversible resistivity material 8. FIG. 12A is a flowchart of one embodiment of a process 1200 in which a protective cover layer is used in a MIC process. FIG. 12B depicts results after steps of one embodiment of process 1200. In FIG. 12B, the hollow pillars have a cylindrical shape. Process 1200 can also be used to form hollow pillars having a prismatic shape. Process 1200 can also be used to form hollow pillars having shapes other than cylindrical or prismatic.

Step 1202 includes forming a thin cover of amorphous silicon over the reversible resistivity material 8. In one embodiment, the thin cover of amorphous silicon is about 3 nanometers; however, the cover of amorphous silicon could be more or less than 3 nanometers. The amorphous silicon may be deposited within the memory hole using various deposition techniques such as chemical vapor deposition (CVD), physical vapor deposition (PVD), or atomic layer deposition (ALD).

Step 1204 includes forming a hollow pillar shaped layer of metal on the amorphous silicon in the memory hole. The cover of amorphous silicon may allow for a wider selection of metals for the MIC process. If the metal is not formed directly on the reversible resistivity material (as in step 1002), it may not be necessary for the metal to be "friendly" with the reversible resistivity material. FIG. 12B depicts results after one embodiment of step 1204. The protective cover layer of amorphous silicon 1220 is depicted over the over the reversible resistivity material 8 with the metal 1152 over the protective cover layer of amorphous silicon 1220.

After step 1204, steps 1006 and 1008 may be performed. These steps are similar to those described with respect to process 1000. However, it is possible that the thickness of the amorphous silicon in step 1006 is thinner in process 1200, given that the thin cover layer of amorphous silicon was deposited in step 1202. Thus, in process 1200, the amorphous silicon that is deposited on the metal could be, for example, 3 to 8 nanometers. Of course, the amorphous silicon deposited on the metal could be thinner or thicker. Results after steps 1006 and 1008 of process 1200 may be similar to those depicted in FIGS. 11B and 11C, respectively.

In the processes of FIGS. 10 and 12A, a single round of a MIC process was performed. Forming the crystalline silicon hollow pillar may comprise performing, one, two, three, or more rounds of a MIC process. A two round MIC process to form the crystalline silicon hollow pillar will now be discussed.

Figure 13:
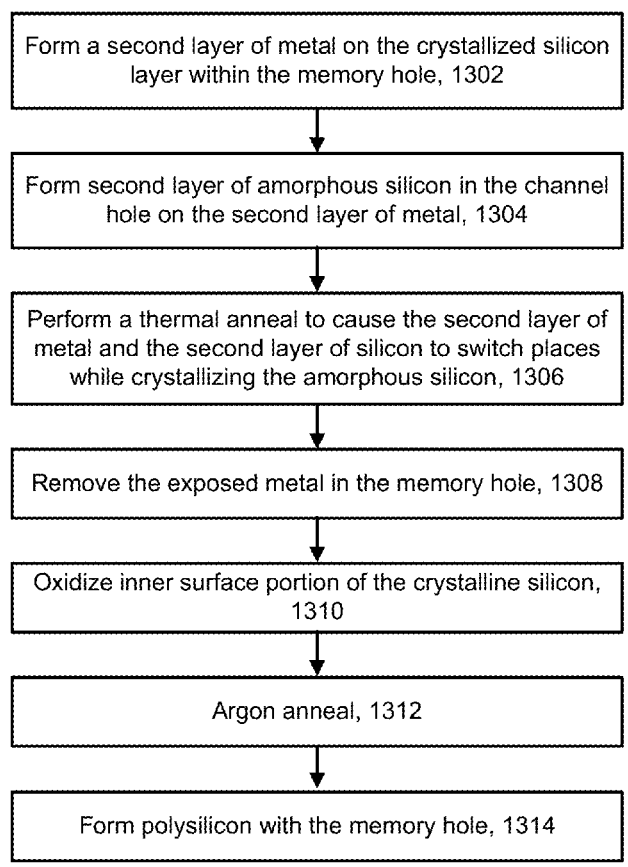
FIG. 13 is a process of one embodiment of a process of performing a second round of a MIC process.

FIG. 13 is a process of one embodiment of a process 1300 of performing a second round of a MIC process. The layer of crystalline silicon that was formed in the first round of MIC will be referred to as a "base layer of crystalline silicon." FIGS. 14A-14E show results after embodiments of steps of the process of FIG. 13. In FIGS. 14A-14E, the hollow pillars have a cylindrical shape. Process 1300 can also be used to form hollow pillars having a prismatic shape. Process 1300 can also be used to form hollow pillars having shapes other than cylindrical or prismatic.

In step 1302 a second layer of metal is formed on the base layer of crystalline silicon. This second layer of metal is in direct physical contact with the base layer of crystalline silicon in one embodiment. This second layer of metal has a hollow pillar shape, in one embodiment. In one embodiment, the second layer of metal has a thickness of between 3 to 5 nanometers. The second layer of metal could be have a thickness that is less than 3 nanometers or greater than 5 nanometers. Example metals include, but are not limited to, aluminum, nickel, silver, gold, platinum, and palladium. The metal used in step 1302 need not be the same metal used in step 1002.

Figure 14A:
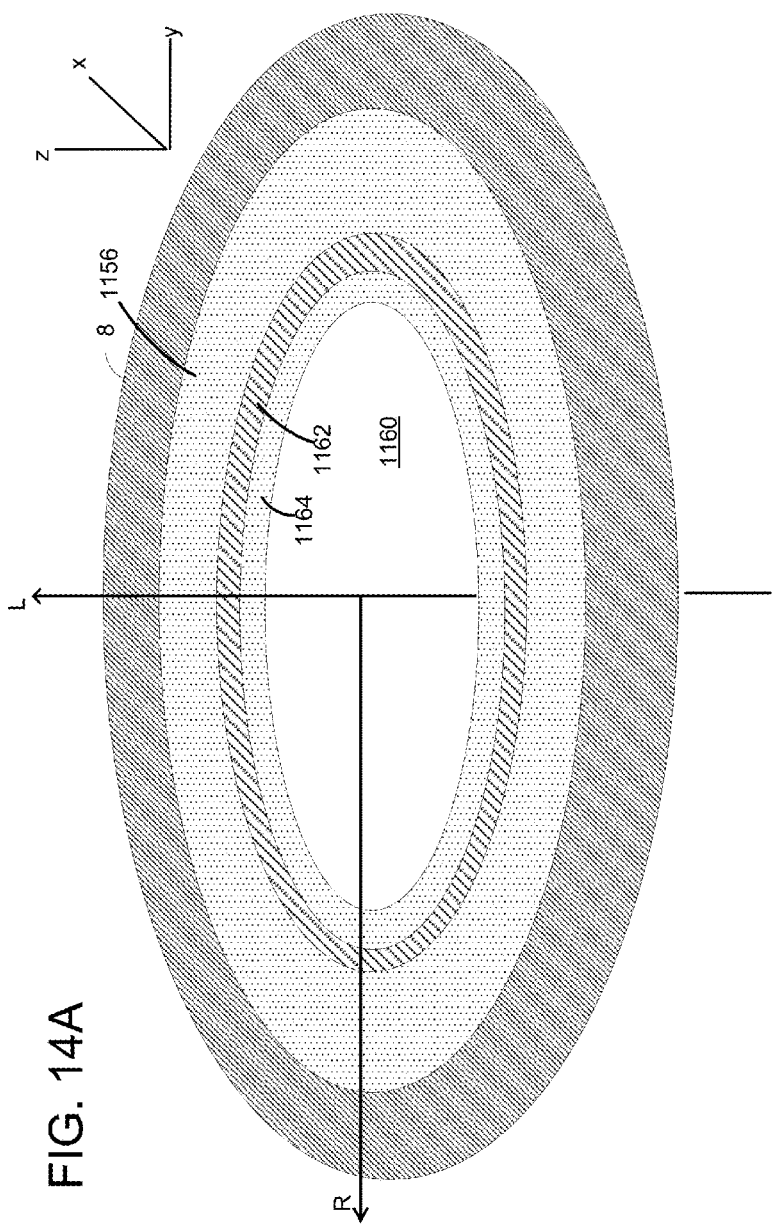

Step 1304 includes forming a second layer of amorphous silicon within the memory hole on the second layer of metal. This second layer of layer of amorphous silicon is in direct physical contact with the second layer of metal in one embodiment. This second layer of amorphous silicon has a hollow pillar shape, in one embodiment. In one embodiment, the second layer of amorphous silicon has a thickness of between 5 to 10 nanometers. The second layer of amorphous silicon could have a thickness that is less than 5 nanometers or greater than 10 nanometers. FIG. 14A is a diagram to illustrate various layers after step 1304. The diagram represents a cross sectional slice in the x-y plane. The R-axis is depicted, along with the L-axis. The reversible resistivity material 8, base layer of crystalline silicon 1156, a second layer of metal 1162, and a second layer of amorphous silicon 1164 are depicted. Note that the second layer of metal 1162 is between the base layer of crystalline silicon 1156 and the second layer of amorphous silicon 164. Also note that each region 8, 1156, 1162, 1164 is a hollow pillar that extends in the direction of the L-axis.

Step 1306 includes performing a second thermal anneal which causes a switch in location of the second metal and the silicon from the second layer of amorphous silicon, as well as in crystallizing silicon from the second layer of amorphous silicon. In one embodiment, the second thermal anneal is performed at between about 350 to 400 Celsius. However, the second thermal anneal may be performed at lower or higher temperatures. In one embodiment, the second thermal anneal is performed while flowing nitrogen gas at a flow rate of 10-50 sccm.

FIG. 14B is a diagram to illustrate results after step 1306. A single region of crystalline silicon 10 is shown next to the reversible resistivity material 8. A metal layer 1168 is depicted on the single region of crystalline silicon 10. The metal layer 1168 is exposed to the interior 1160 of the memory hole. Note that the single region of crystalline silicon 10 is between reversible resistivity material 8 and the exposed region of metal 1158.

Referring to FIGS. 14A and 14B the second thermal anneal has caused metal from the second metal layer 1162 to move (e.g., diffuse) towards the interior of the memory hole 1160 such that it now forms exposed metal region 1168. Also, silicon from the second amorphous silicon layer 1154 has moved to region 10. Also note that the base layer of crystalline silicon 1156 now forms part of the single region of crystalline silicon 10. Some of the metal may remain within the single region of crystalline silicon 10. Typically, only a small portion of the metal remains within the crystalline silicon 10. Also note that the metal (e.g., metal atoms) may act as a dopant within the crystalline silicon 10.

Step 1308 includes removing the exposed metal. Step 1308 may include performing a wet etch (e.g., $HCL:H_2O_2:H_2O$) to remove the exposed metal. FIG. 14C shows results after step 1308, in which the exposed metal 1168 has been removed from the memory hole. As discussed, there may be some residual metal in the region of crystalline silicon 10 after the second thermal anneal. One option is to remove some of the residual metal by the use of a sacrificial layer. This will be discussed below with respect to FIGS. 15A-15B.

Step 1310 is an optional step to oxidize the inner surface portion of the region of crystalline silicon 10. This forms a high quality dielectric layer 12. Note that the dielectric layer 12 may be used for a gate oxide of a transistor. The dielectric layer 12 formed in step 1310 may have few or no defects. The quality of the dielectric layer 12 may be important for reliability of the transistor formed from the crystalline silicon 10, dielectric layer 12, and select gate 14. Hence, step 1310 may help to form a high quality and reliable transistor. Step 1310 could employ a wet or dry oxidation. In one embodiment, step 1310 includes forming oxide using a water vapor generator (WVG) process. In one embodiment, step 1310 includes forming oxide using an In-Situ Steam Generation (ISSG) process. Note that this technique may in general be used after the final round of the MIC process. Hence, step 1310 could be performed after a process that uses a single round MIC process to form the crystalline silicon hollow pillar. Thus, step 1310 could be performed after step 1008 of either process 1000 or process 1200.

Step 1312 is an optional argon anneal. Step 1312 may improve the quality of the crystalline silicon 10 for the channel of the transistor. Step 1312 may improve the quality of the dielectric layer 12 (which may serve as a gate oxide of the transistor). Step 1312 may reduce or eliminate interface and volume defects. In one embodiment, step 1312 includes performing an anneal with argon and a hydrogen isotope. In one embodiment, step 1312 includes performing an anneal with argon and hydrogen (e.g., $H_2$). In one embodiment, step 1312 includes performing an anneal with argon and deuterium.

One embodiment includes an anneal with argon at 850 Celsius for 30 minutes. One embodiment includes an anneal with argon and hydrogen (e.g., $H_2$) in a 1:1 ratio at 850 Celsius for 30 minutes. One embodiment includes an anneal with argon and hydrogen (e.g., $H_2$) in a 5:1 ratio at 850 Celsius for 30 minutes. One embodiment includes an anneal with argon and hydrogen (e.g., $H_2$) in a 10:1 ratio at 850 Celsius for 30 minutes.

In one embodiment, the anneal of step 1312 is a high-pressure anneal. For example, a pure argon anneal may be performed at 1-25 atm. As another example, an argon/hydrogen (e.g., $H_2$) anneal may be performed at 1-25 atm. One embodiment of step 1312 includes an anneal with argon and deuterium in a 1:1 ratio at 850 Celsius for 10 minutes. One embodiment of step 1312 includes an anneal with argon and deuterium in a 7:3 ratio at 850 Celsius for 10 minutes. The pressure for either argon/deuterium example may be between, for example, 1 to 25 atm. Other example pressures are between from 2 to 15 atm, and between 5 to 10 atm. In one embodiment, the argon/deuterium anneal is followed by a rapid thermal anneal of argon only at about 1050 Celsius.

The foregoing process parameters for the optional argon anneal are just some examples. Step 1312 is not limited to these process parameters.

FIG. 14D shows results after step 1312, in which the dielectric layer 12 has been formed inside of the crystalline silicon 10. Note that target thickness of the crystalline silicon 10 formed by the MIC process can be selected to account for oxidizing a portion of the crystalline silicon. In other words, the target thickness of the crystalline silicon just after the final MIC step (e.g., step 1308) can be thicker than is desired for the crystalline silicon 10, such that a portion of the crystalline silicon after step 1308 is used for the crystalline silicon 10 and a portion is used for the dielectric layer 12. As one example, the target thickness of the crystalline silicon just after the final MIC step could be 8 to 12 nanometers. Step 1310 may oxidize about 2 to 3 nanometers of the crystalline silicon. This may lead to a gate oxide of about 4 to 6 nanometers. Thus, note that the combined thickness of the crystalline silicon 10 in FIG. 14D plus the thickness of the dielectric layer 12 in FIG. 14D may be greater than the combined thickness of the crystalline silicon 10 in FIG. 14C plus the thickness of the dielectric layer 12 in FIG. 14D.

Figure 14E:
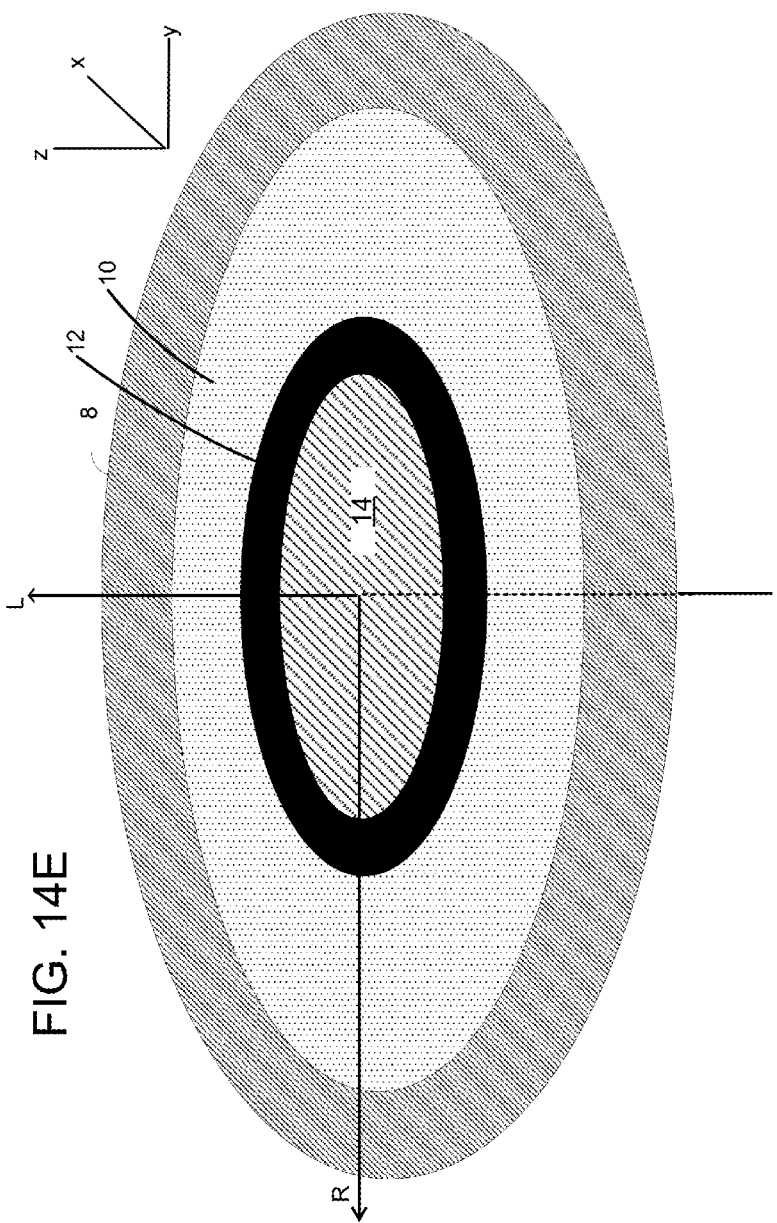

Step 1314 is to form a conductive material within the dielectric layer 12 in the memory hole. Step 1314 could include depositing amorphous silicon and performing a thermal anneal to form polysilicon from the amorphous silicon. The polysilicon serves as the select gate 14, in one embodiment. In one embodiment, the polysilicon is n+ polysilicon. Step 1314 could include depositing metal. The conductive material may form a solid core that fills the entire interior of the dielectric layer 12. However, it is not required for the conductive select gate 14 to completely fill the interior of the dielectric layer 12. FIG. 14E depicts results after one embodiment of step 1314.

Figure 15A:
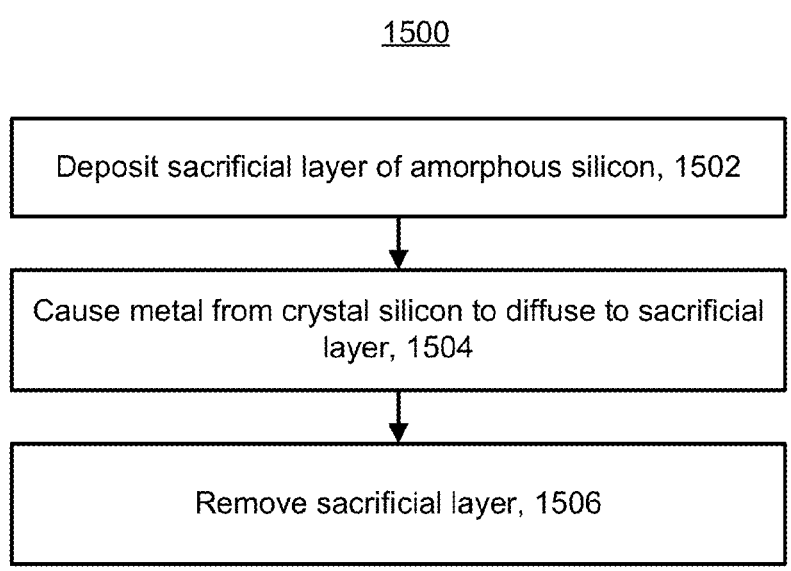
FIG. 15A is a flowchart of one embodiment of a process for removing residual metal from the crystalline silicon.

FIG. 15A is a flowchart of one embodiment of a process 1500 for removing residual metal from the crystalline silicon 10. This process 1500 can be used to absorb at least a portion of the metal which may be present in the crystalline silicon 10 after the MIC process.

Figure 15B:
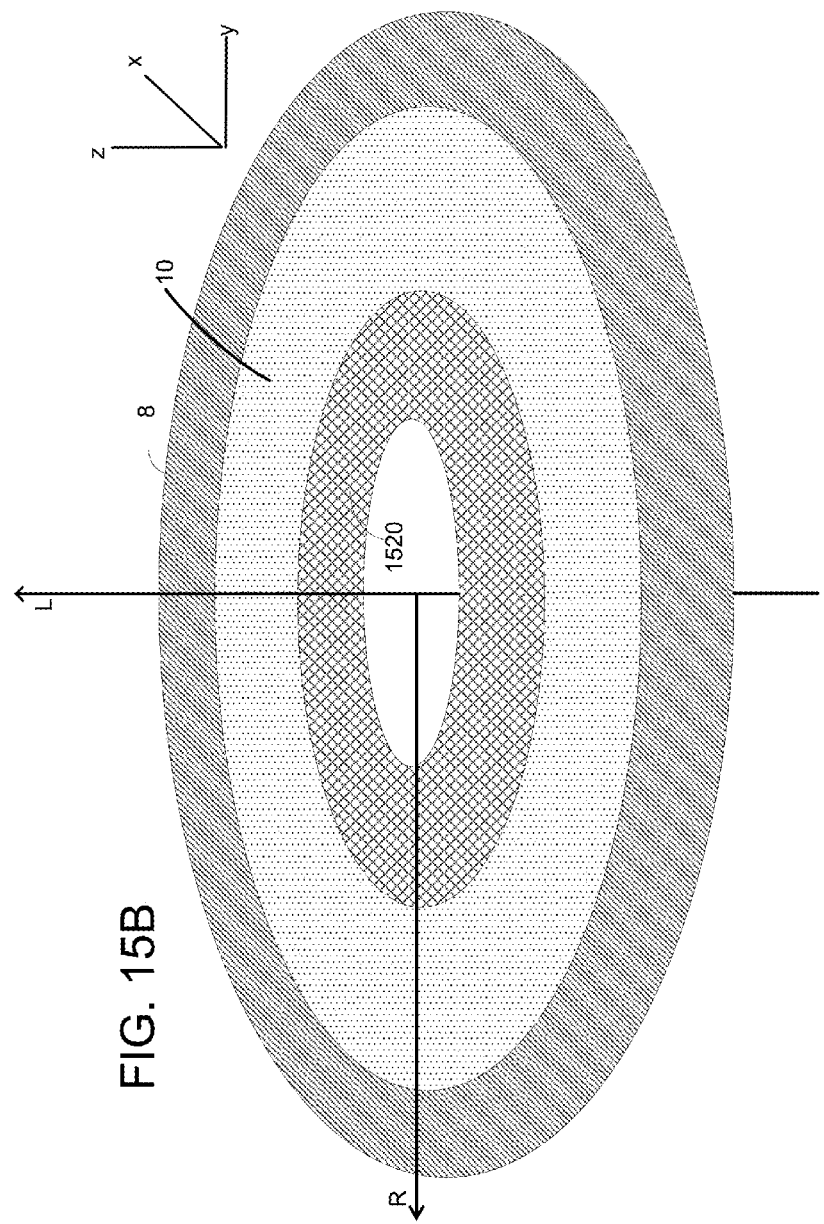
FIG. 15B shows results after one embodiment of step 1502 of the process of FIG. 15A.

Step 1502 is to deposit a sacrificial layer of material on the single region of crystalline silicon 10. This sacrificial layer may be deposited in direct contact with the crystalline silicon 10. In one embodiment, the sacrificial layer of material is un-doped amorphous silicon. FIG. 15B shows results after one embodiment of step 1502. A sacrificial layer 1520 of, for example, undoped amorphous silicon is depicted on the crystalline silicon 10. Also, the reversible resistivity material 8 is shown. Note that FIG. 15B shows just a cross section and that the layers 8, 10, and 1520 extend in the longitudinal (L) direction.

Step 1504 is to cause residual metal from the crystalline silicon 10 to diffuse into the sacrificial layer 1520. In one embodiment, step 1510 includes performing a thermal anneal.

Step 1506 is removing of the sacrificial material. This step may include performing a time controlled etch. The length of the etch can be used to remove all of the sacrificial material. This could be a wet or dry etch. Afterwards, the exposed surface of the remaining crystalline silicon 10 may be cleaned. After step 1506, steps 1310 and 1312 could be performed to form the dielectric layer 12 and the select gate 14.

FIGS. 16A-16D show additional details of crystal orientation during of one embodiment of forming the crystalline silicon 10. FIGS. 16A and 16B show results during one embodiment of a second round of MIC. FIG. 16A shows results after the second layer of metal and the second layer amorphous silicon have been formed. The longitudinal (L) and radial (R) axes are depicted. FIG. 16A shows a base layer of crystalline silicon 1156, a second layer of metal 1162, and a second layer of amorphous silicon 1164. This stage is fabrication is similar to what is depicted in FIG. 14A. Note that this is prior to performing the second thermal anneal. The diagram could represent the entire length of what is to become the crystalline silicon 10 vertical bit line from the top to the bottom, or some subset of the top to bottom length of the channel.

The base layer of crystalline silicon 1156 has some grains 1606a, 1606b, 1606c that have a (100) orientation. As discussed above, the (100) orientation may be with respect to the inner surface of the reversible resistivity material 8. Several grain boundaries 1602 are also depicted. Some of the grains 1608a, 1608b have a non (100) orientation at this stage. A non (100) orientation refers to a region that is a grain of polysilicon that has an orientation other than (100) with respect to the inner surface of the reversible resistivity material 8. The grains 1606 having the (100) orientation may be large grain polysilicon at this stage. For example, in the direction of the L-axis, the grains may be on the order of a micron. Note that this may be a thin semiconductor film, such that in the R-direction the thickness is much less than 1 micron.

FIG. 16B depicts the structure of FIG. 16A after the second thermal anneal (such as FIG. 14B). The exposed metal 1168 is depicted on the single region of crystalline silicon 10. FIG. 16B shows growth of the (100) orientation grains 1606a-1606c, as depicted by arrows. Former grain boundaries 1612 are depicted by dashed lines. Also, the boundary of the former base layer of silicon 1156 is depicted by a dashed line. Growth of the (100) orientation crystals is shown along the L-axis, as well as along the R-axis. The non (100) grains 1608 may re-crystallize and merge with the (100) grains 1606. The size of the non (100) grains in the L-direction is much less in FIG. 16B compared to FIG. 16A. Note that a non (100) grain 1608 could be completely eliminated by this stage of the process. Several arrows in the R-direction depict growth of the (100) grains in the radial direction. The direction of this growth is from the base layer 1156 inward towards the channel hole. Thus, in one embodiment, the crystallization occurs in a direction along the radial axis (R). Note that this is perpendicular to the surface of the reversible resistivity material 8.

FIG. 16C depicts results after the exposed metal has been removed (such as in FIG. 14C). Also, a crystallization anneal has been performed. The crystallization anneal may cause further re-crystallization of the non (100) grains. That is, the non (100) grains may re-crystallize, re-grow, and merge into the (100) grains. In this example, a single non (100) grain 1608a is depicted after the crystallization anneal. Also, what was formerly three (100) grains 1606a, 1606b, 1606c has now become a single (100) grain 1606.

Thus, the crystalline silicon 10 comprises grains 1606, 1608 of polysilicon with predominantly all of the crystalline silicon 10 being part of a grain 1606 of polysilicon having the (100) orientation with respect to the surface of the reversible resistivity material 8. For example, predominantly all of the crystalline silicon 10 is part of grain 1606, which has the (100) orientation. A very small part of the crystalline silicon 10 is part of grain 1608a, which does not have the (100) orientation. Grain 1606 may be a large grain of polysilicon (e.g., extends at least one micrometer in the L-direction).

It is possible that the entire crystalline silicon 10 could be a single crystal having the (100) orientation with respect to the surface of the reversible resistivity material 8. This is represented in FIG. 16D. FIG. 16D represents a stage similar to that of FIG. 16C. Thus, the crystallization may occur along the entire length of the channel (in the longitudinal direction). Note that depending on growth conditions, the single crystal having the (100) orientation could occur earlier in the process, such as after the stage depicted in FIG. 16B. For example, the single crystal might form prior to the crystallization anneal described with respect to FIG. 16C.

Also note that later process steps may form the dielectric layer 12 in contact with the crystalline silicon 10. It is possible for there to be a non-100 region of the crystalline silicon 10 that abuts the dielectric layer 12.

Some embodiments of the disclosed technology include a non-volatile storage device, comprising: a hollow pillar of reversible resistivity material and a hollow pillar of crystalline silicon inside of the hollow pillar of reversible resistivity material. The hollow pillar of reversible resistivity material has an inner surface and an outer surface. The hollow pillar of crystalline silicon has an inner surface and an outer surface. The hollow pillar of crystalline silicon may be a bit line. The crystalline silicon has predominantly a (100) orientation with respect to the inner surface of the reversible resistivity material. The non-volatile storage device further includes a plurality of word lines coupled to the outer surface of the hollow pillar of reversible resistivity material. Portions of the reversible resistivity material between the crystalline silicon and ones of the plurality of word lines are memory cells.

Some embodiments of the disclosed technology include a method for fabricating a three-dimensional (3D) non-volatile storage device, the method comprising: forming alternating layers of conducting material and insulating layers above a substrate; forming memory holes that extend through the alternating layers of conducting material and insulating material; forming a hollow pillar of reversible resistivity material inside the memory holes, the hollow pillar of reversible resistivity material having an inner surface and an outer surface; forming a hollow pillar of crystalline silicon inside of the hollow pillar of reversible resistivity material, the hollow pillar of crystalline silicon having an inner surface and an outer surface, the hollow pillar of crystalline silicon being a bit line, the crystalline silicon having predominantly a (100) orientation with respect to the inner surface of the reversible resistivity material; and forming a plurality of word lines from the alternating layers of conducting material, the plurality of word lines coupled to the outer surface of the hollow pillar of reversible resistivity material, portions of the reversible resistivity material between the crystalline silicon and ones of the plurality of word lines being memory cells.

Some embodiments of the disclosed technology include a three-dimensional (3D) non-volatile storage device, comprising: a plurality alternating horizontal layers of conducting material and insulating layers above a substrate; a plurality of hollow cylindrical or prismatic pillars of reversible resistivity material that extend vertically through the plurality alternating horizontal layers of conducting material and insulating layers, each of the hollow cylindrical or prismatic pillars of reversible resistivity material having an inner surface and an outer surface, portions of the horizontal layers of conducting material serving as word lines; a hollow cylindrical or prismatic pillar of crystalline silicon inside of each of the hollow cylindrical or prismatic pillars of reversible resistivity material, the hollow cylindrical or prismatic pillar of crystalline silicon having an inner surface and an outer surface, the hollow cylindrical or prismatic pillar of crystalline silicon being a local bit line, a portion of the reversible resistivity material between a local bit line and a word line being a memory cell, the crystalline silicon having predominantly a (100) orientation with respect to the inner surface of the reversible resistivity material; a hollow cylindrical or prismatic pillar of dielectric material inside of each of the hollow cylindrical or prismatic pillars of crystalline silicon, the dielectric material having an inner surface and an outer surface; a control gate inside each of the hollow cylindrical or prismatic pillars of dielectric material; and a control circuit configured to put respective ones of the local bit lines into either a conductive state or a non-conductive state responsive to a voltage provided to the respective control gates.

Some embodiments of the disclosed technology include a non-volatile storage device, comprising: a hollow pillar of reversible resistivity material; a hollow pillar of mono-crystalline silicon inside of the hollow pillar of reversible resistivity material, the hollow pillar of mono-crystalline silicon being a bit line; and a plurality of word lines coupled to the outer surface of the hollow pillar of reversible resistivity material, portions of the reversible resistivity material between the crystalline silicon and ones of the plurality of word lines being memory cells.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-volatile storage device, comprising:
a hollow pillar of reversible resistivity material the hollow pillar of reversible resistivity material having an inner surface and an outer surface;
a hollow pillar of crystalline silicon inside of the hollow pillar of reversible resistivity material, the hollow pillar of crystalline silicon having an inner surface and an outer surface, the hollow pillar of crystalline silicon being a bit line, the crystalline silicon having predominantly a (100) orientation with respect to the inner surface of the reversible resistivity material; and
a plurality of word lines coupled to the outer surface of the hollow pillar of reversible resistivity material, portions of the reversible resistivity material between the crystalline silicon and ones of the plurality of word lines being memory cells.

2. The non-volatile storage device of claim 1, wherein the hollow pillar of crystalline silicon is a single crystal of silicon having a (100) orientation with respect to the inner surface of the reversible resistivity material.

3. The non-volatile storage device of claim 1, wherein the hollow pillar of crystalline silicon comprises grains of polysilicon with predominantly all of the hollow pillar of crystalline silicon being grains of polysilicon having a (100) orientation with respect to the inner surface of the reversible resistivity material.

4. The non-volatile storage device of claim 1, further comprising:
a hollow pillar of dielectric material inside the hollow pillar of crystalline silicon, the hollow pillar of dielectric material having an inner surface and an outer surface, wherein the crystalline silicon has predominantly a (100) orientation with respect to the outer surface of the dielectric material; and
a control gate inside of the hollow pillar of dielectric material, the hollow pillar of crystalline silicon configured to go into either a conductive state or a non-conductive state responsive to a voltage provided to the control gate.

5. The non-volatile storage device of claim 4, wherein the hollow pillar of crystalline silicon is a single crystal of silicon having a (100) orientation with respect to the outer surface of the dielectric material.

6. The non-volatile storage device of claim 4, wherein the hollow pillar of crystalline silicon comprises grains of polysilicon with predominantly all of the hollow pillar of crystalline silicon being grains of polysilicon having a (100) orientation with respect to the outer surface of the dielectric material.

7. The non-volatile storage device of claim 1, wherein the hollow pillar of crystalline silicon is a hollow cylinder.

8. The non-volatile storage device of claim 1, wherein the hollow pillar of crystalline silicon is a hollow prism.

9. A method for fabricating a three-dimensional (3D) non-volatile storage device, the method comprising:
forming alternating layers of conducting material and insulating material above a substrate;
forming memory holes that extend through the alternating layers of conducting material and insulating material;

forming a hollow pillar of reversible resistivity material inside the memory holes, the hollow pillar of reversible resistivity material having an inner surface and an outer surface;

forming a hollow pillar of crystalline silicon inside of the hollow pillar of reversible resistivity material, the hollow pillar of crystalline silicon having an inner surface and an outer surface, the hollow pillar of crystalline silicon being a bit line, the crystalline silicon having predominantly a (100) orientation with respect to the inner surface of the reversible resistivity material; and forming a plurality of word lines from the alternating layers of conducting material, the plurality of word lines coupled to the outer surface of the hollow pillar of reversible resistivity material, portions of the reversible resistivity material between the crystalline silicon and ones of the plurality of word lines being memory cells.

10. The method of claim 9, wherein the forming a hollow pillar of crystalline silicon inside of the hollow pillar of reversible resistivity material comprises:

forming a layer of metal within the memory hole on the reversible resistivity material;

forming a layer of amorphous silicon within the memory hole on the layer of metal;

performing a thermal anneal to cause metal from the layer of metal and to cause silicon from the layer of amorphous silicon to switch places while crystallizing the silicon that came from the layer of amorphous silicon to form a layer of crystalline silicon having a hollow shape with metal from the layer of metal exposed on the crystalline silicon in the memory hole; and removing the exposed metal leaving the layer of crystalline silicon having the hollow shape in the memory hole.

11. The method of claim 10, wherein the reversible resistivity material comprises hafnium oxide and the layer of metal comprises one or more of: aluminum, nickel, gold, silver, platinum, or palladium.

12. The method of claim 10, wherein the forming a hollow pillar of crystalline silicon inside of the hollow pillar of reversible resistivity material further comprises:

forming a first layer of amorphous silicon in the memory hole directly on the reversible resistivity material, the layer of metal being formed directly on the first layer of amorphous silicon, the layer of amorphous silicon that is formed on the layer of metal is a second layer of amorphous silicon.

13. The method of claim 9, further comprising:

oxidizing the inner surface of the hollow pillar of crystalline silicon to form a hollow gate oxide layer within the memory hole; and forming a conductive material for a gate in the memory hole on the hollow gate oxide layer.

14. The method of claim 9, further comprising:

forming a gate oxide on the hollow pillar of crystalline silicon; and performing an argon anneal after forming the gate oxide.

15. The method of claim 9, further comprising:

forming a gate oxide on the hollow pillar of crystalline silicon; and performing an anneal with argon and a hydrogen isotope.

16. A three-dimensional (3D) non-volatile storage device, comprising:

a plurality alternating horizontal layers of conducting material and insulating layers above a substrate;

a plurality of hollow cylindrical or prismatic pillars of reversible resistivity material that extend vertically through the plurality alternating horizontal layers of conducting material and insulating layers, each of the hollow cylindrical or prismatic pillars of reversible resistivity material having an inner surface and an outer surface, portions of the horizontal layers of conducting material serving as word lines;

a hollow cylindrical or prismatic pillar of crystalline silicon inside of each of the hollow cylindrical or prismatic pillars of reversible resistivity material, the hollow cylindrical or prismatic pillar of crystalline silicon having an inner surface and an outer surface, the hollow cylindrical or prismatic pillar of crystalline silicon being a local bit line, a portion of the reversible resistivity material between a local bit line and a word line being a memory cell, the crystalline silicon having predominantly a (100) orientation with respect to the inner surface of the reversible resistivity material;

a hollow cylindrical or prismatic pillar of dielectric material inside of each of the hollow cylindrical or prismatic pillars of crystalline silicon, the dielectric material having an inner surface and an outer surface;

a control gate inside each of the hollow cylindrical or prismatic pillars of dielectric material; and a control circuit configured to put respective ones of the local bit lines into either a conductive state or a non-conductive state responsive to a voltage provided to the respective control gates.

17. The 3D non-volatile storage device of claim 16, wherein ones of the hollow cylindrical or prismatic pillars of crystalline silicon comprise a single crystal of silicon having a (100) orientation with respect to the inner surface of the reversible resistivity material.

18. The 3D non-volatile storage device of claim 17, wherein the single crystal of silicon has a (100) orientation with respect to the outer surface of the dielectric material.

19. The 3D non-volatile storage device of claim 16, wherein ones of the hollow cylindrical or prismatic pillars of crystalline silicon comprise grains of polysilicon with predominantly all of the hollow cylindrical or prismatic pillar being grains of polysilicon having a (100) orientation with respect to the inner surface of the reversible resistivity material.

20. The 3D non-volatile storage device of claim 19, wherein predominantly all of the grains of polysilicon have a (100) orientation with respect to the outer surface of the dielectric material.

21. A non-volatile storage device, comprising: a hollow pillar of reversible resistivity material; a hollow pillar of mono-crystalline silicon inside of the hollow pillar of reversible resistivity material, the hollow pillar of mono-crystalline silicon being a bit line; and a plurality of word lines coupled to an outer surface of the hollow pillar of reversible resistivity material, portions of the reversible resistivity material between the mono-crystalline silicon and ones of the plurality of word lines being memory cells.

22. The non-volatile storage device of claim 21, wherein the hollow pillar of mono-crystalline silicon is a hollow cylinder.

23. The non-volatile storage device of claim 21, wherein the hollow pillar of mono-crystalline silicon is a hollow prism.

* * * * *